United States Patent
Hatakeyama et al.

(10) Patent No.: US 9,927,708 B2
(45) Date of Patent: *Mar. 27, 2018

(54) PATTERN FORMING PROCESS AND SHRINK AGENT

(71) Applicant: SHIN-ETSU CHEMICAL CO., LTD., Tokyo (JP)

(72) Inventors: Jun Hatakeyama, Joetsu (JP); Kazuhiro Katayama, Joetsu (JP); Masayoshi Sagehashi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/991,050

(22) Filed: Jan. 8, 2016

(65) Prior Publication Data
US 2016/0202612 A1  Jul. 14, 2016

(30) Foreign Application Priority Data

Jan. 9, 2015 (JP) .................................. 2015-003082

(51) Int. Cl.
| | |
|---|---|
| G03F 7/40 | (2006.01) |
| C09D 133/10 | (2006.01) |
| C09D 137/00 | (2006.01) |
| C09D 135/02 | (2006.01) |
| C09D 125/18 | (2006.01) |

(Continued)

(52) U.S. Cl.
CPC ............. *G03F 7/40* (2013.01); *C08F 12/20* (2013.01); *C08F 12/24* (2013.01); *C08F 212/14* (2013.01); *C09D 125/18* (2013.01); *C09D 133/10* (2013.01); *C09D 135/02* (2013.01); *C09D 137/00* (2013.01)

(58) Field of Classification Search
CPC .................................. G03F 7/0035; G03F 7/40
See application file for complete search history.

(56) References Cited

U.S. PATENT DOCUMENTS

| | | | |
|---|---|---|---|
| 6,579,657 B1 | 6/2003 | Ishibashi et al. | |
| 9,360,760 B2 * | 6/2016 | Hatakeyama | G03F 7/40 |

(Continued)

FOREIGN PATENT DOCUMENTS

| | | |
|---|---|---|
| JP | 10-73927 A | 3/1998 |
| JP | 2008-275995 A | 11/2008 |

OTHER PUBLICATIONS

Yi et al., "Contact Hole Patterning for Random Logic Circuits using Block Copolymer Directed Self-Assembly", Proc. of SPIE, 2012, pp. 83230W-1-83230W-6, vol. 8323, cited in the Specification.

*Primary Examiner* — Kathleen Duda
(74) *Attorney, Agent, or Firm* — Westerman, Hattori, Daniels & Adrian, LLP

(57) ABSTRACT

A negative pattern is formed by applying a resist composition onto a substrate, exposing the resist film, and developing the exposed resist film in an organic solvent developer. The process further involves coating the negative pattern with a shrink agent solution of a first polymer comprising recurring units capable of forming carboxyl, hydroxyl or lactone ring and a second polymer comprising recurring units capable of forming amino and fluorinated recurring units in an ester and/or ketone solvent, baking the coating, and removing the excessive shrink agent for thereby shrinking the size of spaces in the pattern.

8 Claims, 2 Drawing Sheets

COATING OF RESIST

EXPOSURE OF RESIST

(51) Int. Cl.
*C08F 12/20* (2006.01)
*C08F 12/24* (2006.01)
*C08F 212/14* (2006.01)

(56) References Cited

U.S. PATENT DOCUMENTS

2010/0119717 A1   5/2010  Hong et al.
2010/0272909 A1* 10/2010  Shinbori ............... G03F 7/0035
                                              427/386

* cited by examiner

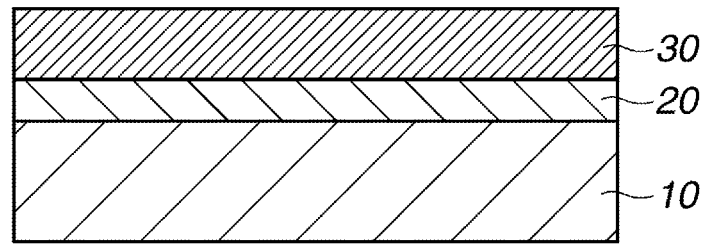
FIG.1(A) COATING OF RESIST
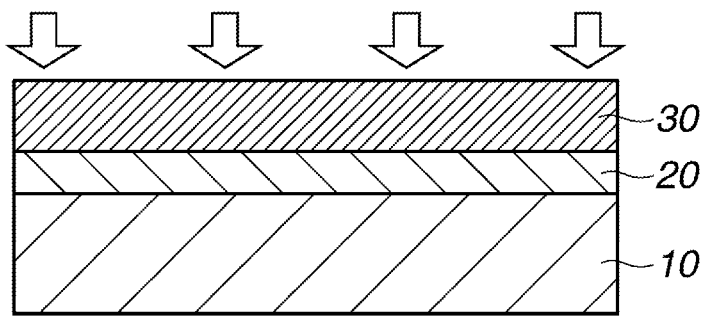
FIG.1(B) EXPOSURE OF RESIST
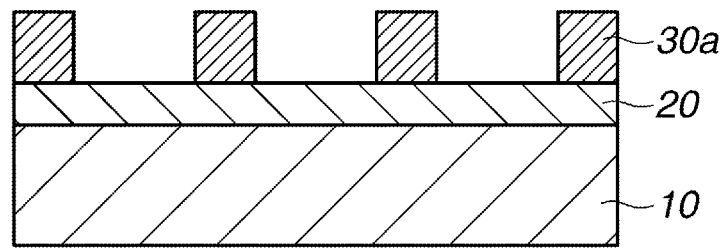
FIG.1(C) PEB AND ORGANIC SOLVENT DEVELOPMENT OF RESIST TO FORM NEGATIVE PATTERN

PATTERN FORMING PROCESS AND SHRINK AGENT

CROSS-REFERENCE TO RELATED APPLICATION

This non-provisional application claims priority under 35 U.S.C. § 119(a) on Patent Application No. 2015-003082 filed in Japan on Jan. 9, 2015, the entire contents of which are hereby incorporated by reference.

TECHNICAL FIELD

This invention relates to a shrink agent and a pattern forming process comprising forming a resist pattern via resist coating, exposure and development, coating the resist pattern with a shrink agent, baking, developing, and removing the excessive shrink agent for shrinking the size of spaces in the resist pattern.

BACKGROUND ART

While the effort to reduce the pattern rule is in rapid progress to meet the recent demand for higher integration level and operating speed of LSIs, the photolithography is on widespread use. The photolithography has the essential limit of resolution determined by the wavelength of a light source. One micropatterning approach to go beyond the limit of resolution is by combining ArF excimer laser immersion lithography with double patterning. One typical version of double patterning is litho-etch-litho-etch (LELE) process involving forming a pattern via exposure, transferring the pattern to a hard mask on a substrate by etching, effecting second exposure at a half-pitch shifted position, and etching the hard mask. This process has the problem of misalignment between two exposures or overlay error. Another version of double patterning is self-aligned double patterning (SADP) process involving the steps of transferring a resist pattern to a hard mask, growing a film on opposite sides of hard mask features, and leaving sidewalls of film for thereby doubling pattern size. The SADP process needs exposure only once and mitigates the problem of overlay error. To simplify the process, a modified version of the SADP process of forming a silicon oxide film on sidewalls of resist pattern features as developed rather than sidewalls of hard mask features for thereby doubling pattern size is also proposed. Since the SADP process is successful in reducing the pitch of line pattern to half, the pitch can be reduced to ¼ by repeating the SADP process twice.

Not only shrinking of line patterns, but also shrinking of hole patterns is necessary. Unless the hole pattern is shrunk, shrinkage over the entire chip is incomplete. One known method of shrinking a hole pattern is RELACS® method described in Patent Document 1. This method intends to reduce the size of a hole pattern by coating a resist pattern as developed with a water-soluble material containing a crosslinker, and baking the coating to form a crosslinked layer on the resist surface for causing the resist pattern to be thickened. Patent Document 2 describes a shrink agent comprising an amino-containing polymer or polyamine, which bonds to the resist surface via neutralization reaction with carboxyl groups on the resist surface, for thereby thickening the resist film. It is also proposed in Non-Patent Document 1 to shrink a hole pattern by utilizing the direct self-assembly (DSA) of a block copolymer.

Shrinkage by the RELACS® method has the problem that since a crosslinker becomes active with an acid catalyst within resist, the size of holes is non-uniform after shrinkage if acid diffusion is non-uniform. In the shrink method based on neutralization and bonding of amino polymer, the pattern is thickened as direct reflection of irregularities on the resist surface so that dimensional variations of the resist pattern as developed and dimensional variations after shrinkage are identical. The shrink method utilizing the DSA function of a block copolymer has advantages including an increased amount of shrinkage and a minimal dimensional variation after shrinkage, but some problems. Namely, if the DSA is applied to holes of different size, shrinkage cannot be induced for those holes of the size that causes a contradictory assembly of block copolymer. If the DSA is applied to a trench pattern, shape deformation becomes a problem, for example, a plurality of hole patterns are formed.

There is a need for a shrink agent which can shrink a trench pattern without changing the shape of the resist pattern, and improve the dimensional variation and edge roughness (LWR) of the resist pattern after development.

CITATION LIST

Patent Document 1: JP-A H10-073927 (U.S. Pat. No. 6,579,657)
Patent Document 2: JP-A 2008-275995 (US 20100119717)
Non-Patent Document 1: Proc. SPIE Vol. 8323 p83230W-1 (2012)

SUMMARY OF INVENTION

As discussed above, the method of applying a RELACS® material of crosslink type or neutralizing reaction-mediated bond type onto a resist pattern causes no pattern deformation, but fails to reduce the dimensional variation of the resist pattern. The DSA method can reduce the dimensional variation of a hole pattern as developed, but invites pattern deformation when applied to a trench pattern as developed.

An object of the invention is to provide a shrink agent which when coated onto a resist pattern as developed, can reduce the dimensional variation of the resist pattern, and when applied to a trench pattern, can shrink the trench size without causing pattern deformation; and a pattern forming process using the same.

In one aspect, the invention provides a pattern forming process comprising the steps of:

applying a resist composition comprising a polymer comprising recurring units having an acid labile group-substituted carboxyl group, an acid generator and an organic solvent onto a substrate,
prebaking to form a resist film,
exposing the resist film to high-energy radiation,
baking the film,
developing the exposed resist film in an organic solvent-based developer to form a negative pattern,
applying a shrink agent onto the negative pattern, the shrink agent being a solution of a first polymer comprising recurring units of at least one type selected from units (a1) to (a4) having the general formula (1) and a second polymer comprising recurring units having an amino group protected with an acid labile group, represented by the general formula (2) in an ester solvent of 7 to 16 carbon atoms and/or ketone solvent of 8 to 16 carbon atoms,
baking, and
removing the excessive shrink agent with the organic solvent-based developer for thereby shrinking the size of spaces in the pattern.

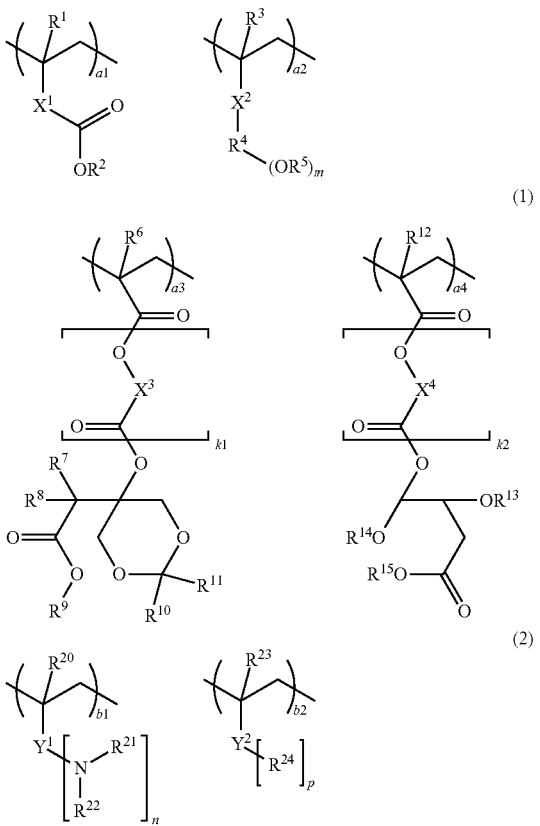

(1)

(2)

Herein $R^1$, $R^3$, $R^6$, $R^{12}$, $R^{20}$ and $R^{23}$ each are hydrogen or methyl; $R^2$, $R^5$, $R^{14}$ and $R^{22}$ each are an acid labile group; $X^1$ is a single bond, a phenylene or naphthylene group, or —C(=O)—O—$R^{16}$—, $R^{16}$ is a straight, branched or cyclic $C_1$-$C_{10}$ alkylene group which may contain ether, ester, lactone ring or hydroxyl, or a phenylene or naphthylene group; $X^2$ is a single bond, a phenylene or naphthylene group which may contain nitro, cyano or halogen, or —C(=O)—O—$R^{17}$—, —C(=O)—NH—$R^{17}$—, —O—$R^{17}$—, or —S—$R^{17}$—, $R^{17}$ is a straight, branched or cyclic $C_1$-$C_{10}$ alkylene group which may contain ether, ester, lactone ring or hydroxyl, or a phenylene or naphthylene group which may contain a straight, branched or cyclic $C_1$-$C_6$ alkyl, alkoxy, acyl, acyloxy, $C_2$-$C_6$ alkenyl, alkoxycarbonyl, $C_6$-$C_{10}$ aryl, nitro, cyano, or halogen; $R^4$ is a single bond, a di to penta-valent, straight, branched or cyclic $C_1$-$C_{16}$ aliphatic hydrocarbon group, or phenylene group, which may contain ether or ester; m is 1 to 4; $R^7$ and $R^8$ are each independently hydrogen, fluorine, or a straight, branched or cyclic $C_1$-$C_8$ monovalent hydrocarbon group; $R^9$, $R^{13}$ and $R^{15}$ each are hydrogen, or a straight, branched or cyclic $C_1$-$C_{20}$ monovalent hydrocarbon group in which any constituent —$CH_2$— moiety may be replaced by —O— or —C(=O)—, or whose hydrogen may be replaced by halogen; $R^{10}$ and $R^{11}$ are each independently hydrogen, or a straight, branched or cyclic $C_1$-$C_8$ monovalent hydrocarbon group, or $R^{10}$ and $R^{11}$ may bond together to form a $C_3$-$C_{17}$ non-aromatic ring with the carbon atom to which they are attached; $X^3$ and $X^4$ each are a straight, branched or cyclic $C_1$-$C_{20}$ divalent hydrocarbon group in which any constituent —$CH_2$— moiety may be replaced by —O— or —C(=O)—; $k^1$ and $k^2$ each are 0 or 1; $Y^1$ is a single bond, phenylene group or —C(=O)—O—$R^{25}$—, $R^{25}$ is a single bond, a straight, branched or cyclic $C_1$-$C_{10}$ alkylene group which may contain ether, ester, —N= or —S—, or a phenylene or naphthylene group; $R^{21}$ is hydrogen, or a straight or branched $C_1$-$C_4$ alkyl group; $Y^2$ is a phenylene, —C(=O)—O—$R^{26}$— or ether group, $R^{26}$ is a single bond or a straight, branched or cyclic $C_1$-$C_{10}$ alkylene group which may contain ether, ester or —S—; $R^{24}$ is fluorine or a straight, branched or cyclic $C_1$-$C_{14}$ alkyl group containing at least one fluorine atom which may contain hydroxy, ether or ester; n is 1 or 2, p is an integer of 1 to 6, $0 \le a1 \le 1.0$, $0 \le a2 \le 1.0$, $0 \le a3 \le 1.0$, $0 \le a4 \le 1.0$, $0 < a1+a2+a3+a4 \le 1.0$, $0 < b1 < 1.0$, $0 < b2 < 1.0$, and $0 < b1+b2 \le 1.0$.

In a preferred embodiment, the first polymer comprising recurring units (a1) to (a4) further comprises recurring units (c) having a hydroxyl, carboxyl, lactone ring, lactam ring, sultone ring, sulfone, sulfonic acid ester, sulfonamide, carboxylic acid amide, nitro, cyano, thienyl, furyl, pyrrole, acid anhydride, imide, —NH—(C=O)—O—, —S—(C=O)—O—, or —ON(=$O_2$)—.

In a preferred embodiment, the shrink agent further comprises a salt compound having the general formula (4):

(4)

wherein $R^{27}$ is a straight, branched or cyclic $C_1$-$C_{20}$ alkyl group, $C_2$-$C_{20}$ alkenyl group or $C_6$-$C_{20}$ aryl group which may contain fluorine, ether, ester, lactone ring, lactam ring, carbonyl or hydroxyl, and M is sulfonium, iodonium or ammonium.

In a preferred embodiment, the solvent for the shrink agent is at least one solvent selected from the group consisting of ester solvents of 7 to 16 carbon atoms including pentyl acetate, isopentyl acetate, 2-methylbutyl acetate, hexyl acetate, 2-ethylhexyl acetate, cyclohexyl acetate, methylcyclohexyl acetate, hexyl formate, ethyl valerate, propyl valerate, isopropyl valerate, butyl valerate, isobutyl valerate, tert-butyl valerate, pentyl valerate, isopentyl valerate, ethyl isovalerate, propyl isovalerate, isopropyl isovalerate, butyl isovalerate, isobutyl isovalerate, tert-butyl isovalerate, isopentyl isovalerate, ethyl 2-methylvalerate, butyl 2-methylvalerate, ethyl pivalate, propyl pivalate, isopropyl pivalate, butyl pivalate, tert-butyl pivalate, ethyl pentenoate, propyl pentenoate, isopropyl pentenoate, butyl pentenoate, tert-butyl pentenoate, propyl crotonate, isopropyl crotonate, butyl crotonate, tert-butyl crotonate, butyl propionate, isobutyl propionate, tert-butyl propionate, benzyl propionate, ethyl hexanoate, allyl hexanoate, propyl butyrate, butyl butyrate, isobutyl butyrate, 3-methylbutyl butyrate, tert-butyl butyrate, ethyl 2-methylbutyrate, isopropyl 2-methylbutyrate, methyl benzoate, ethyl benzoate, propyl benzoate, butyl benzoate, phenyl acetate, benzyl acetate, methyl phenylacetate, benzyl formate, phenylethyl formate, methyl 3-phenylpropionate, ethyl phenylacetate, and 2-phenylethyl acetate, and ketone solvents of 8 to 16 carbon atoms including 2-octanone, 3-octanone, 4-octanone, 2-nonanone, 3-nonanone, 4-nonanone, 5-nonanone, diisobutyl ketone, ethylcyclohexanone, ethylacetophenone, ethyl n-butyl ketone, di-n-butyl ketone, and diisobutyl ketone.

In a preferred embodiment, the polymer in the resist composition further comprises recurring units (a5) having the general formula (3).

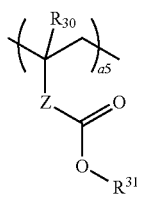

(3)

Herein $R^{30}$ is hydrogen or methyl, $R^{31}$ is an acid labile group, Z is a single bond or —C(=O)—O—$R^{32}$—, $R^{32}$ is a straight, branched or cyclic $C_1$-$C_{10}$ alkylene group which may contain ether or ester, or naphthylene group, and $0<a5<1.0$.

In a preferred embodiment, the developer for forming a negative pattern comprises at least one solvent selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, isopentyl acetate, butenyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

In a preferred embodiment, the exposure to high-energy radiation is by lithography using i-line of wavelength 364 nm, KrF excimer laser of wavelength 248 nm, ArF excimer laser of wavelength 193 nm, EUV of wavelength 13.5 nm, or EB.

In another aspect, the invention provides a shrink agent comprising a first polymer comprising recurring units (a1) to (a4) having the above formula (1), a second polymer comprising recurring units (b1) and (b2) having the above formula (2), and an ester solvent of 7 to 16 carbon atoms and/or ketone solvent of 8 to 16 carbon atoms. The shrink agent may further comprise a salt compound having the above formula (4).

Advantageous Effects of Invention

The process involving forming a resist film from a photoresist composition comprising a polymer comprising recurring units having an acid labile group-substituted carboxyl group and an acid generator, subjecting it to exposure and organic solvent development to form a negative tone resist pattern, applying the inventive shrink agent to the resist pattern, baking, and removing the excessive shrink agent by organic solvent development, is successful in shrinking the size of spaces in the resist pattern in a precisely size-controlled manner, provided that the shrink agent is a solution of a first polymer comprising recurring units capable of forming a carboxyl group, hydroxyl group or lactone ring under the action of an acid, represented by formula (1) and a second polymer comprising recurring units capable of forming an amino group under the action of an acid and fluorinated recurring units copolymerized, represented by formula (2) in an ester solvent of 7 to 16 carbon atoms and/or ketone solvent of 8 to 16 carbon atoms which does not dissolve the resist pattern after development. The second polymer is segregated on the surface of the shrink agent coating and adapted such that an amino group may generate upon deprotection of the protective group under the action of an acid, preventing the hole pattern from being blocked at the surface during shrinking. As a result, formation of bridge and blockage defects by shrinking is prevented and CD uniformity is improved.

BRIEF DESCRIPTION OF DRAWINGS

FIGS. 1(A), 1(B) and 1(C) illustrates in cross-sectional view, early steps of a pattern forming or shrinking process according to the invention; FIG. 1(A) showing a photoresist film formed on a substrate; FIG. 1(B) showing the photoresist film during exposure; and FIG. 1(C) showing pattern formation after PEB and development of the photoresist film.

FIG. 2(D) showing a shrink agent coated on the resist pattern; FIG. 2(E) showing the resist pattern whose spaces have been shrunk by baking and removal of the excessive shrink agent; and FIG. 2(F) showing dry etching of the substrate through the shrunk space pattern as a mask.

DESCRIPTION OF PREFERRED EMBODIMENTS

Figure 2D:
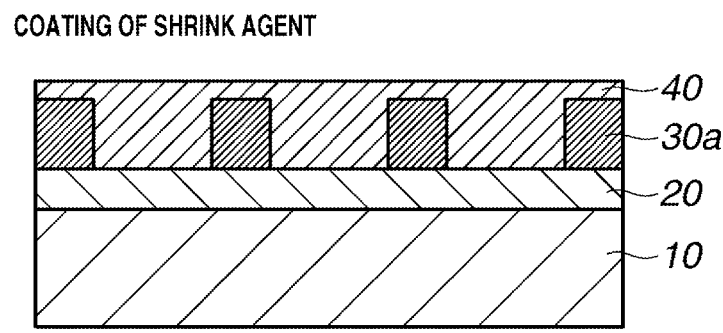
FIGS. 2(D), 2(E) and 2(F) illustrate, in cross-sectional view, later steps of the pattern forming or shrinking process according to the invention.

The terms "a" and "an" herein do not denote a limitation of quantity, but rather denote the presence of at least one of the referenced item. "Optional" or "optionally" means that the subsequently described event or circumstances may or may not occur, and that description includes instances where the event or circumstance occurs and instances where it does not. As used herein, the notation (Cn-Cm) means a group containing from n to m carbon atoms per group. As used herein, the term "film" is used interchangeably with "coating" or "layer."

The abbreviations and acronyms have the following meaning.
Mw: weight average molecular weight
Mn: number average molecular weight
Mw/Mn: molecular weight distribution or dispersity
GPC: gel permeation chromatography
PEB: post-exposure bake
PAG: photoacid generator Searching for a shrink agent which is capable of effectively shrinking a resist pattern as developed and preventing formation of hole blocking defects and trench bridging defects, and a shrink process using the same, the inventors have found that the size of spaces in a resist pattern can be shrunk in a precisely size-controlled manner by forming a resist film from a photoresist composition based on a polymer comprising recurring units containing an acid labile group-substituted carboxyl group, specifically recurring units (a5) having the general formula (3), and an acid generator, subjecting it to exposure and organic solvent development to form a negative tone resist pattern, applying the inventive shrink agent to the resist pattern, baking, and removing the excessive shrink agent by organic solvent development. The shrink agent is a solution of a first polymer comprising recurring units capable of forming a carboxyl group, hydroxyl group or lactone ring under the action of an acid, represented by formula (1), and a second polymer comprising recurring units capable of forming an amino group under the action of an acid and fluorine-containing recurring units copolymerized, represented by formula (2), in an ester solvent of 7 to 16 carbon atoms and/or ketone solvent of 8 to 16 carbon atoms.

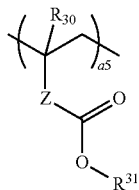
(3)

Herein $R^{30}$ is hydrogen or methyl. $R^{31}$ is an acid labile group. Z is a single bond or —C(=O)—O—$R^{32}$—, wherein $R^{32}$ is a straight, branched or cyclic $C_1$-$C_{10}$ alkylene group which may contain ether or ester, or naphthylene group, and 0<a5<1.0.

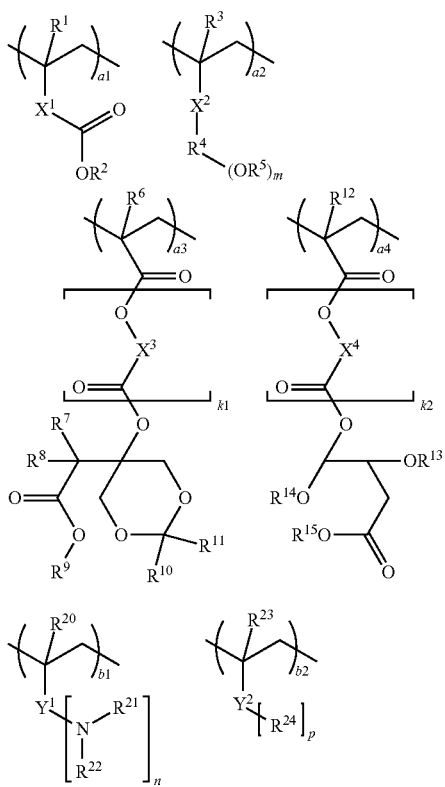
(1)

(2)

Herein $R^1$, $R^3$, $R^6$, $R^{12}$, $R^{20}$ and $R^{23}$ each are hydrogen or methyl. $R^2$, $R^5$, $R^{14}$ and $R^{22}$ each are an acid labile group. $X^1$ is a single bond, a phenylene or naphthylene group, or —C(=O)—O—$R^{16}$—, wherein $R^{16}$ is a straight, branched or cyclic $C_1$-$C_{10}$ alkylene group which may contain ether, ester, lactone ring or hydroxyl, or a phenylene or naphthylene group. $X^2$ is a single bond, a phenylene or naphthylene group which may contain nitro, cyano or halogen, or —C(=O)—O—$R^{17}$—, —C(=O)—NH—$R^{17}$—, —O—$R^{17}$—, or —S—$R^{17}$—, wherein $R^{17}$ is a straight, branched or cyclic $C_1$-$C_{10}$ alkylene group which may contain ether, ester, lactone ring or hydroxyl, or a phenylene or naphthylene group which may contain a straight, branched or cyclic $C_1$-$C_6$ alkyl, alkoxy, acyl, acyloxy, $C_2$-$C_6$ alkenyl, alkoxycarbonyl, $C_6$-$C_{10}$ aryl, nitro, cyano, or halogen. $R^4$ is a single bond, a di to penta-valent, straight, branched or cyclic $C_1$-$C_{16}$ aliphatic hydrocarbon group, or phenylene group, which may contain ether or ester. The subscript m is 1 to 4. $R^7$ and $R^8$ are each independently hydrogen, fluorine, or a straight, branched or cyclic $C_1$-$C_8$ monovalent hydrocarbon group. $R^9$, $R^{13}$ and $R^{15}$ each are hydrogen, or a straight, branched or cyclic $C_1$-$C_{20}$ monovalent hydrocarbon group in which any constituent —$CH_2$— moiety may be replaced by —O— or —C(=O)—, or whose hydrogen may be replaced by halogen. $R^{10}$ and $R^{11}$ are each independently hydrogen, or a straight, branched or cyclic $C_1$-$C_8$ monovalent hydrocarbon group, or $R^{10}$ and $R^{11}$ may bond together to form a $C_3$-$C_{17}$ non-aromatic ring with the carbon atom to which they are attached. $X^3$ and $X^4$ each are a straight, branched or cyclic $C_1$-$C_{20}$ divalent hydrocarbon group, in which any constituent —$CH_2$— moiety may be replaced by —O— or —C(=O)—. Each of $k^1$ and $k^2$ is 0 or 1. $Y^1$ is a single bond, phenylene group or —C(=O)—O—$R^{25}$—, wherein $R^{25}$ is a single bond, a straight, branched or cyclic $C_1$-$C_{10}$ alkylene group which may contain ether, ester, —N= or —S—, or a phenylene or naphthylene group. $R^{21}$ is hydrogen, or a straight or branched $C_1$-$C_4$ alkyl group. $Y^2$ is a phenylene, —C(=O)—O—$R^{26}$— or ether group, wherein $R^{26}$ is a single bond, a straight, branched or cyclic $C_1$-$C_{10}$ alkylene group which may contain ether, ester or —S—. $R^{24}$ is fluorine or a straight, branched or cyclic $C_1$-$C_{14}$ alkyl group which has at least one fluorine atom and which may contain hydroxy, ether or ester. The subscript n is 1 or 2, p is an integer of 1 to 6, a1 to a4, b1 and b2 are numbers in the range: 0≤a1≤1.0, 0≤a2≤1.0, 0≤a3≤1.0, 0≤a4≤1.0, 0<a1+a2+a3+a4≤1.0, 0<b1<1.0, 0<b2<1.0, and 0<b1+b2≤1.0.

The shrink agent used in the pattern forming process of the invention is based on first and second polymers. The first polymer comprises recurring units of at least one type selected from recurring units (a1) to (a4) capable of forming a carboxyl group, hydroxyl group or lactone ring under the action of an acid, represented by the general formula (1). The second polymer is a copolymer comprising recurring units capable of forming an amino group under the action of an acid and recurring units containing fluorine, represented by the general formula (2).

In the case of recurring units (a3) and (a4) in formula (1), a lactone ring forms under the action of an acid according to the following scheme.

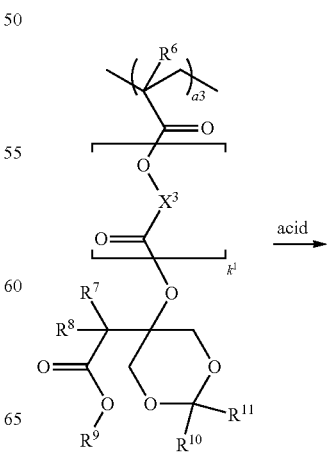

-continued

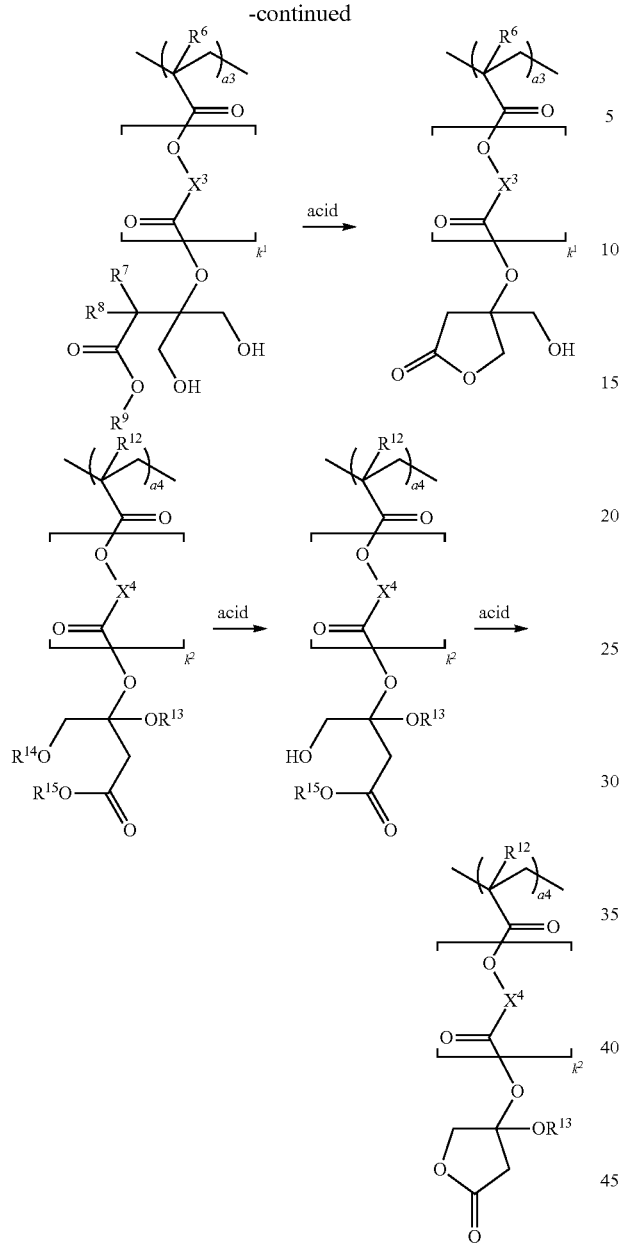

Herein $R^6$ to $R^{11}$, $R^{12}$ to $R^{15}$, $X^3$, $X^4$, $k^1$ and $k^2$ are as defined above.

It should be avoided that when the shrink agent solution is applied onto a resist pattern, the resist pattern is dissolved in the solvent of the shrink agent. To this end, the solvent of the shrink agent must be selected from those solvents that do not dissolve the resist film. The solvents that do not dissolve the resist film include ether solvents of 6 to 12 carbon atoms, alcohol solvents of 4 to 10 carbon atoms, hydrocarbon solvents of 6 to 12 carbon atoms, ester solvents of 7 to 16 carbon atoms, ketone solvents of 8 to 16 carbon atoms, and water. Although a number of water-based shrink agents are already proposed as alluded to previously, they are difficult to quickly apply to large-diameter wafers because of the high surface tension of water. A problem arises particularly in the case of a fine hole pattern formed via negative development. When holes are filled with the shrink agent by spin coating, the water solvent having a high surface tension prevents the shrink agent from burying in the holes to the bottom. In contrast, when a shrink agent dissolved in an organic solvent having a lower surface tension than water is applied, the ability to fill or bury to the hole bottom is improved. Also the organic solvent used in the shrink agent must dissolve the base polymer of the shrink agent. Of the above organic solvents, ester solvents of 7 to 16 carbon atoms and ketone solvents of 8 to 16 carbon atoms are preferred for dissolving both the first polymer comprising recurring units having formula (1) and the second polymer comprising recurring units having formula (2).

The monomers Ma1 to Ma4 from which recurring units (1a) to (4a) are derived are given below.

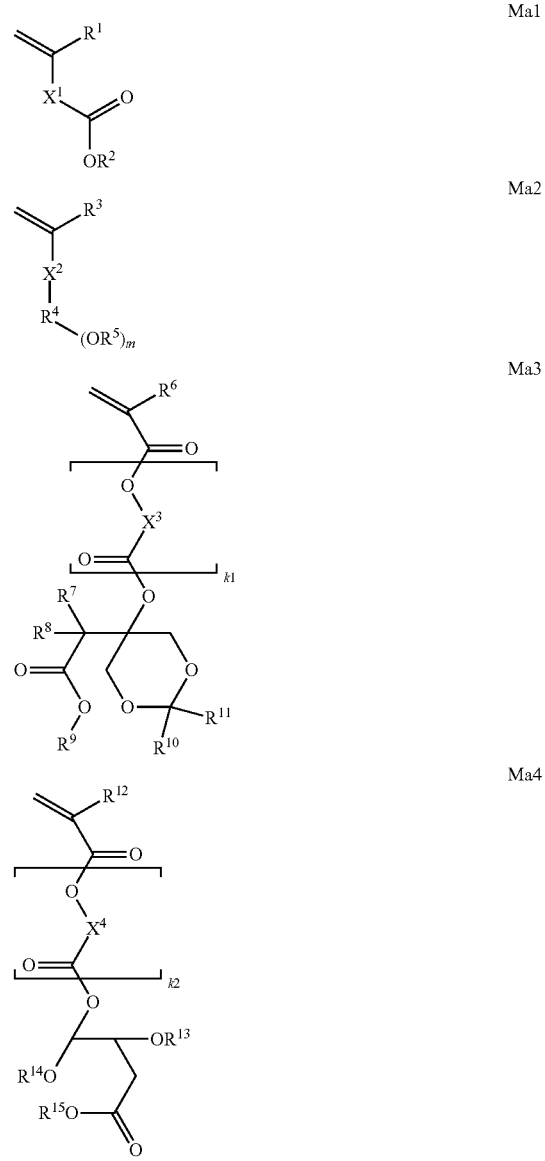

Herein $R^1$ to $R^{15}$, $X^1$ to $X^4$, $k^1$, $k^2$ and m are as defined above.

Examples of the structure of the monomer Ma1 wherein $X^1$ is a variant are illustrated below. $R^1$ and $R^2$ are as defined above.

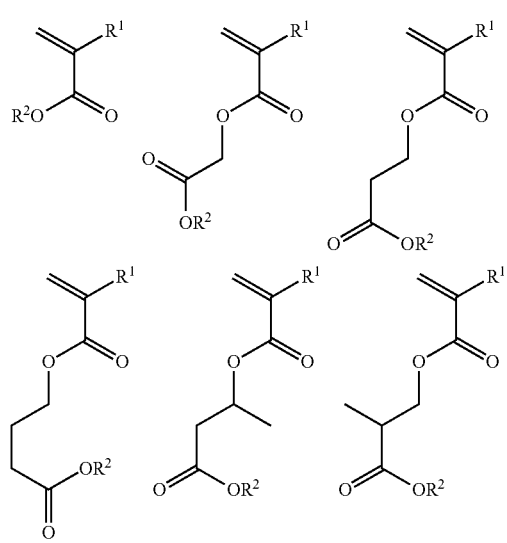
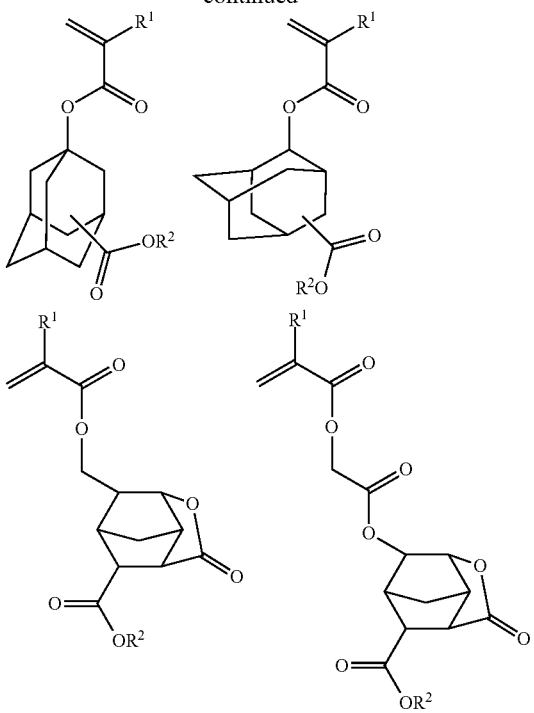
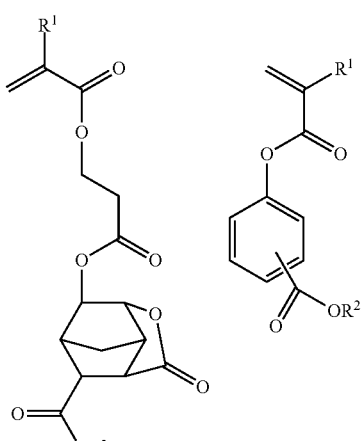
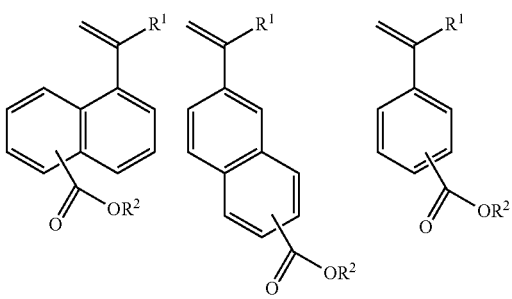
Examples of the structure of the monomer Ma2 wherein $X^2$ and $R^4$ are variants are illustrated below. $R^3$ and $R^5$ are as defined above.

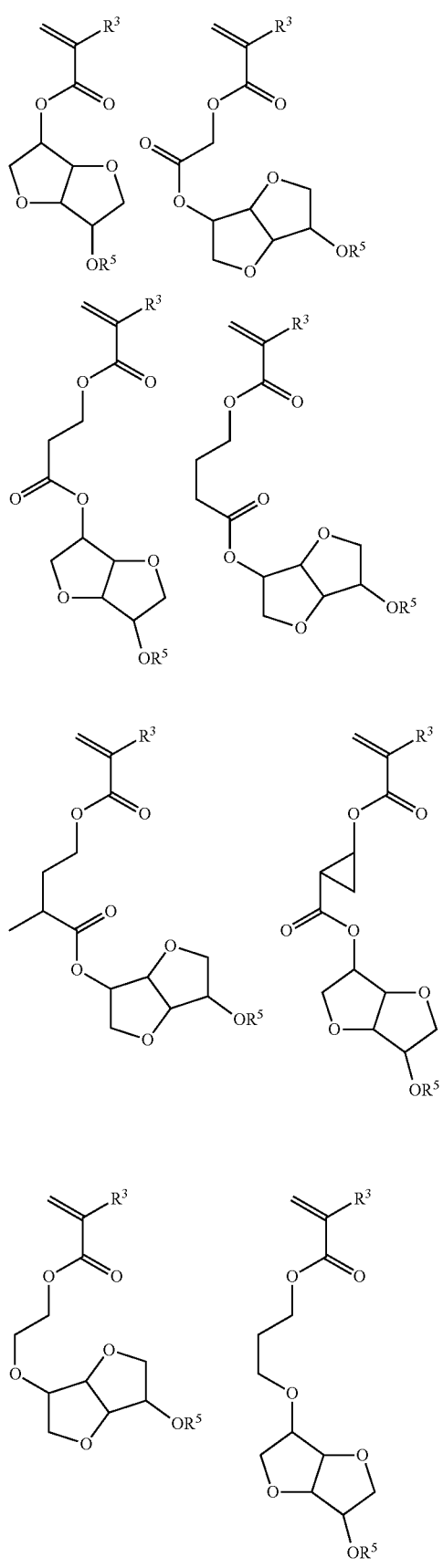
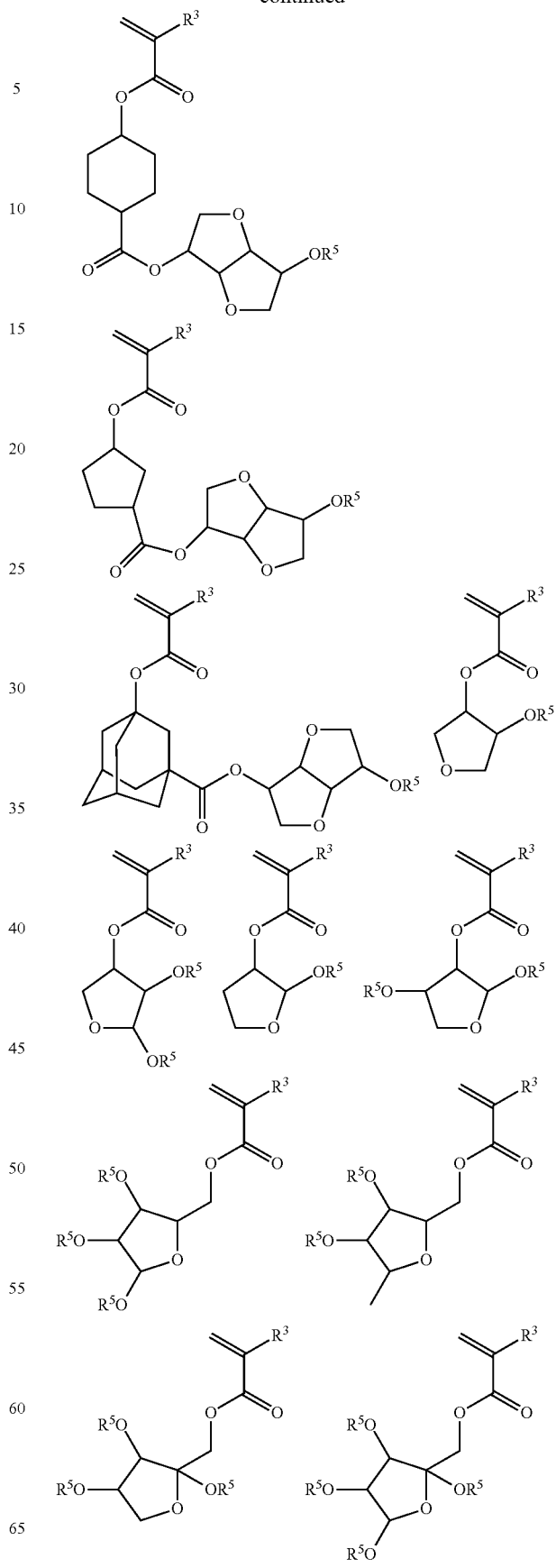

-continued
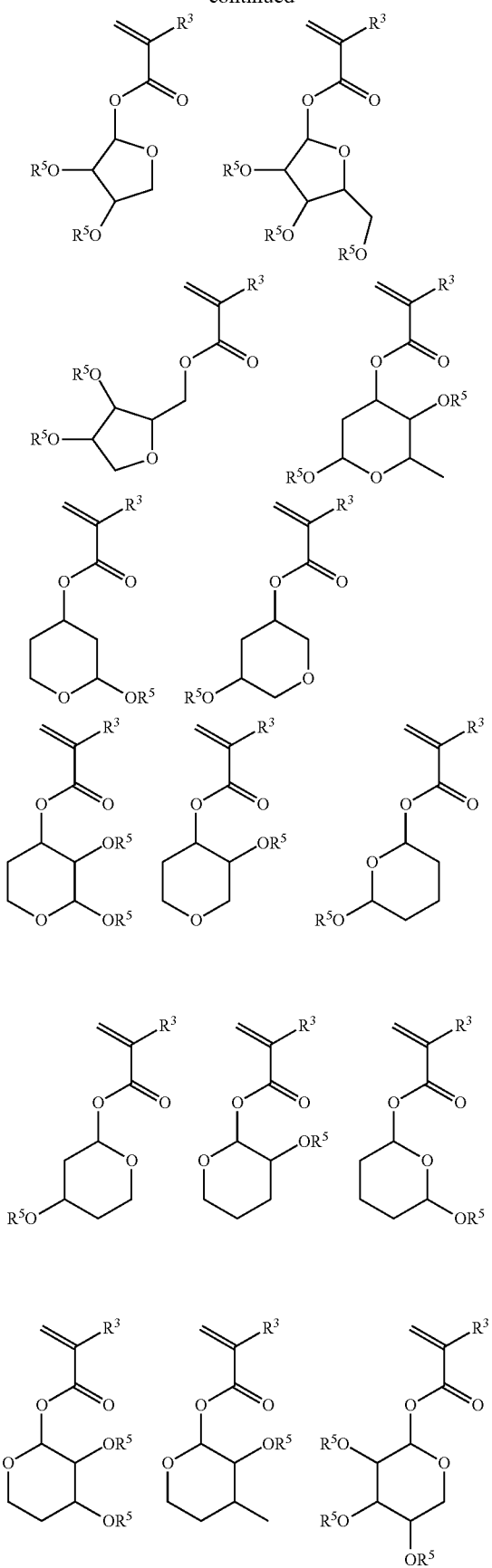

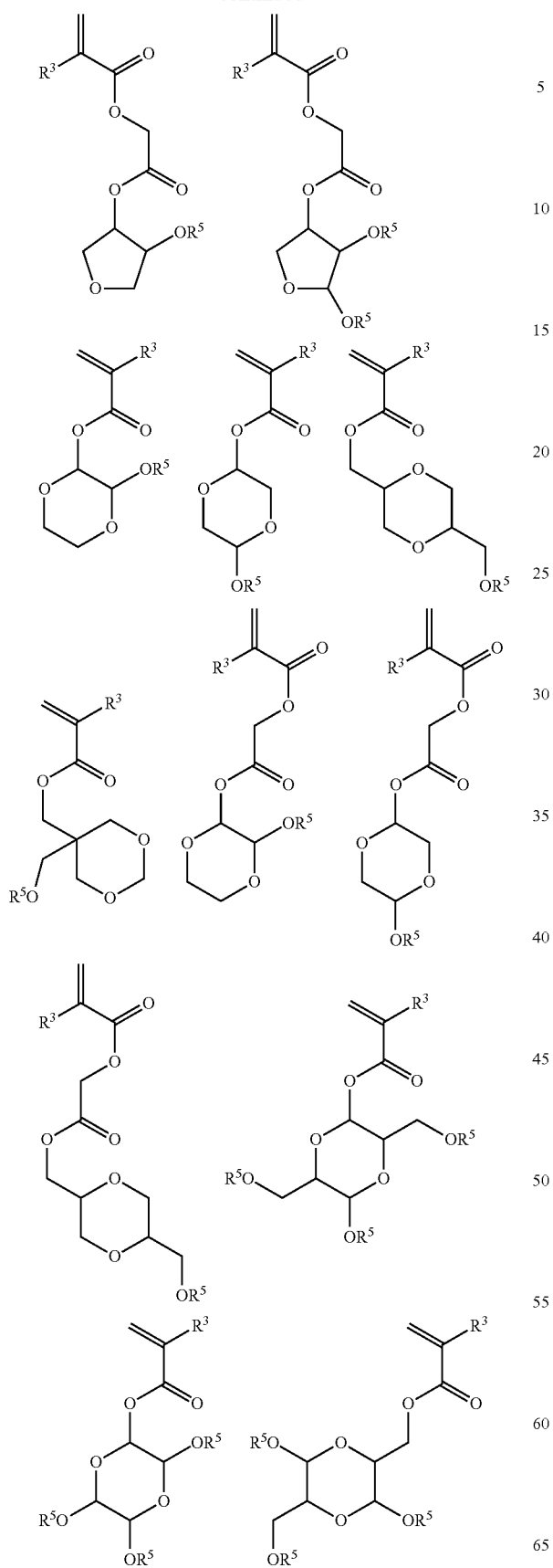
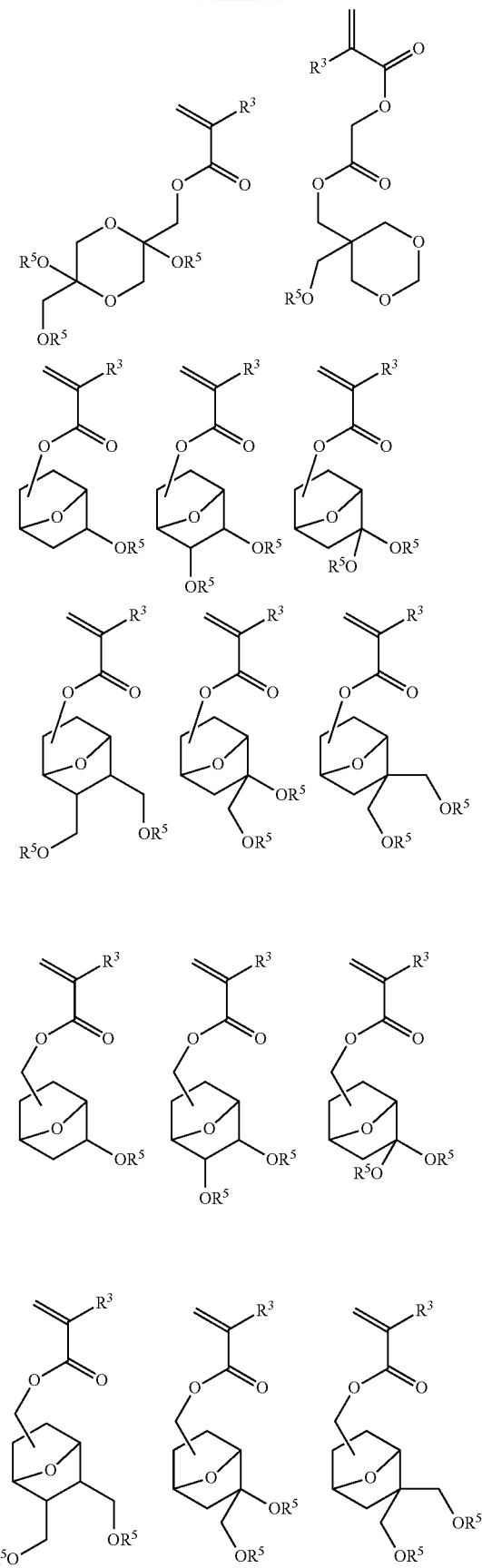

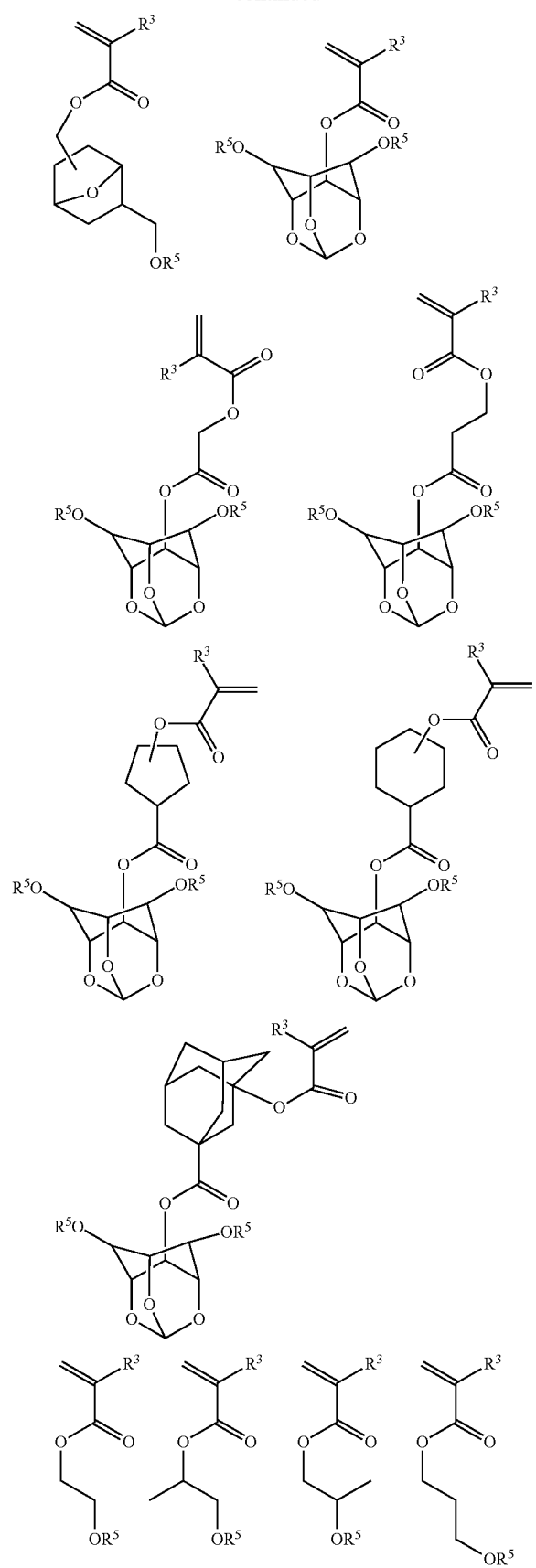
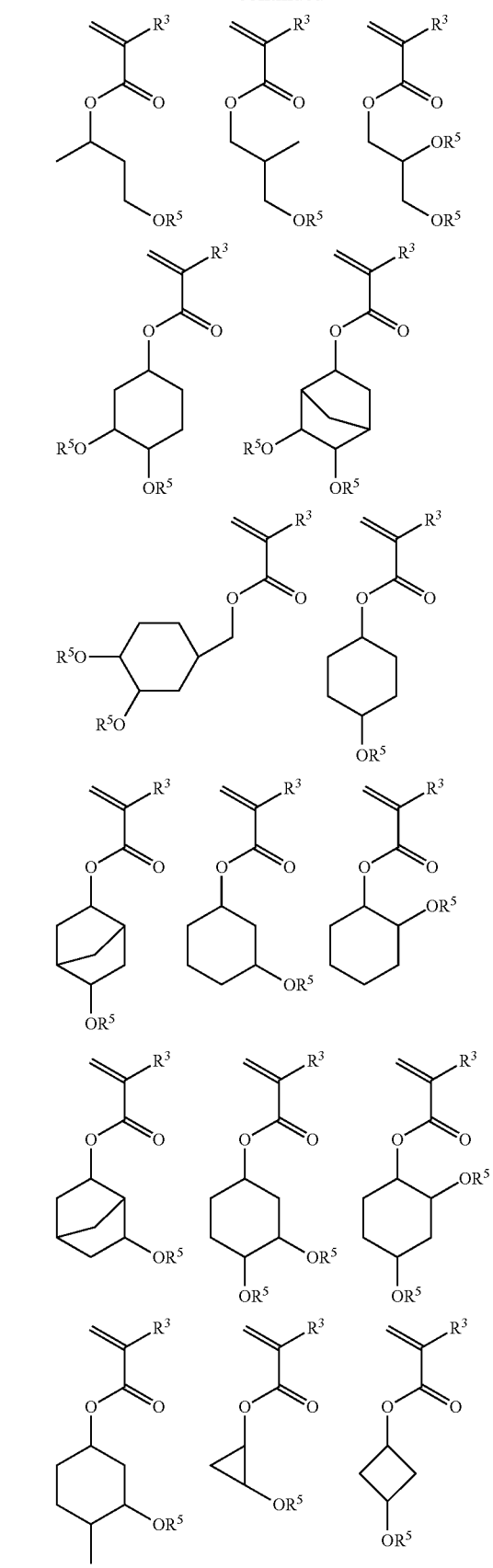

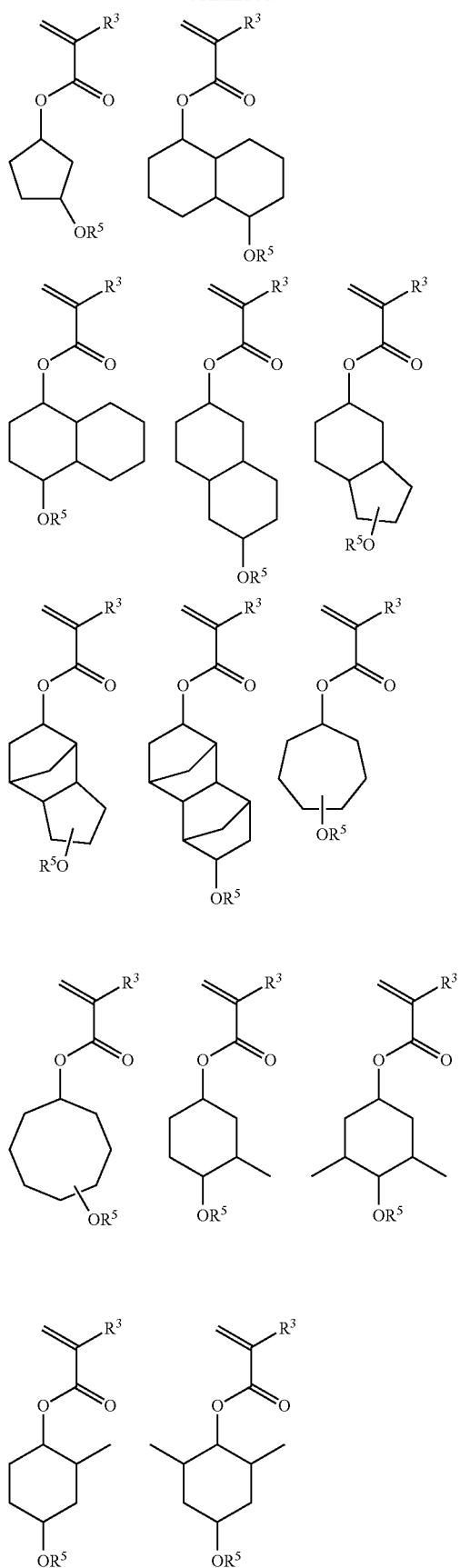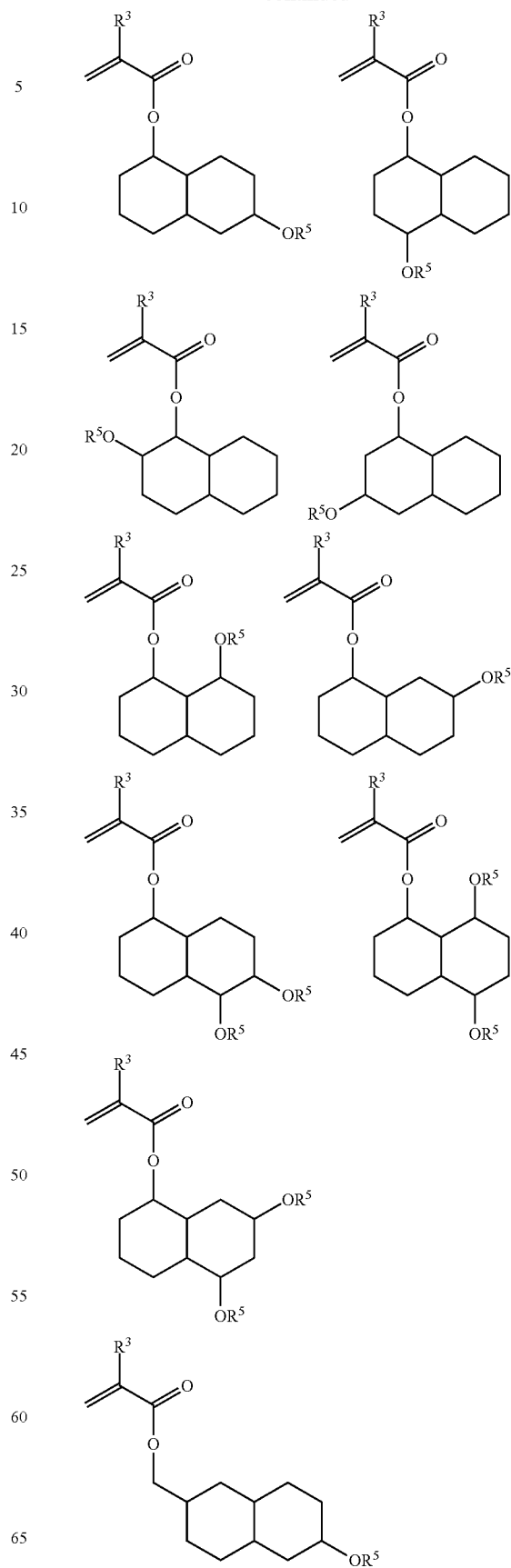

-continued
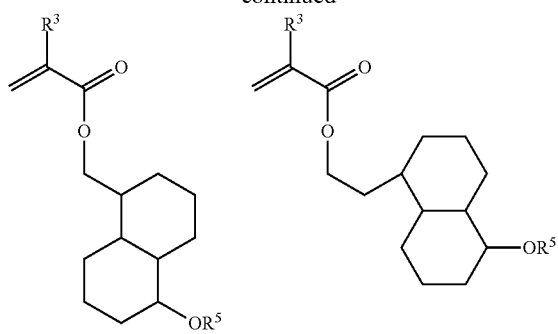
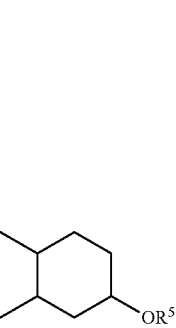
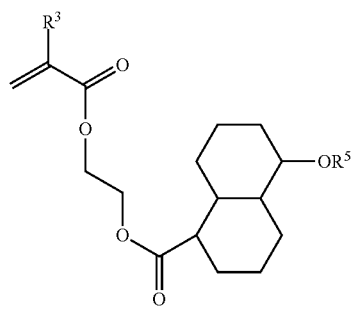
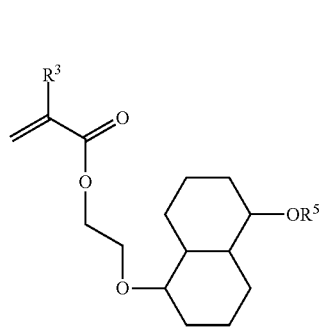
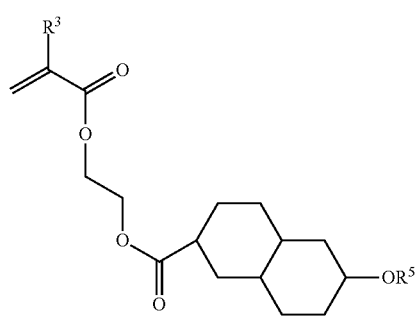
-continued
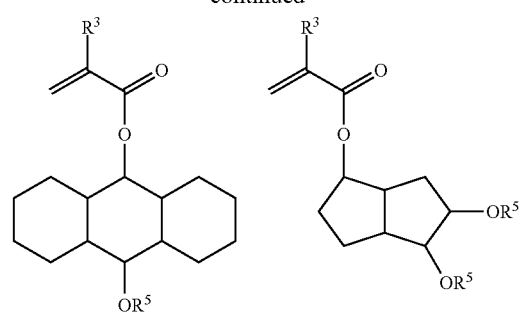
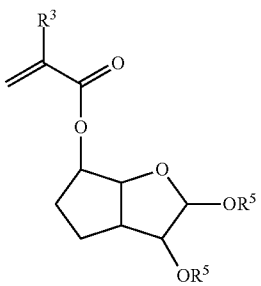
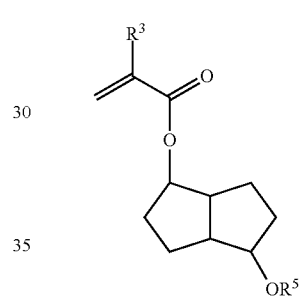
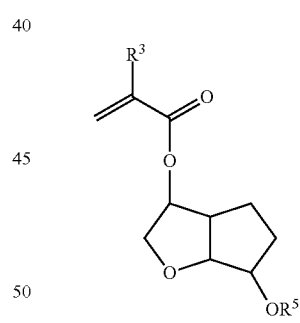
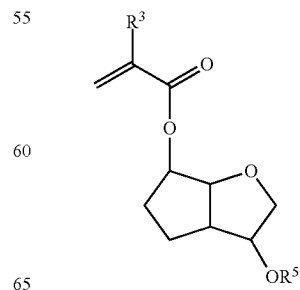

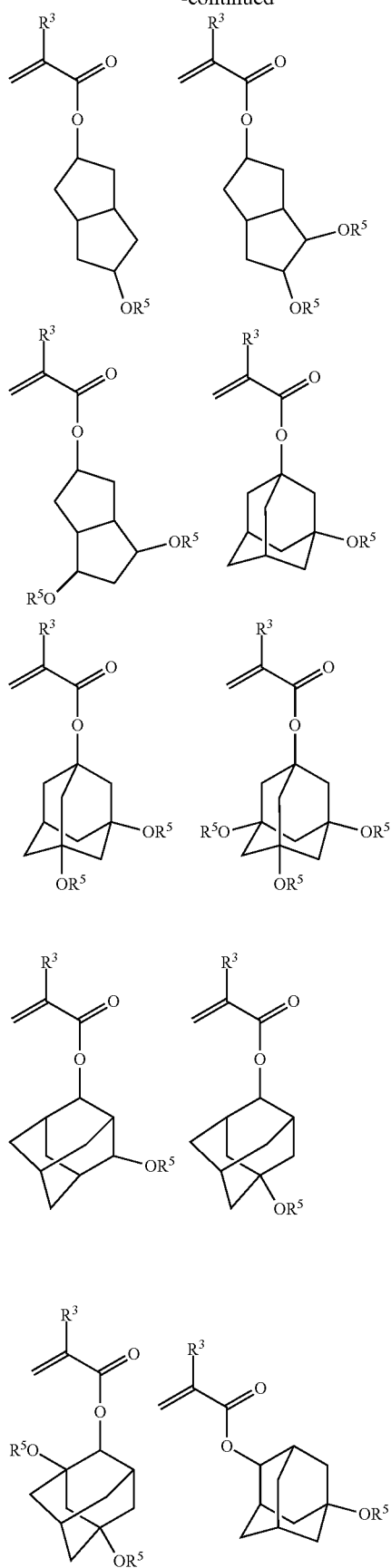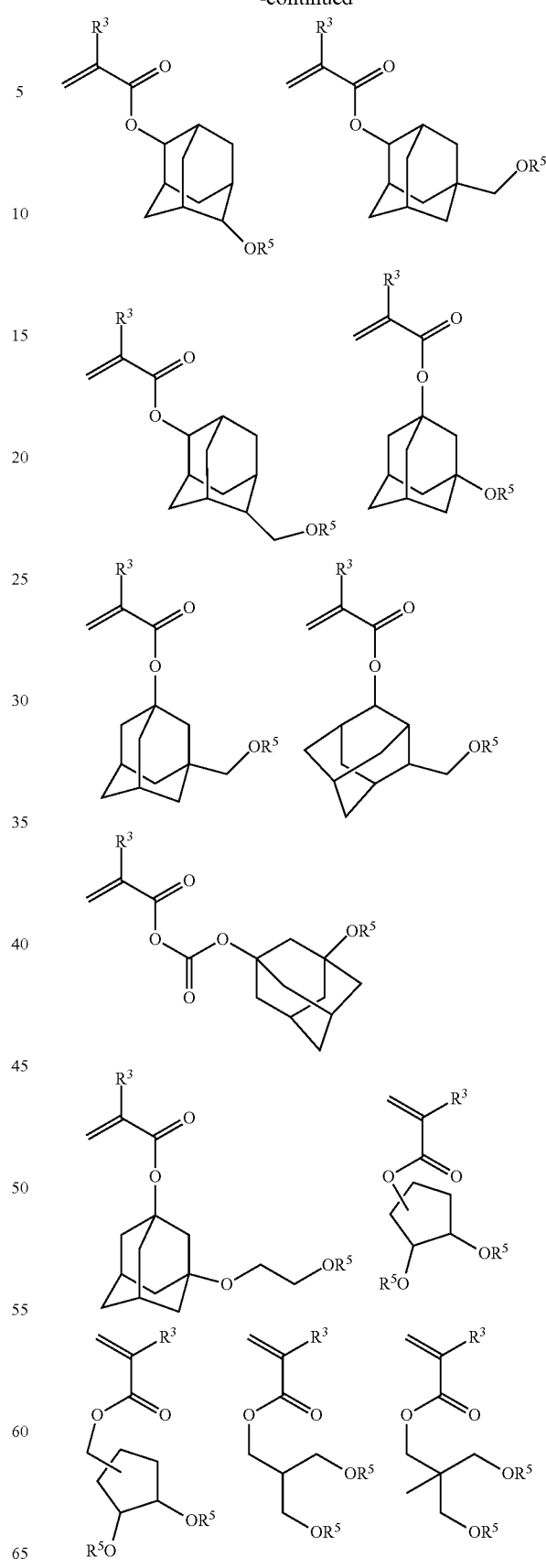

-continued
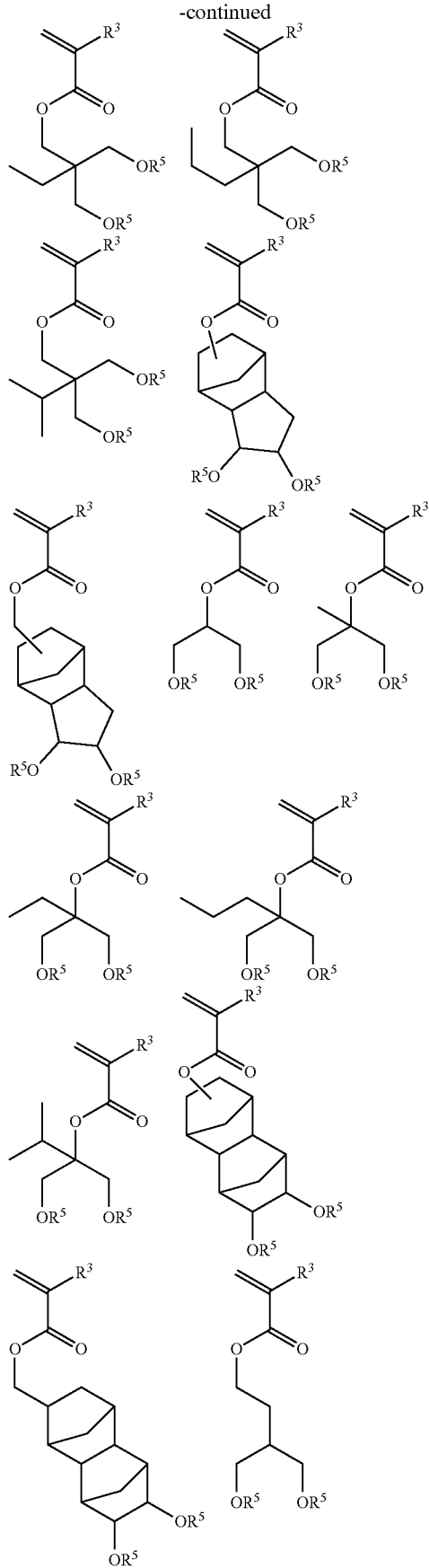
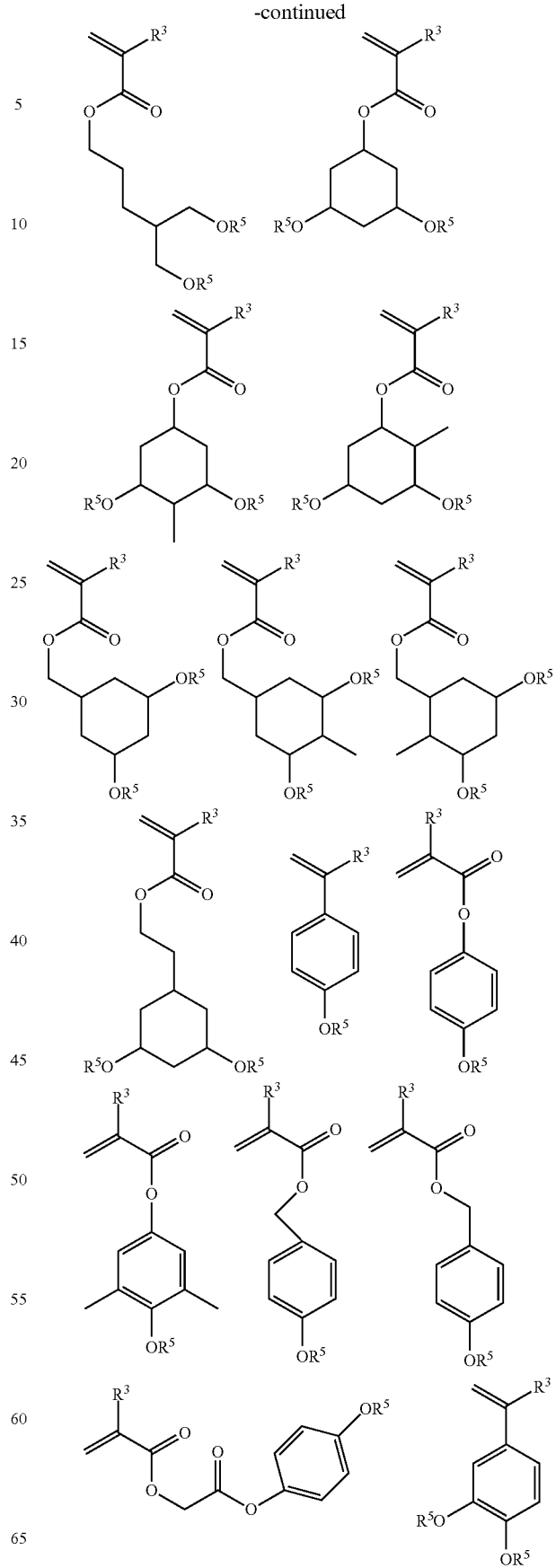

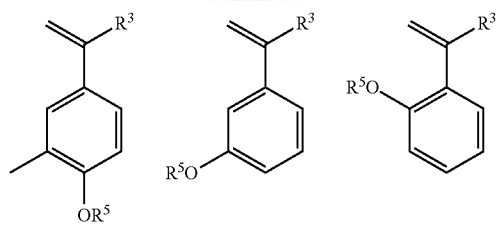
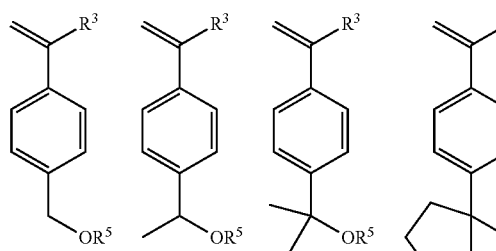
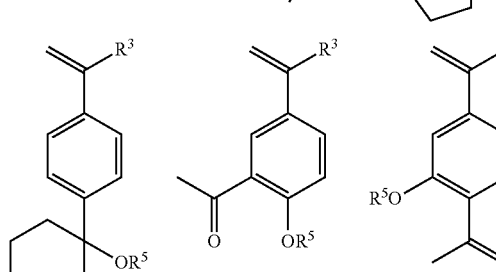
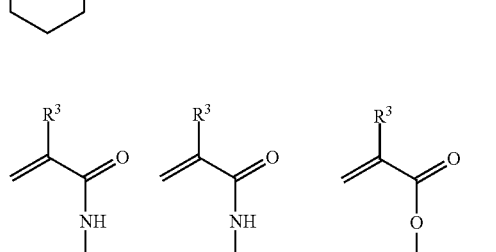
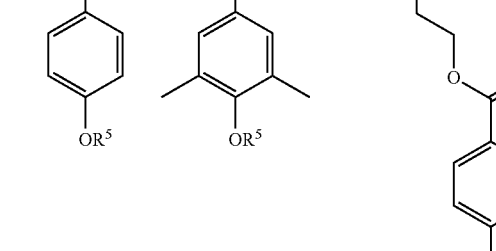
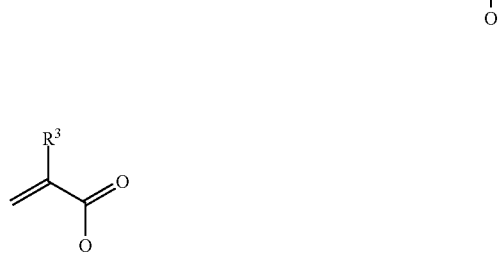
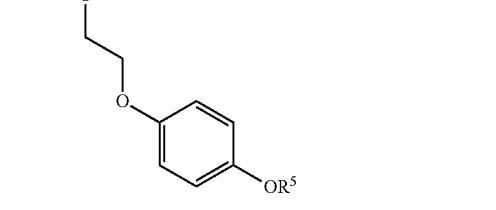

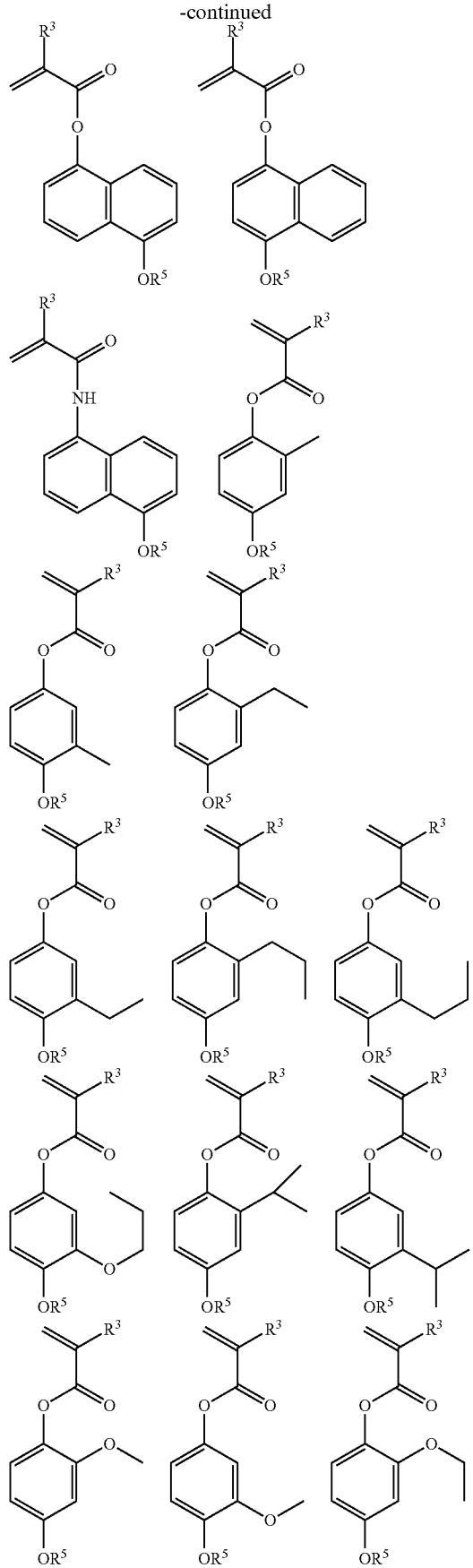
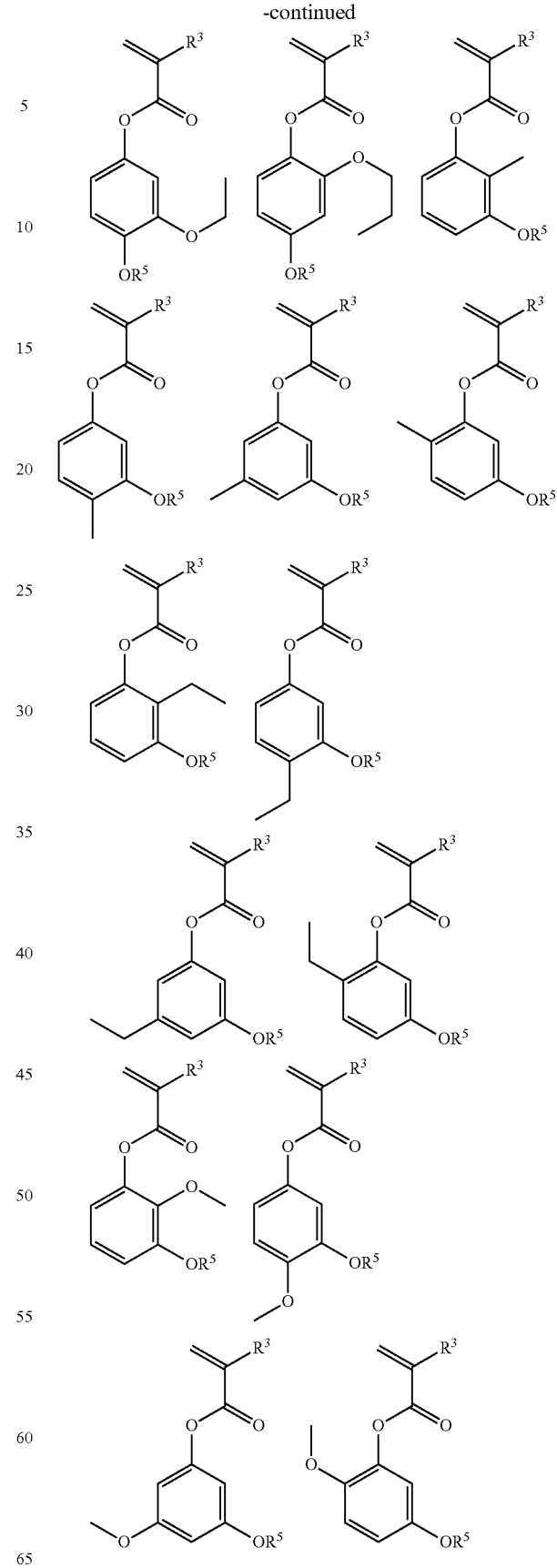

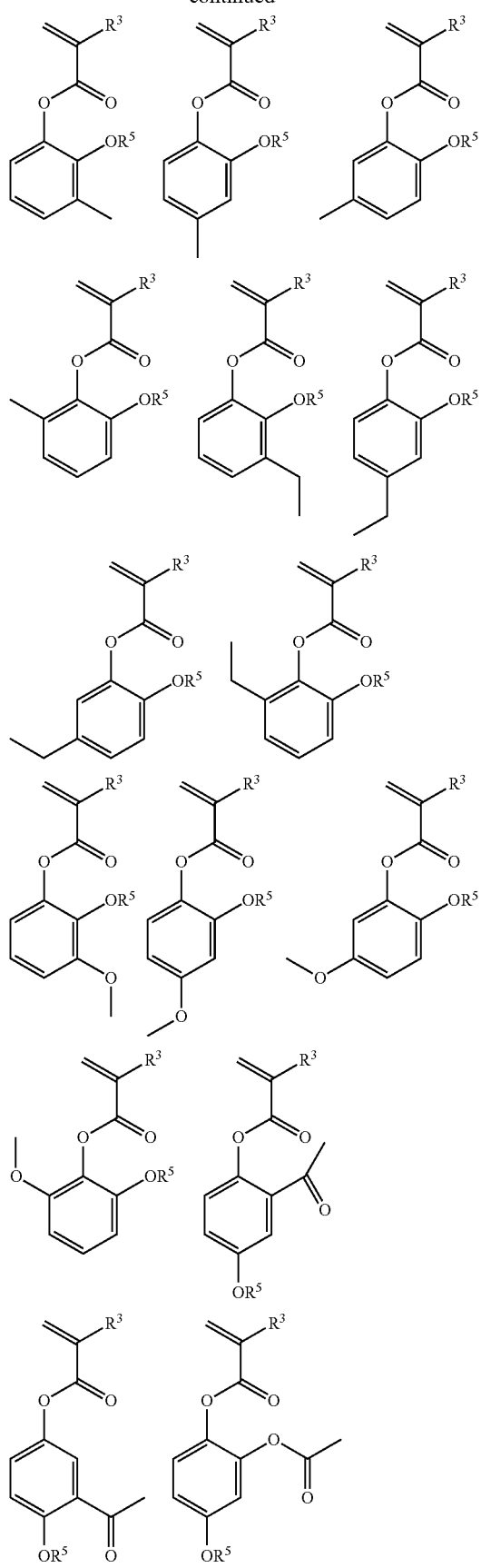
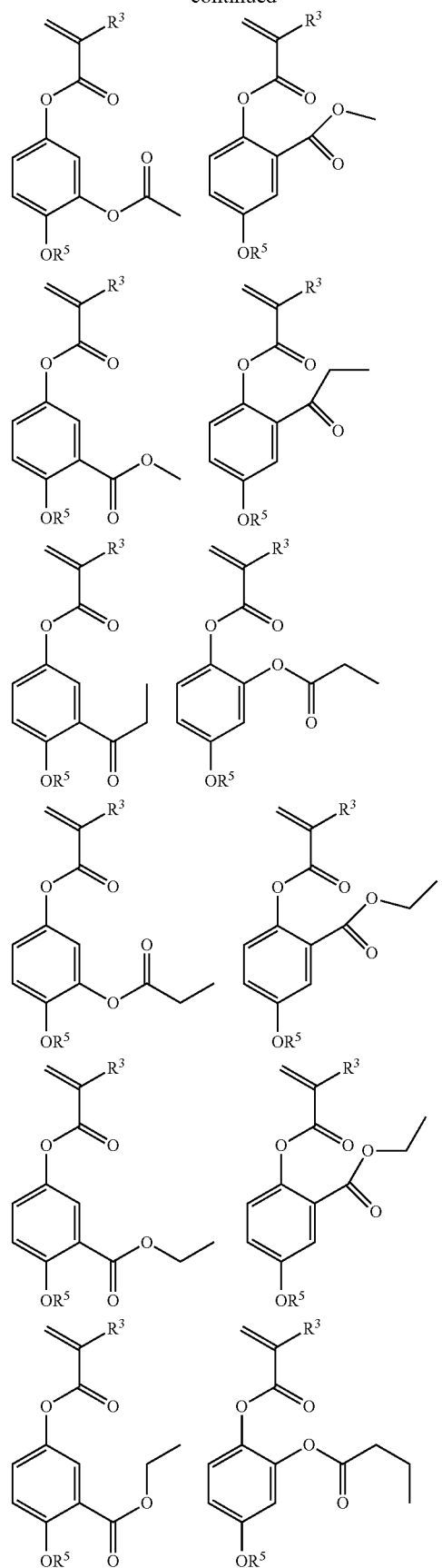

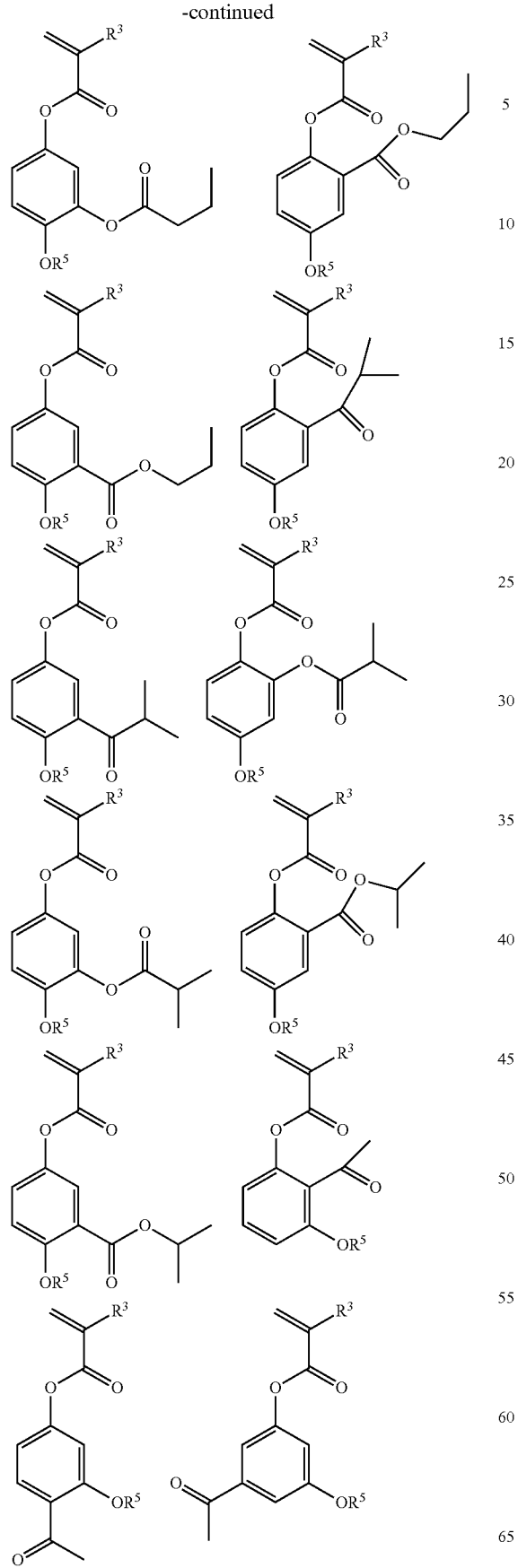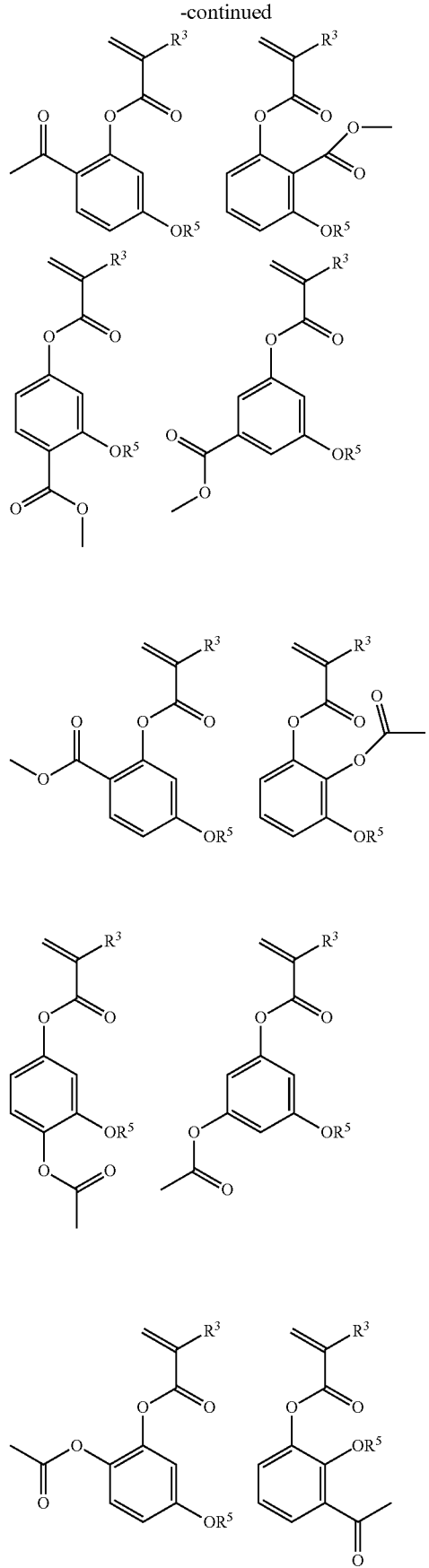

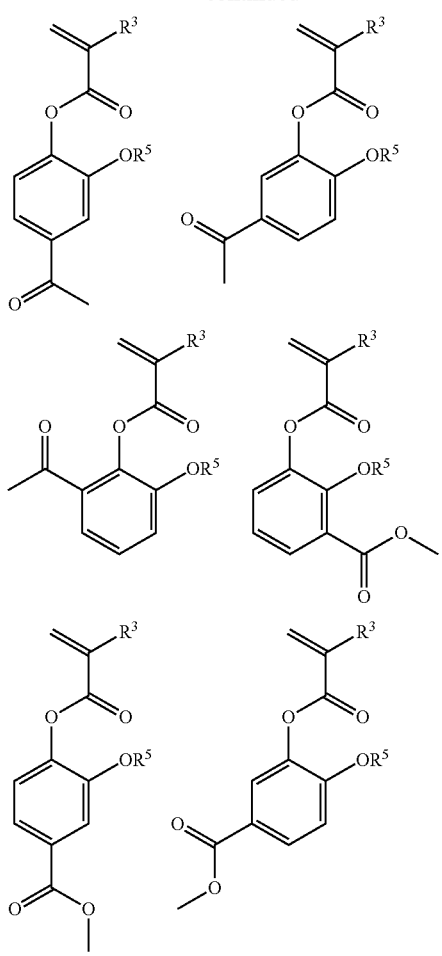
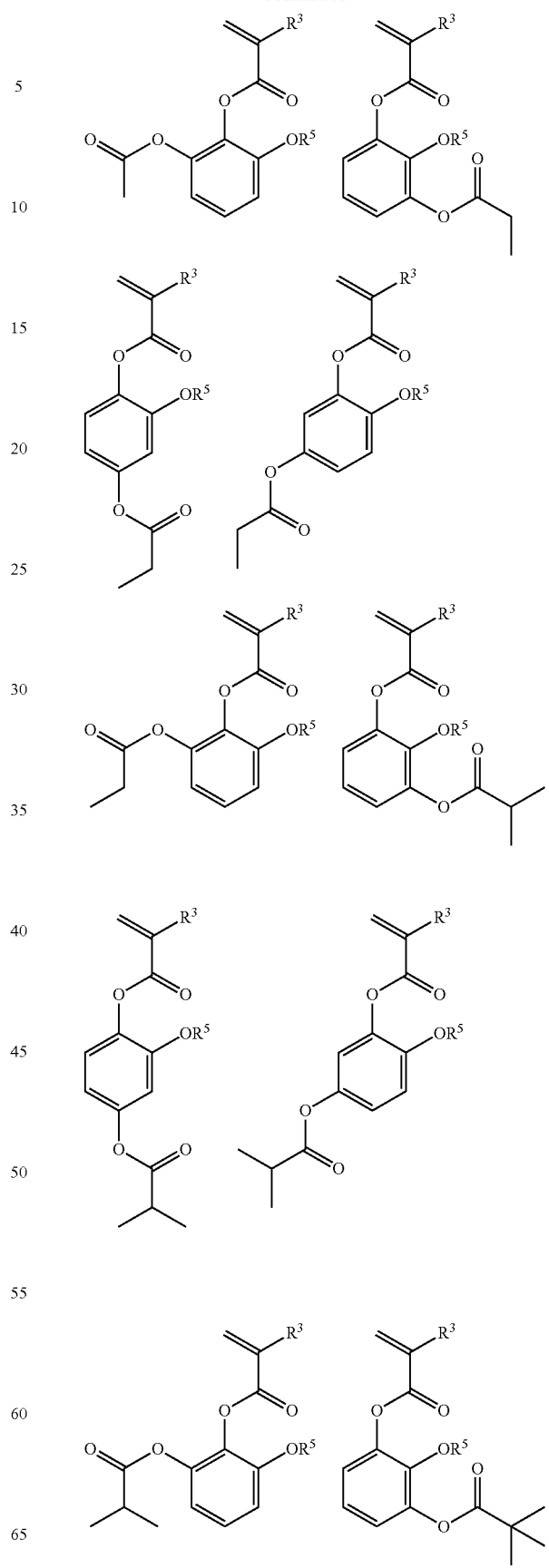

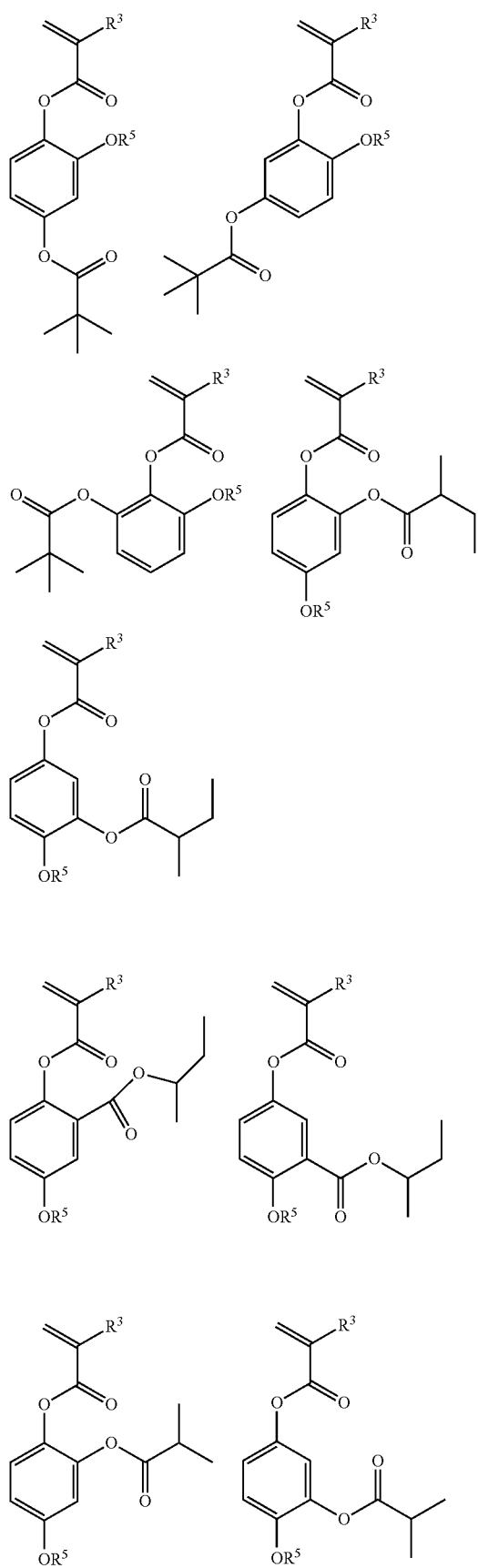
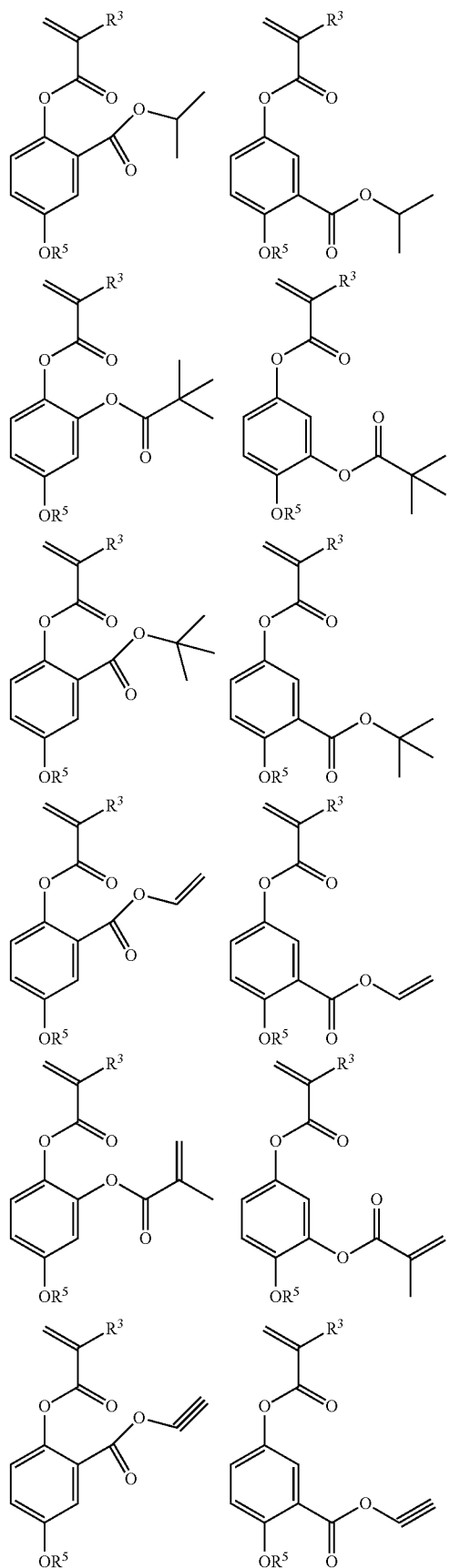

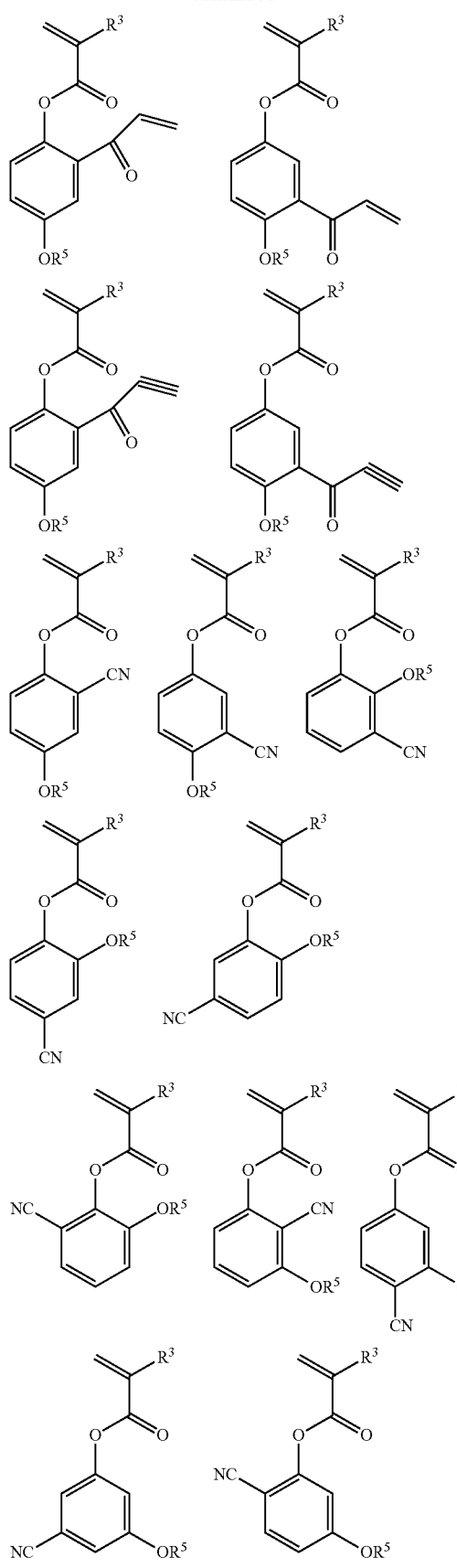
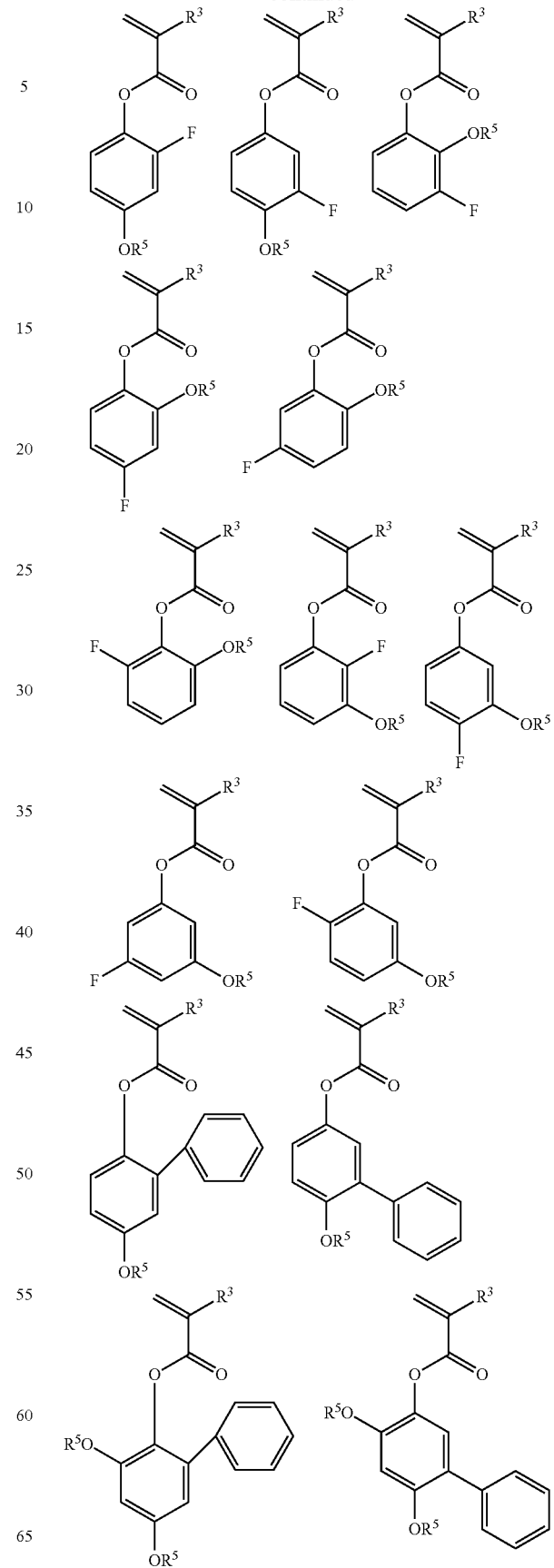

-continued
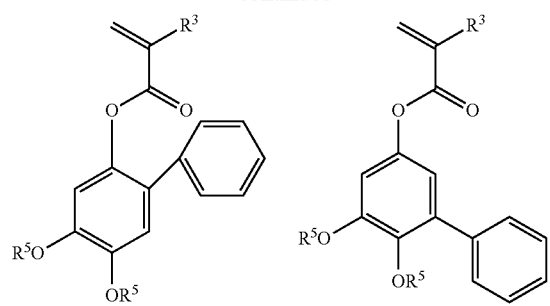
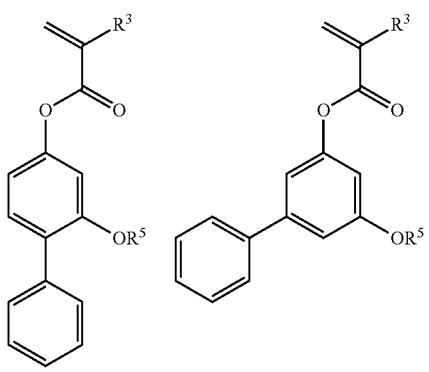
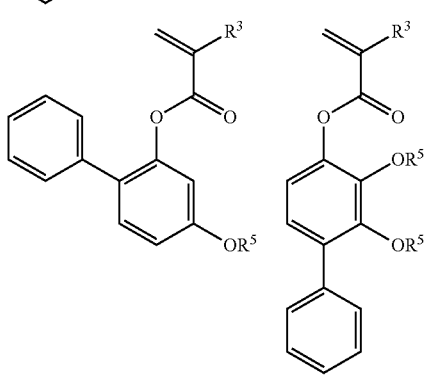
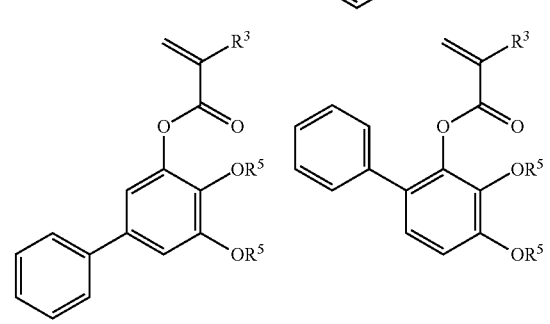
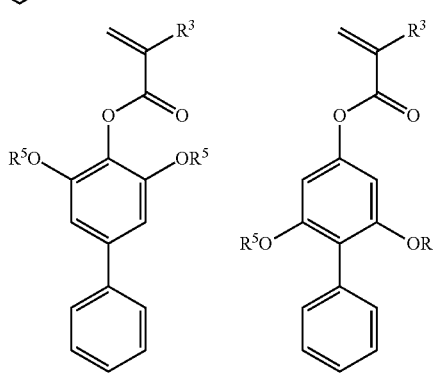
-continued
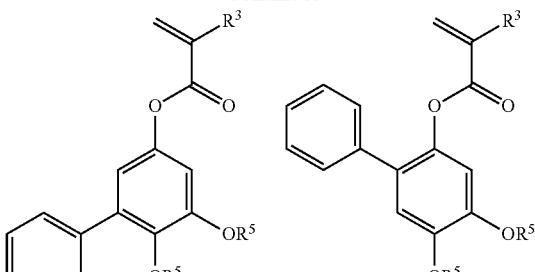
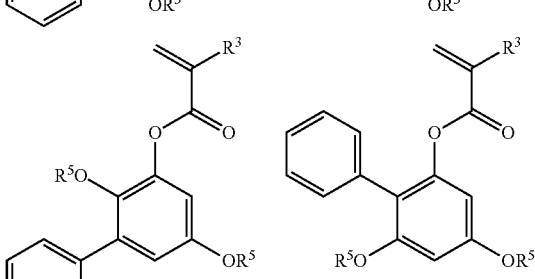
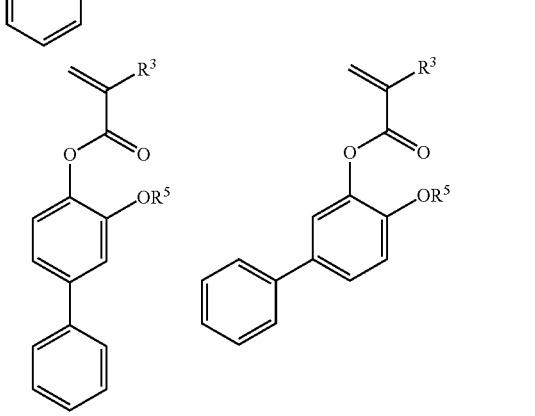
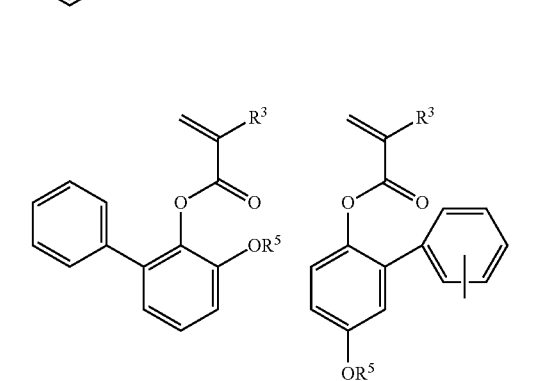
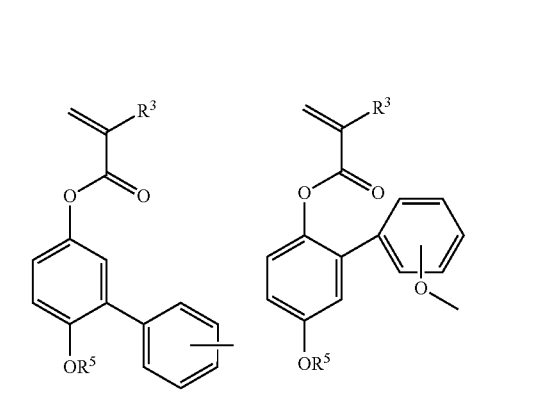

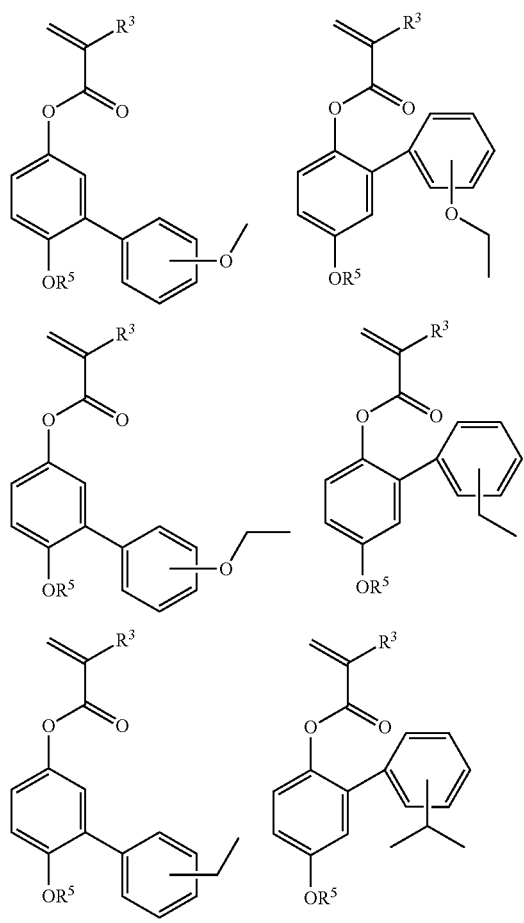
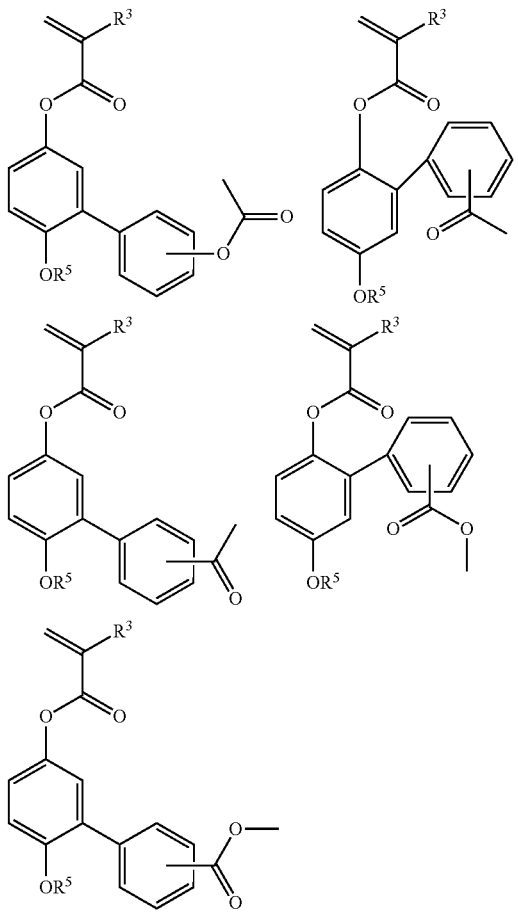
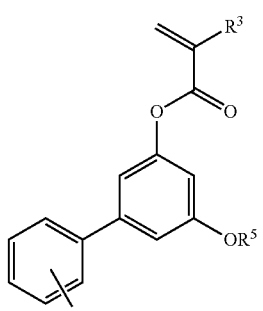
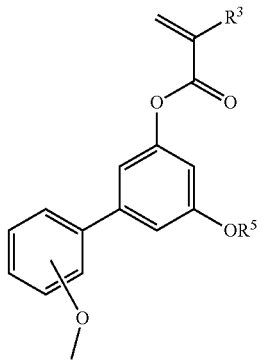

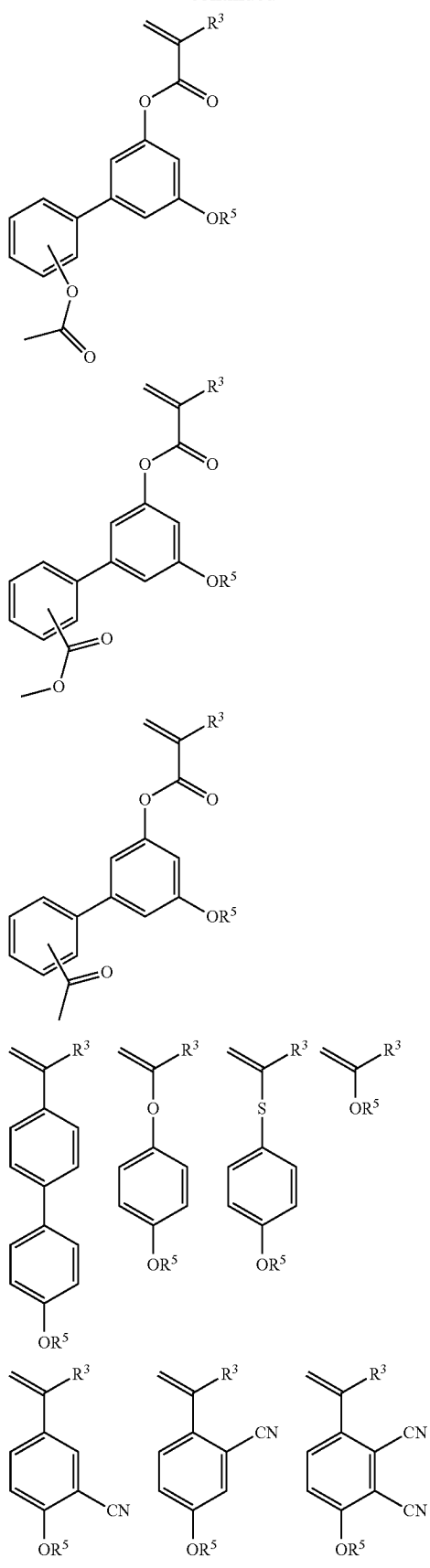
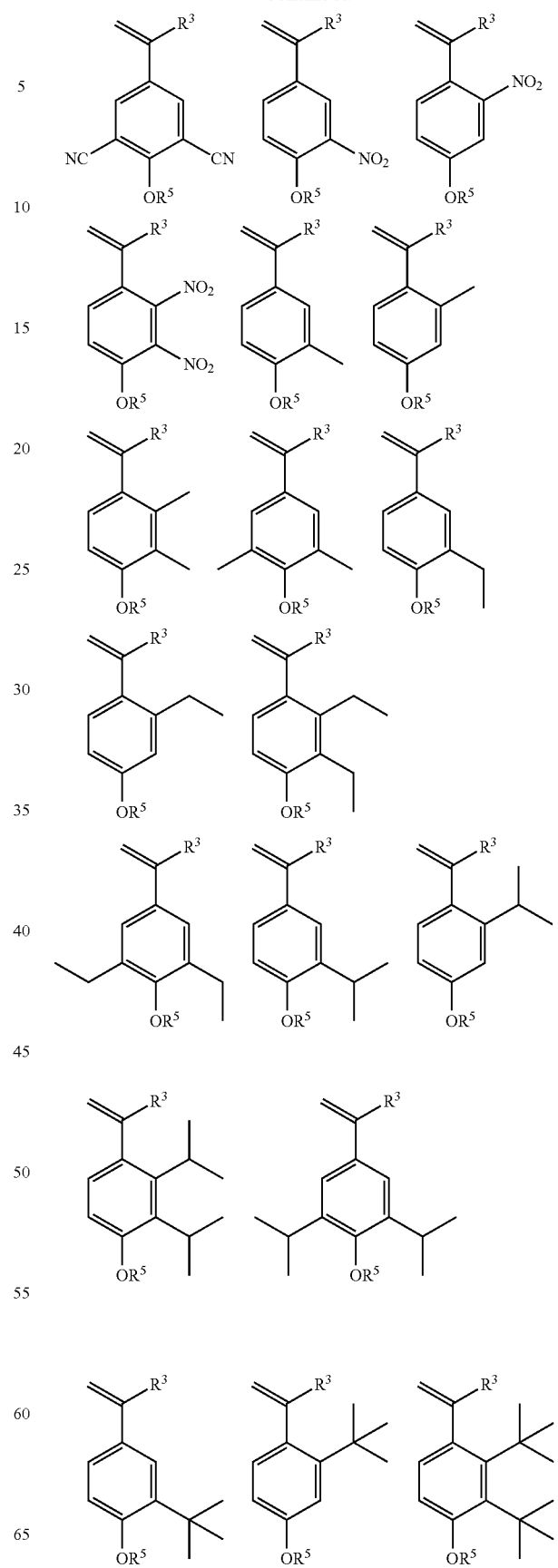

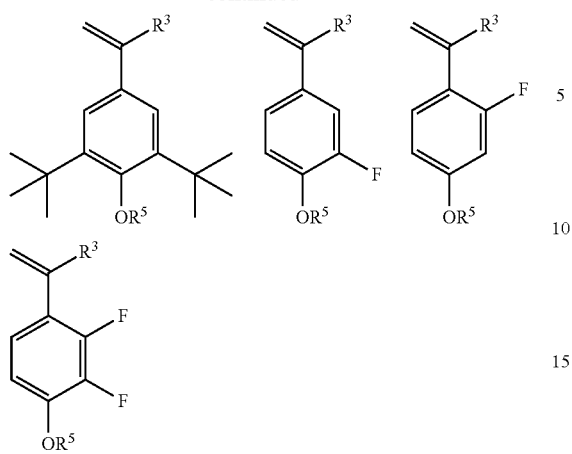
Examples of the monomer Ma3 are illustrated below. $R^6$ is as defined above.
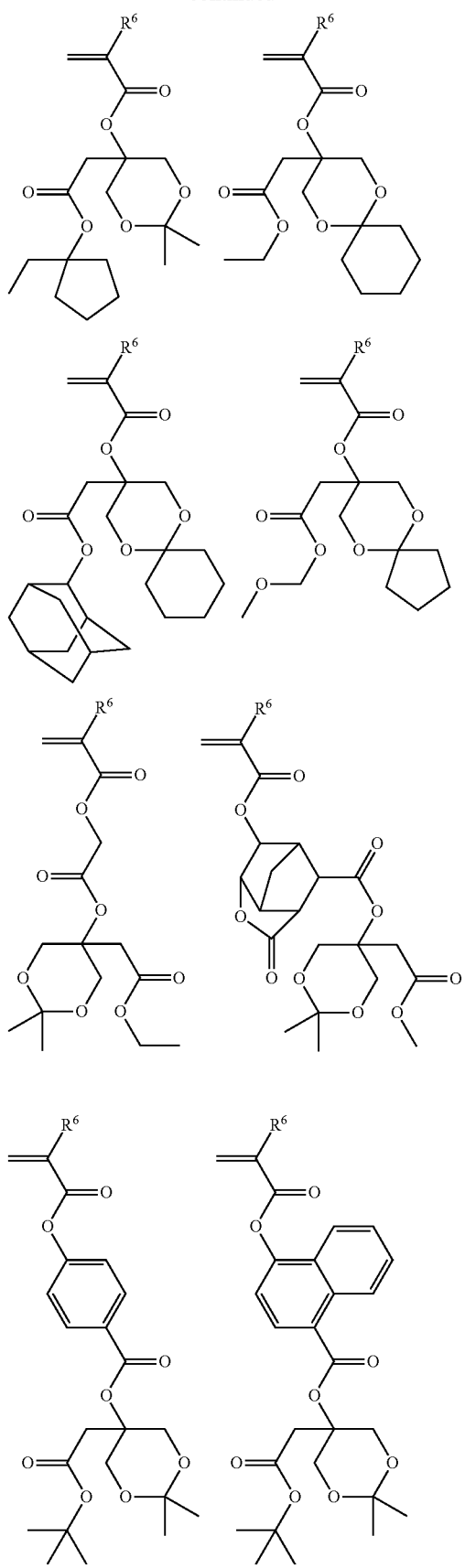

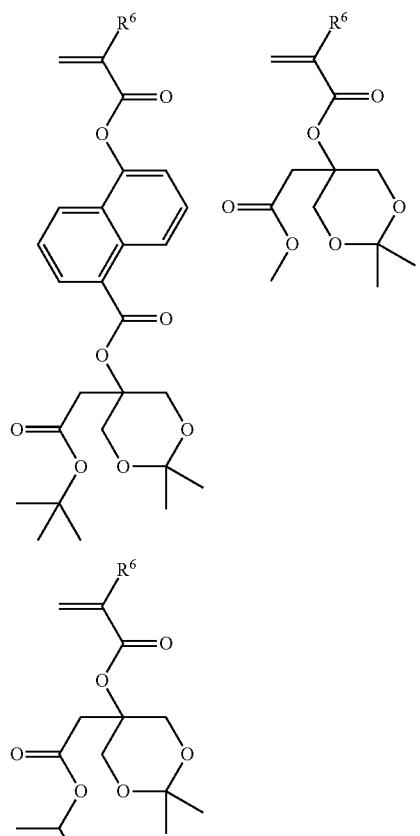
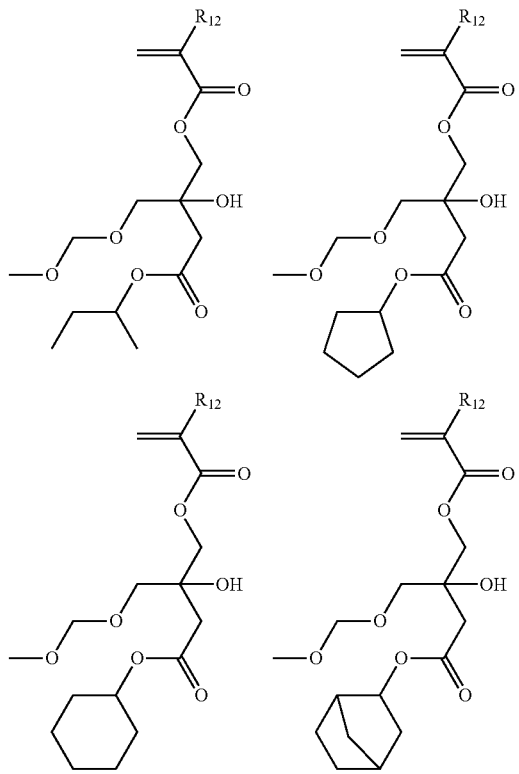
Examples of the monomer Ma4 are illustrated below. $R^{12}$ is as defined above.
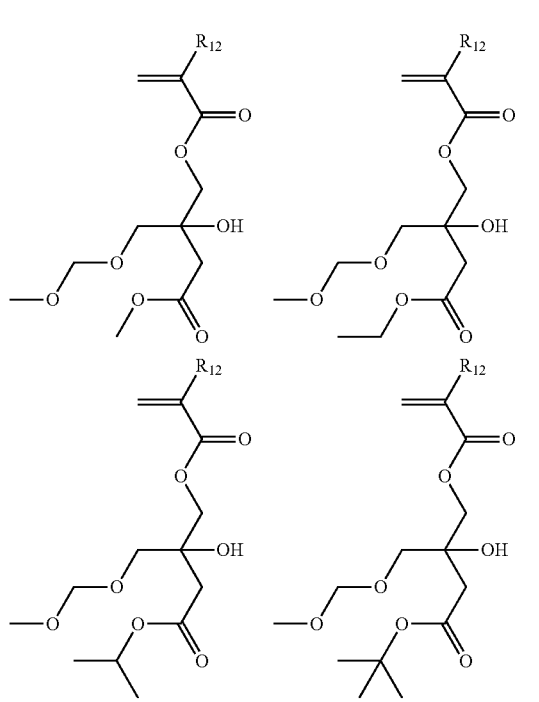
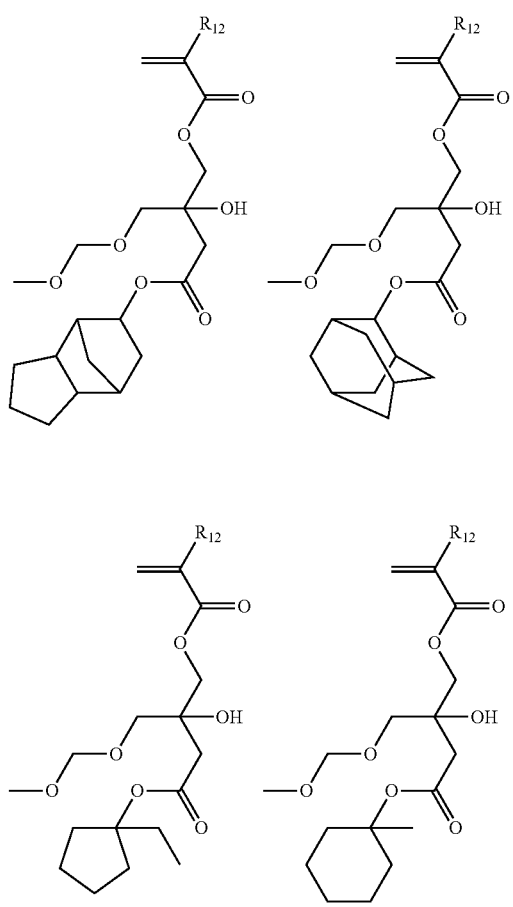

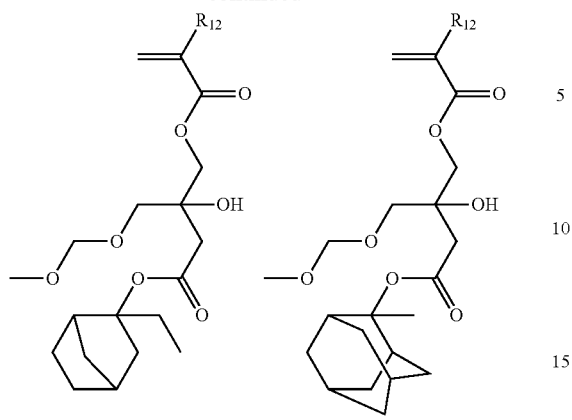
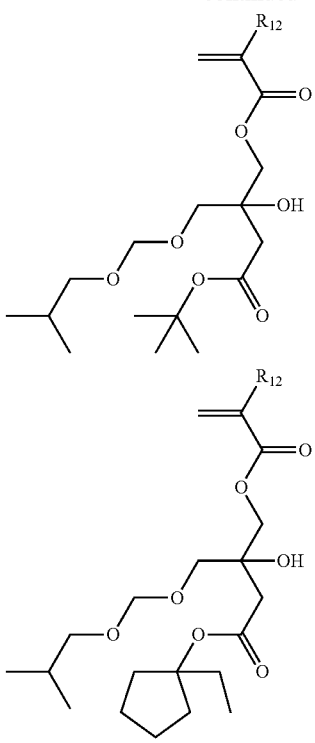
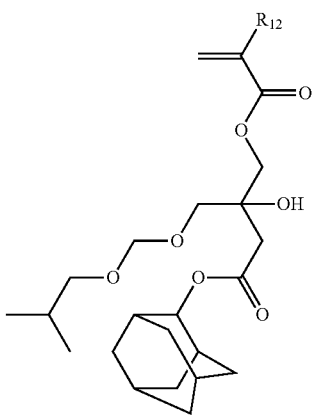
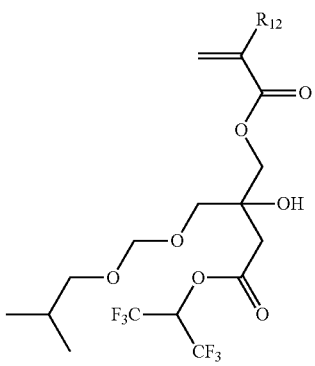

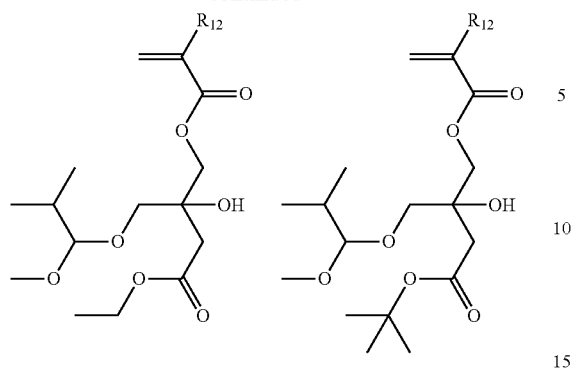
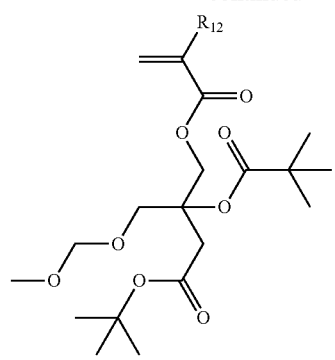
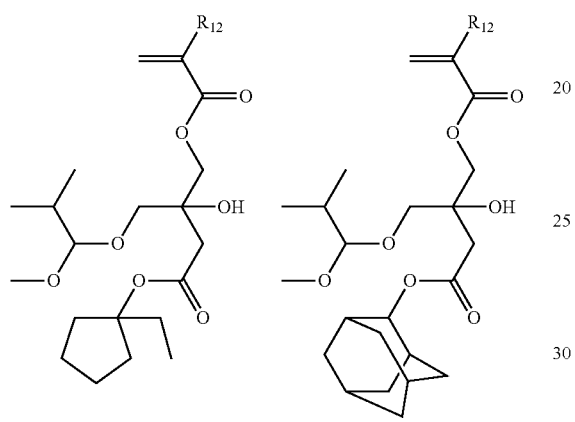
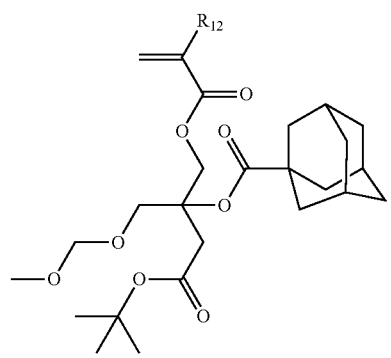
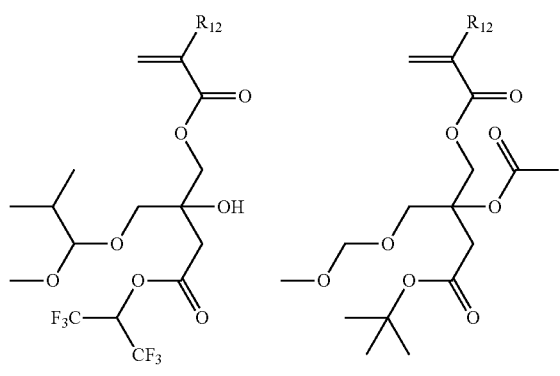
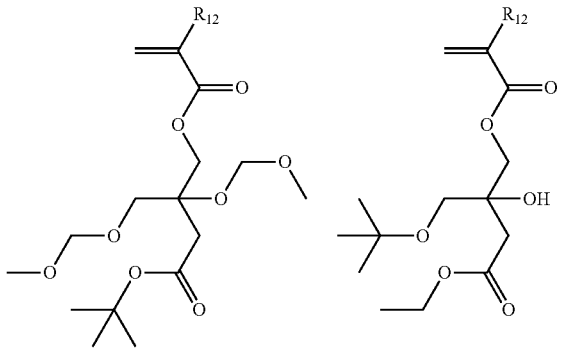
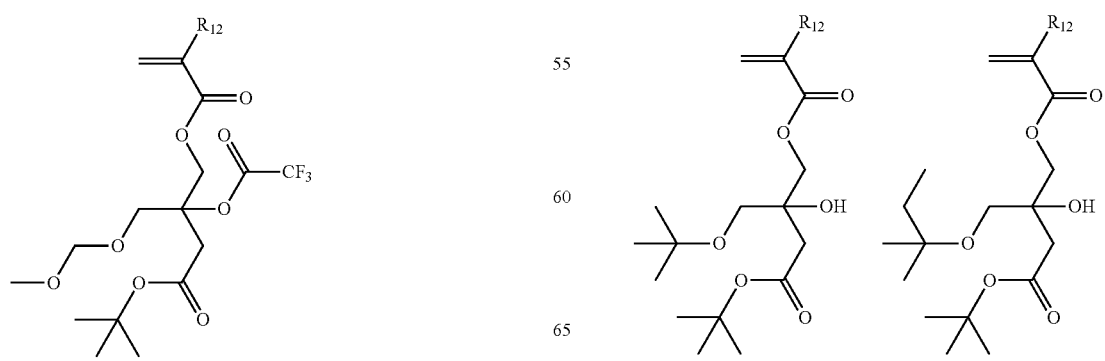

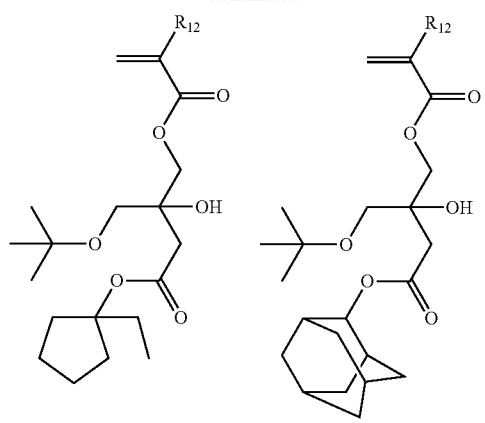
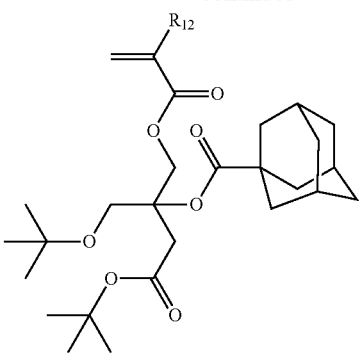
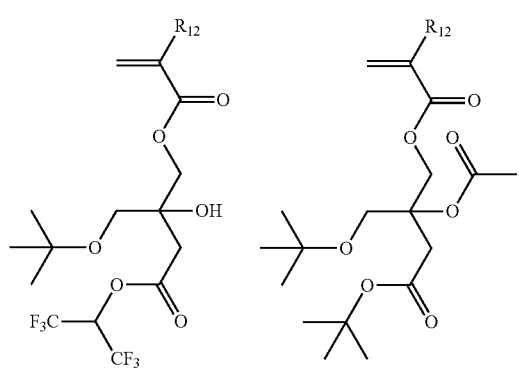
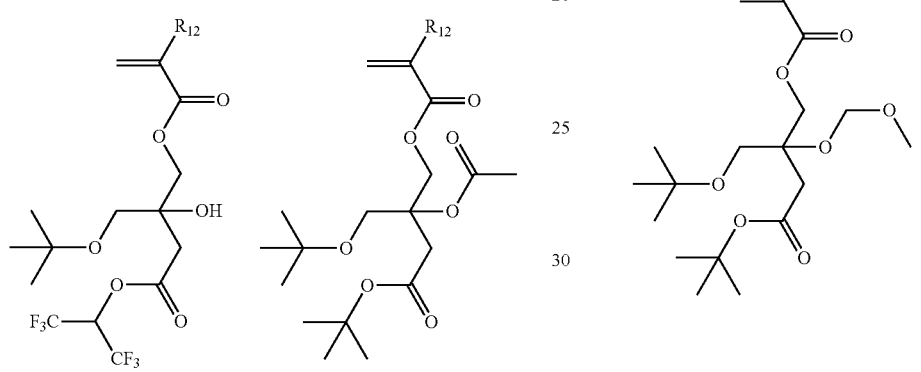
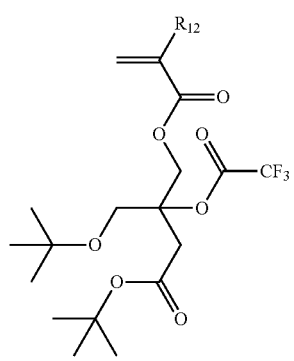
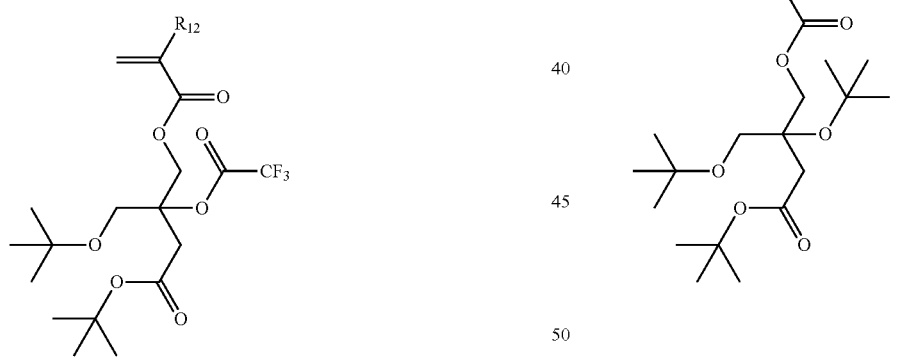
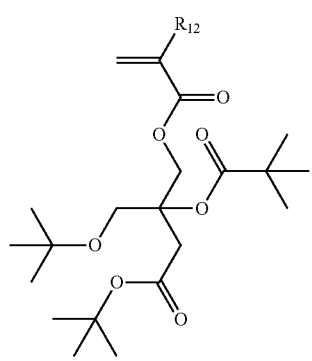
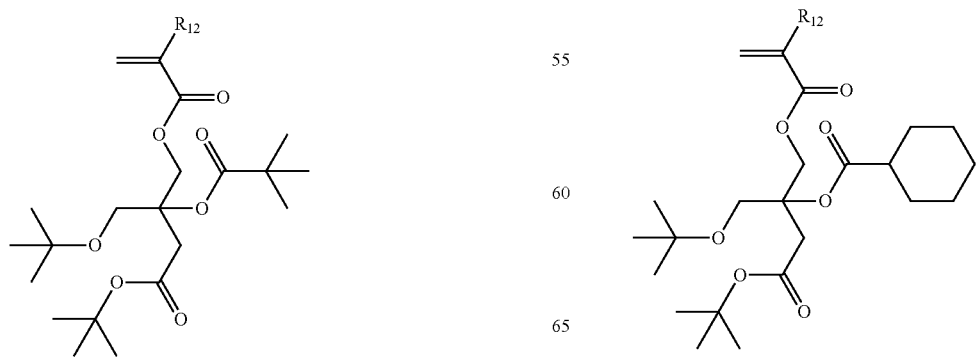

59
-continued
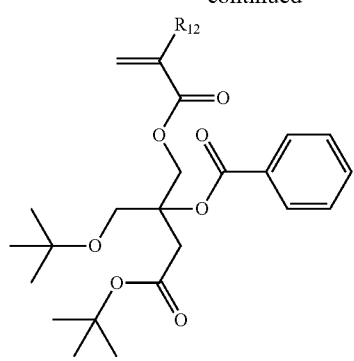
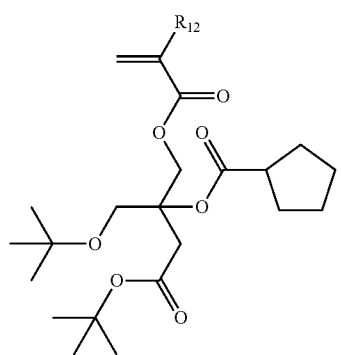
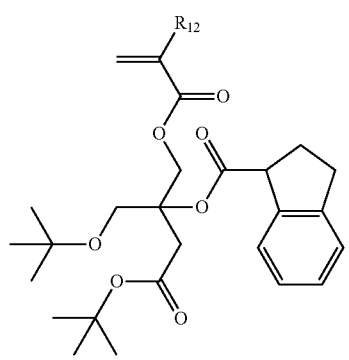
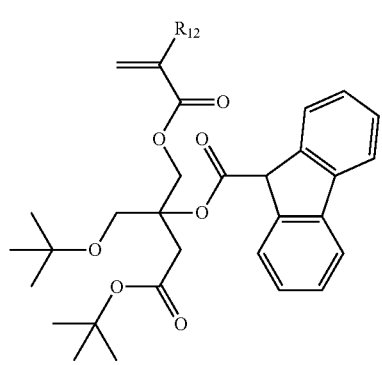
60
-continued
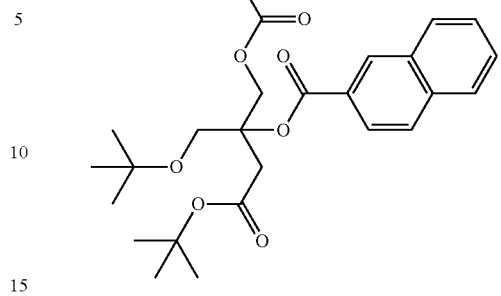
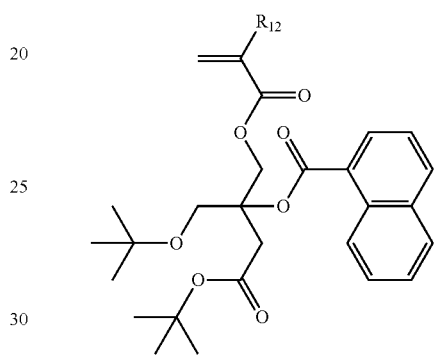
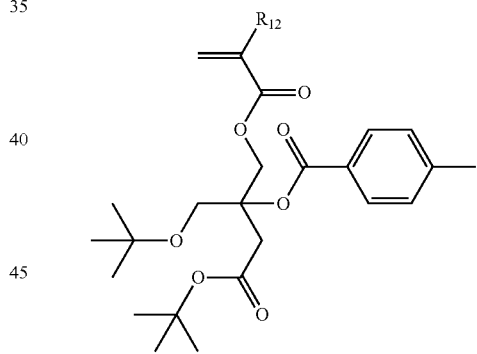
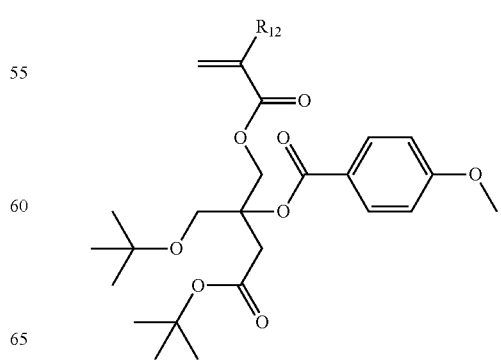

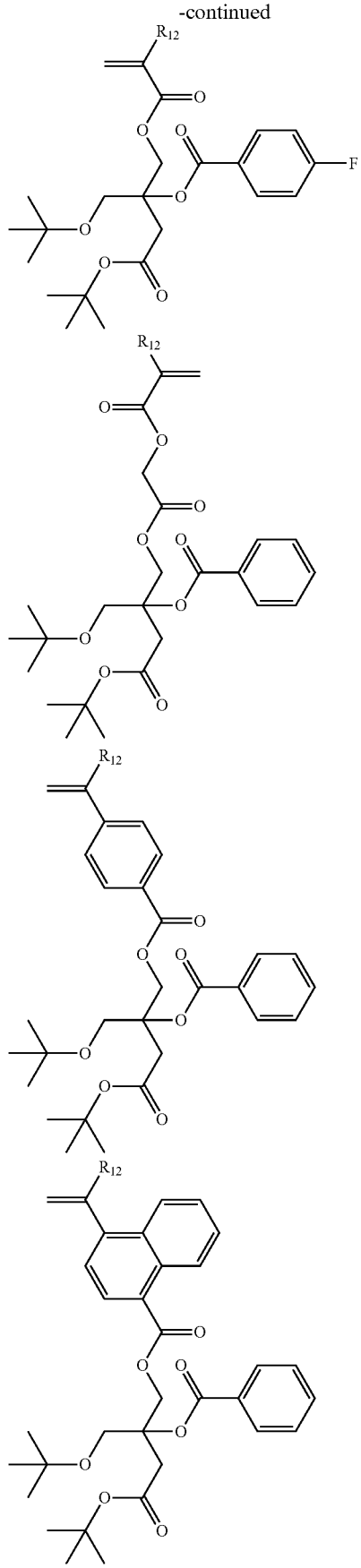
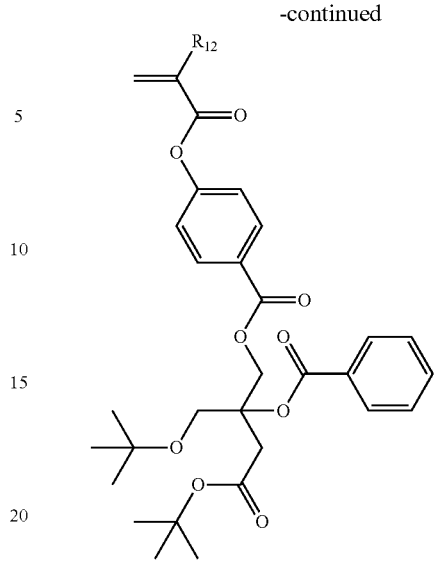
In formula (2), the recurring units (b1) and (b2) are derived from monomers Mb1 and Mb2, respectively.
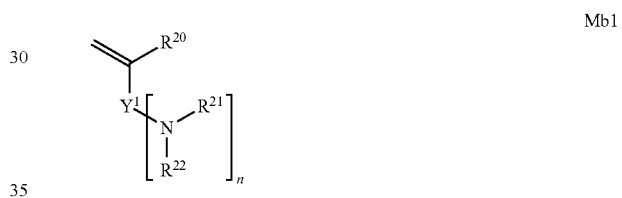
Mb1
Mb2
Herein $R^{20}$ to $R^{24}$, $Y^1$, $Y^2$, n and p are as defined above.
Examples of the structure of the monomer Mb1 wherein $Y^1$ is a variant are illustrated below. $R^{20}$, $R^{21}$ and $R^{22}$ are as defined above.
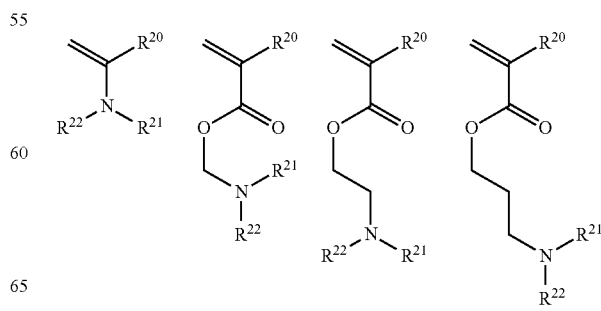

-continued
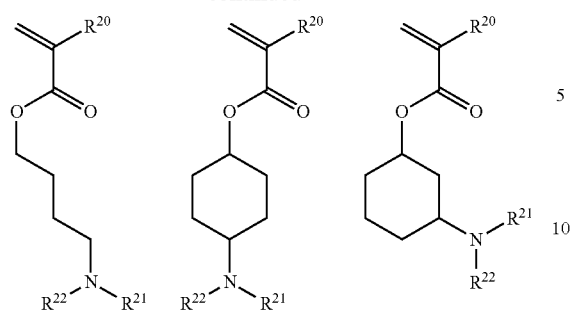
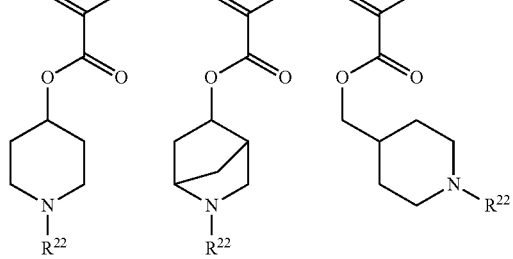
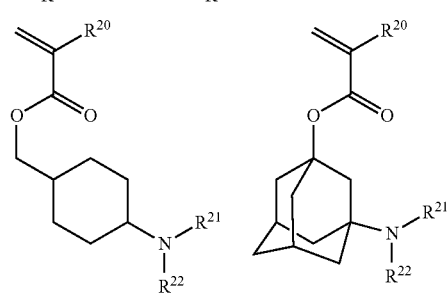
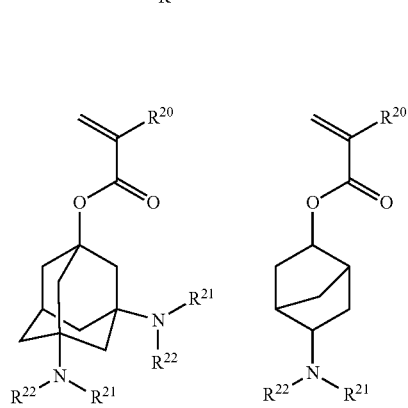
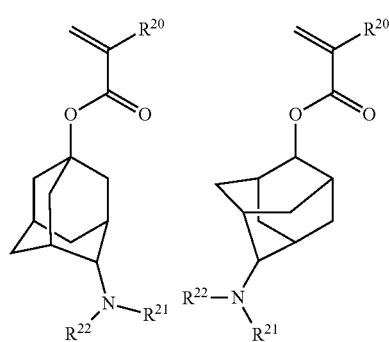
-continued
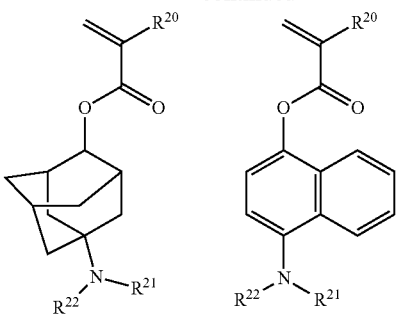
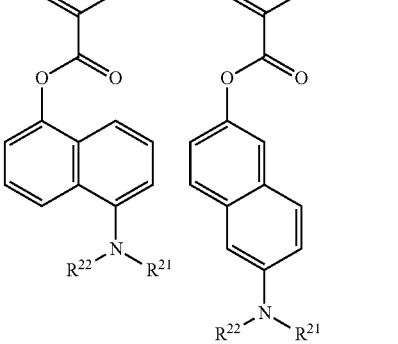
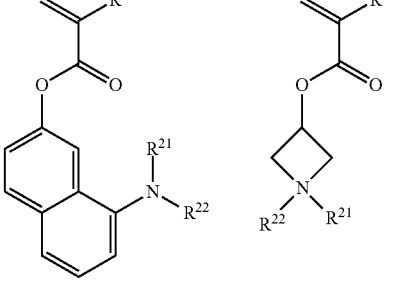
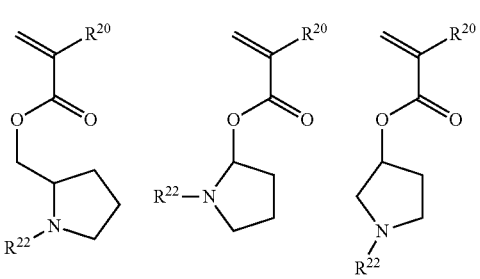
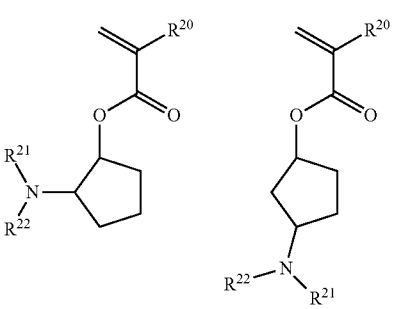

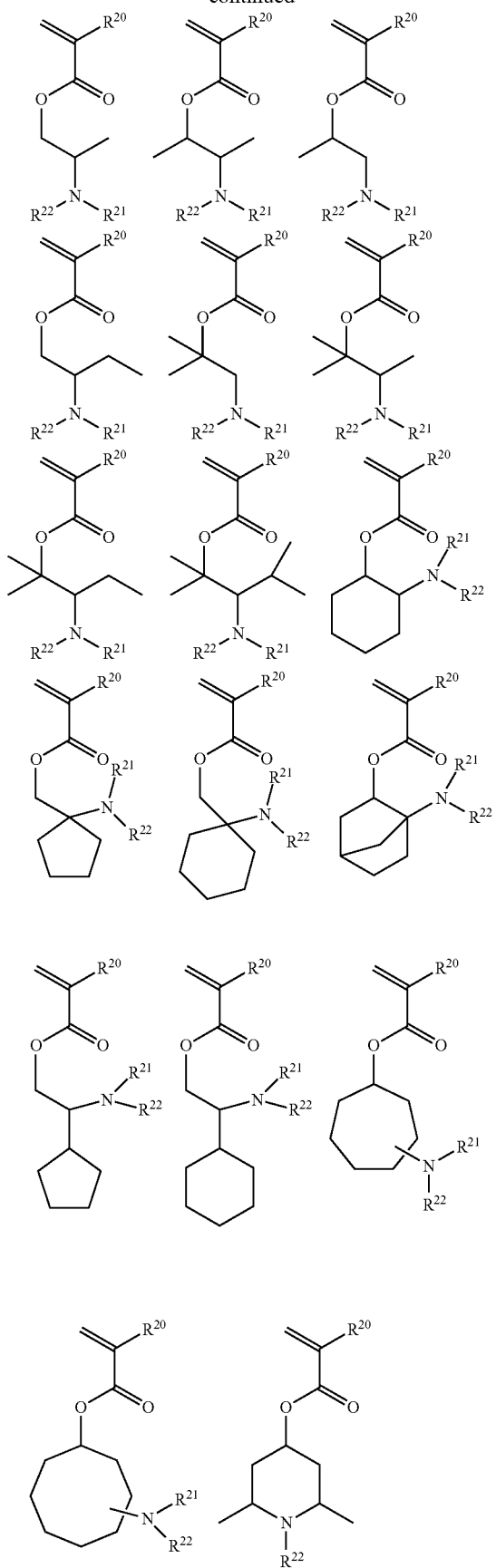
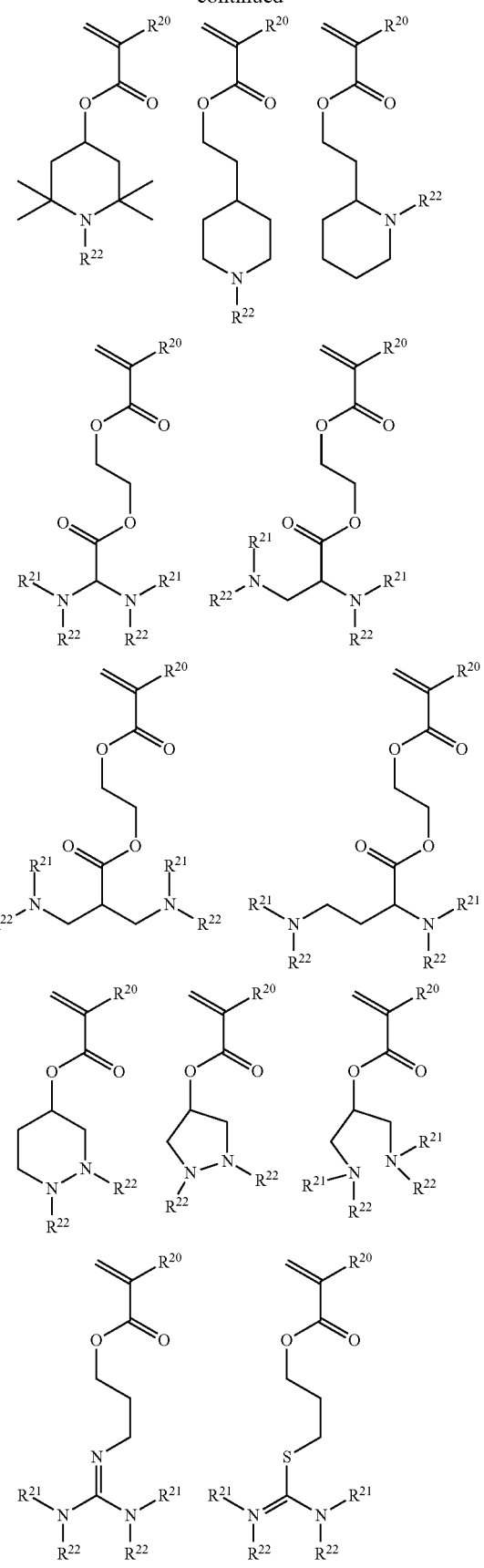

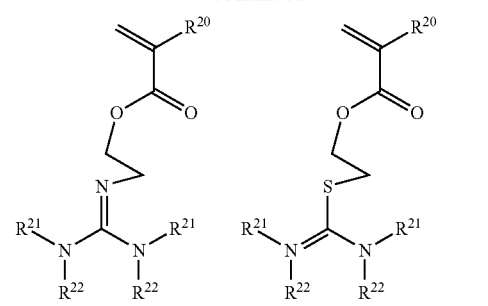
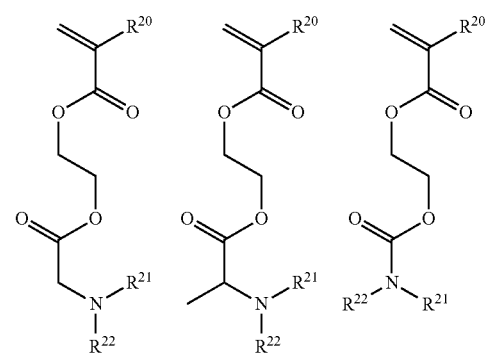
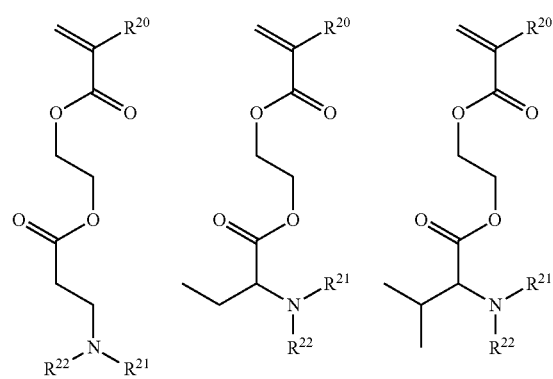
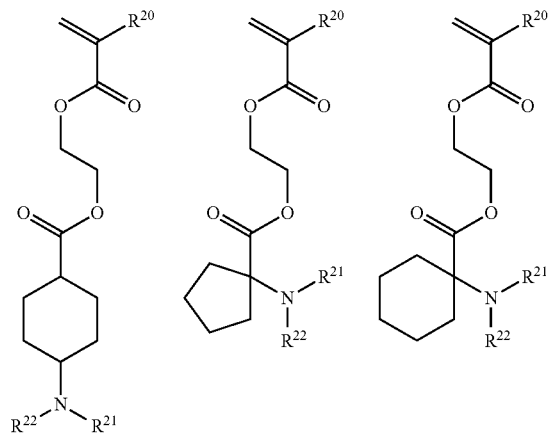
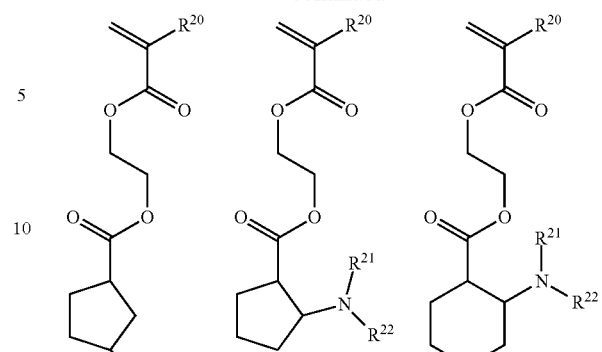
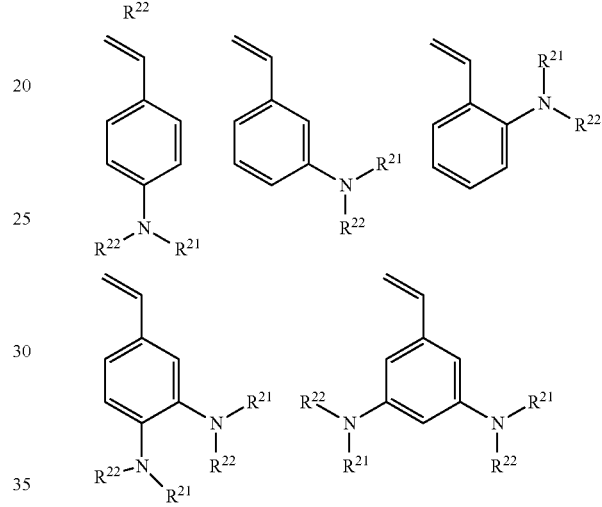
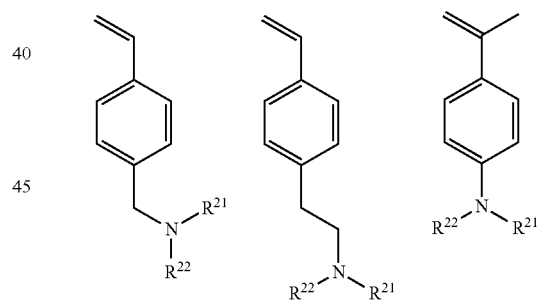
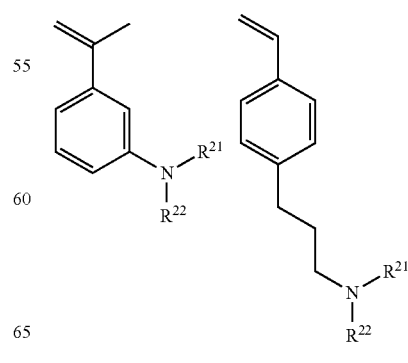

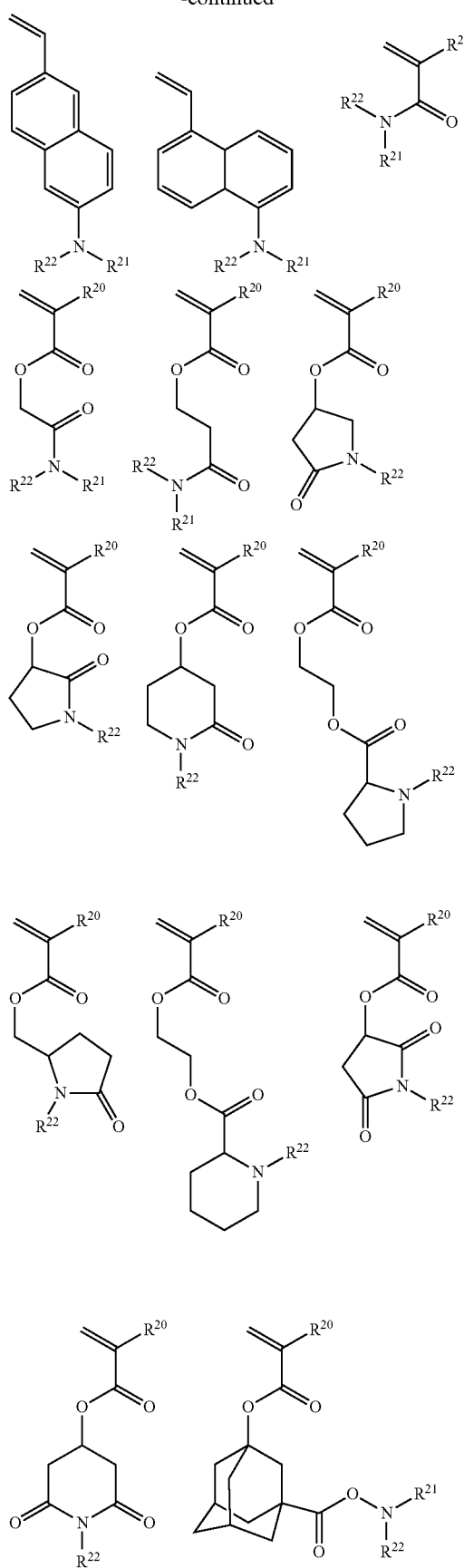
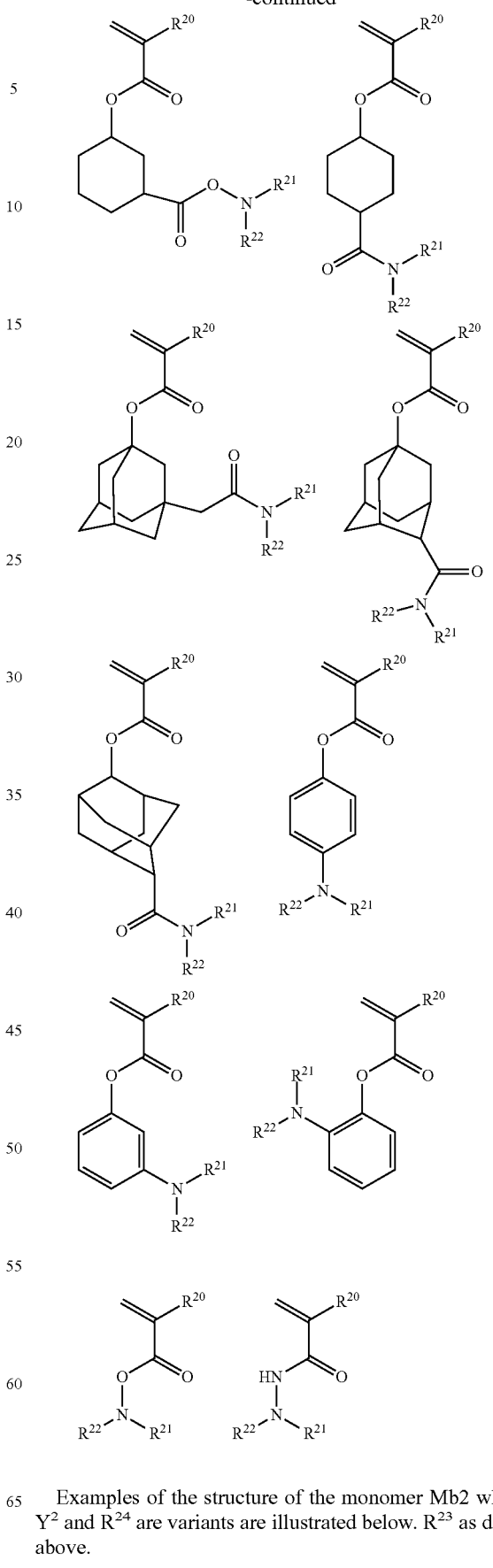
Examples of the structure of the monomer Mb2 wherein $Y^2$ and $R^{24}$ are variants are illustrated below. $R^{23}$ as defined above.

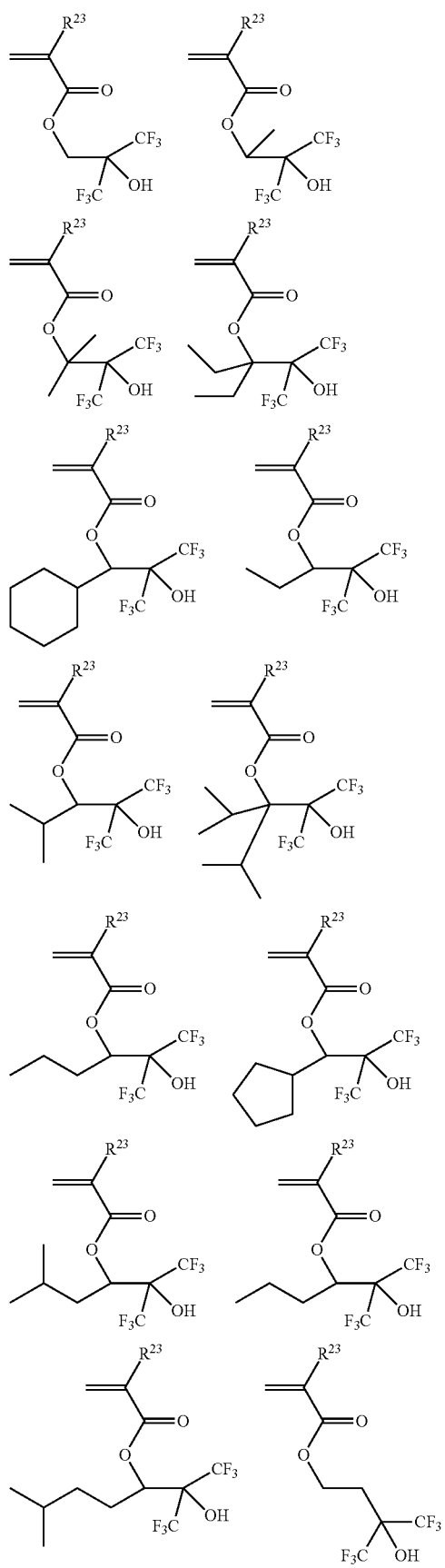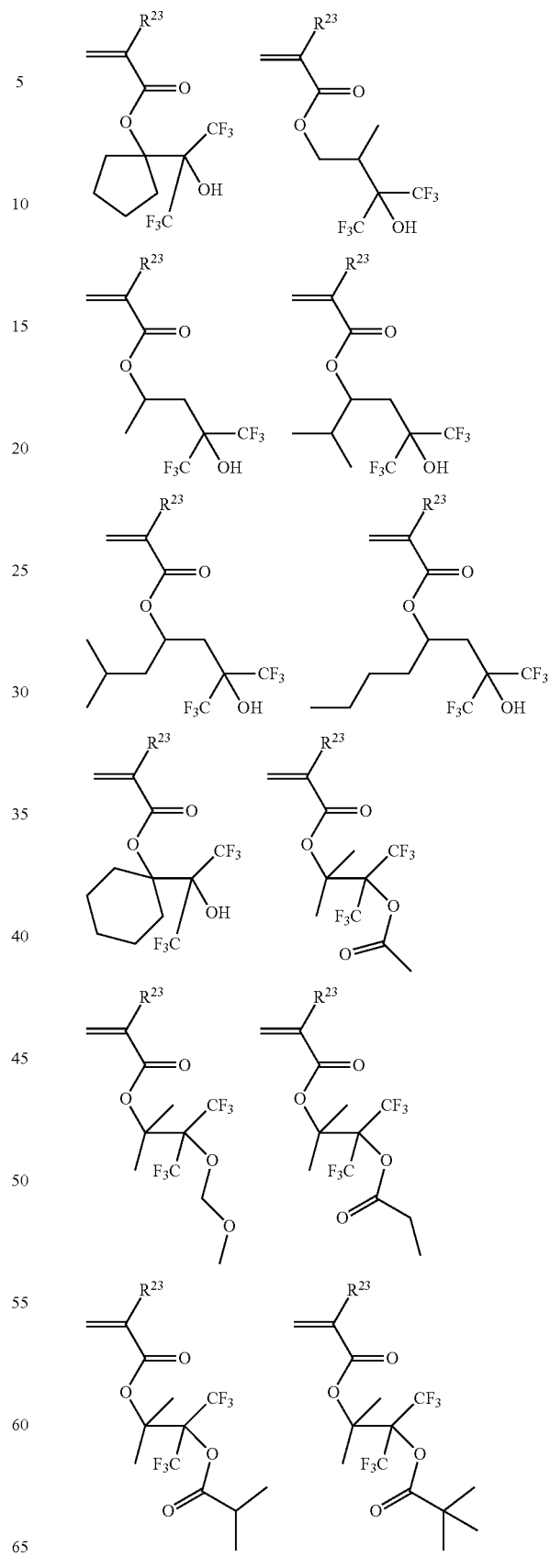
-continued

73
-continued
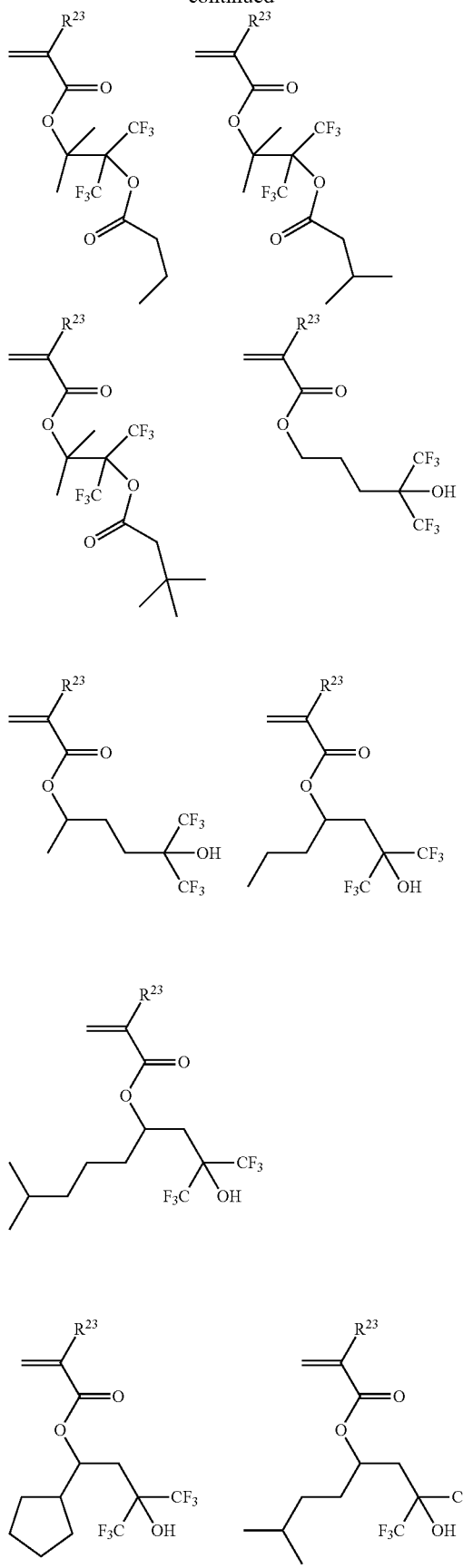
74
-continued
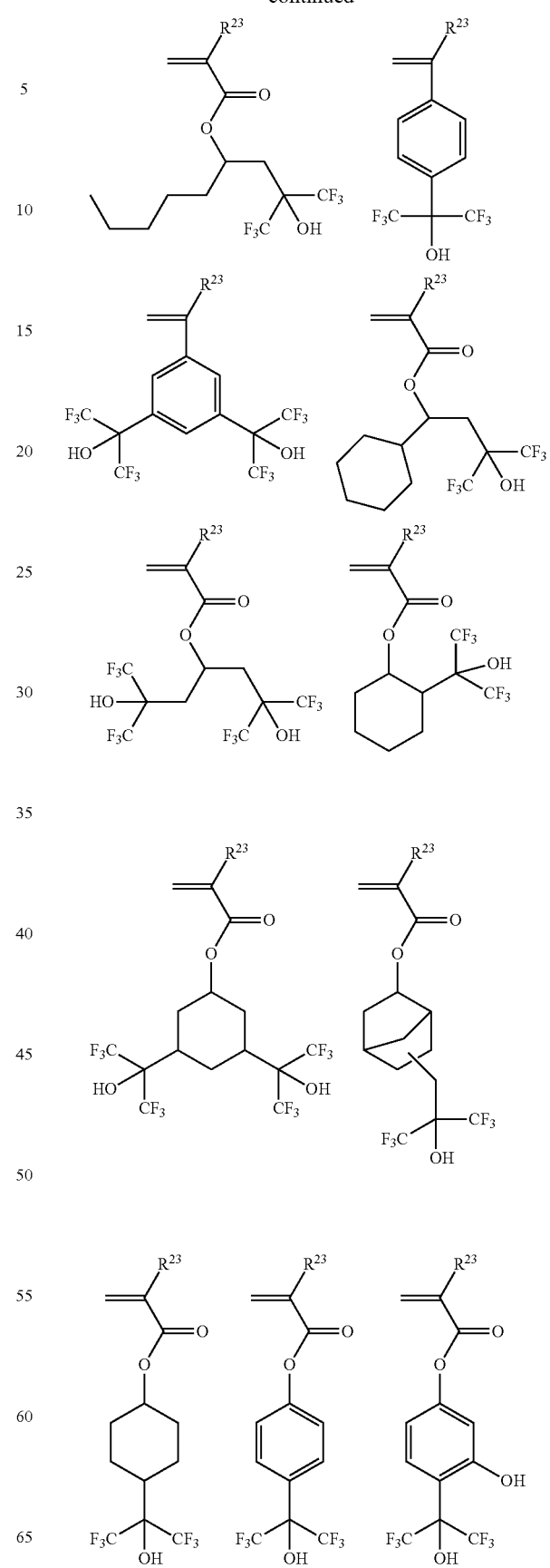

75
-continued
76
-continued
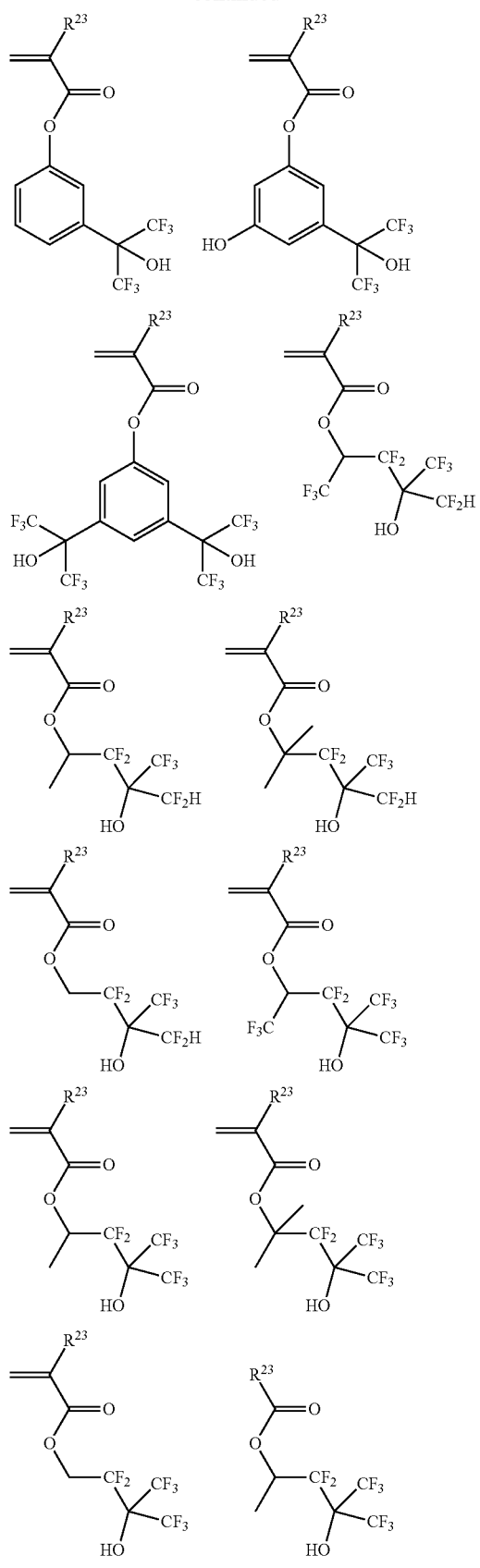
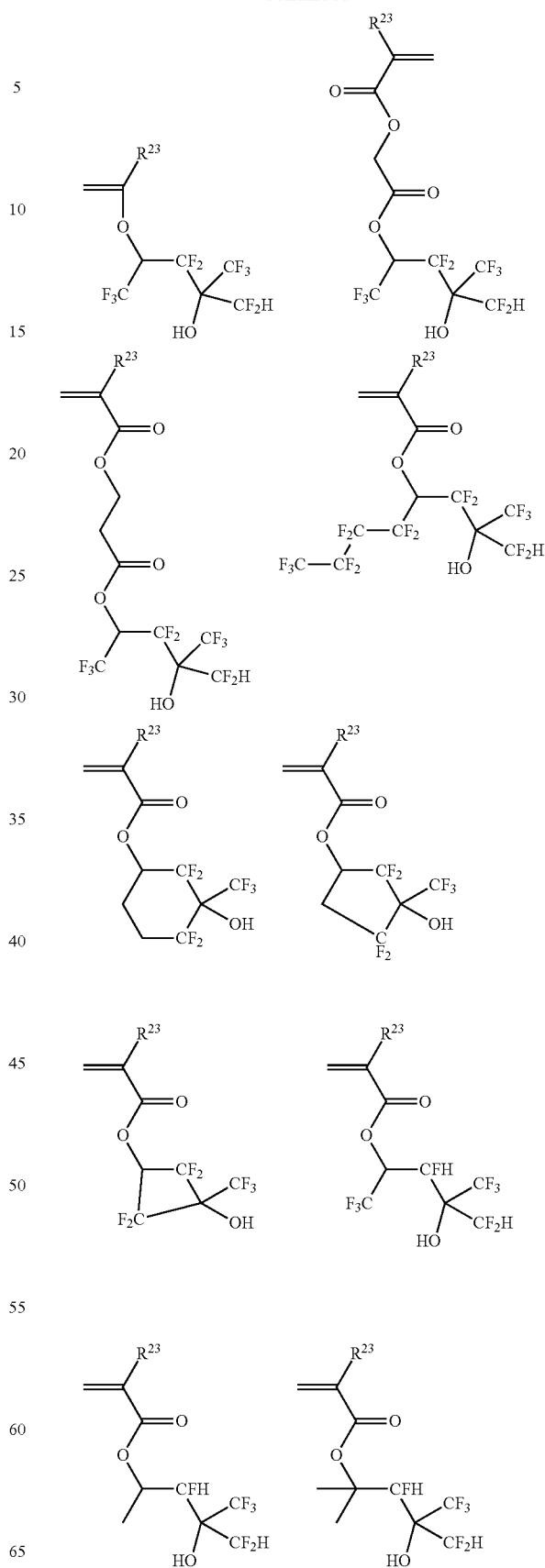

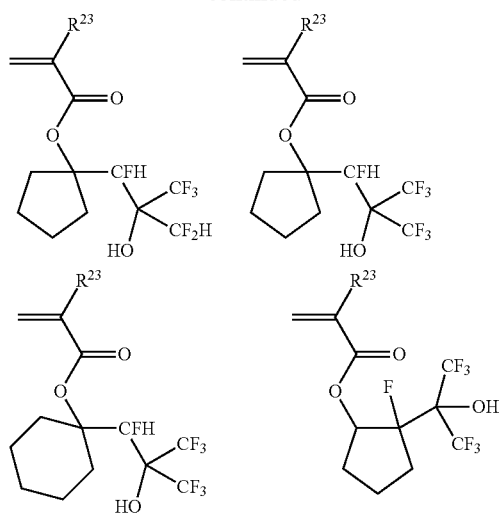
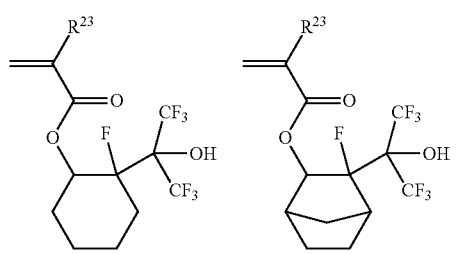
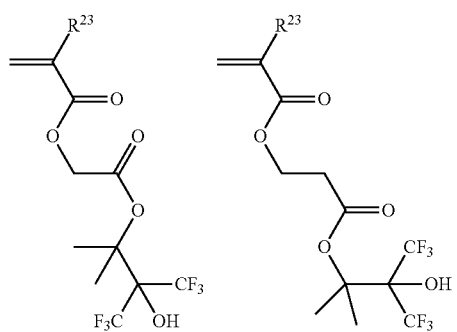
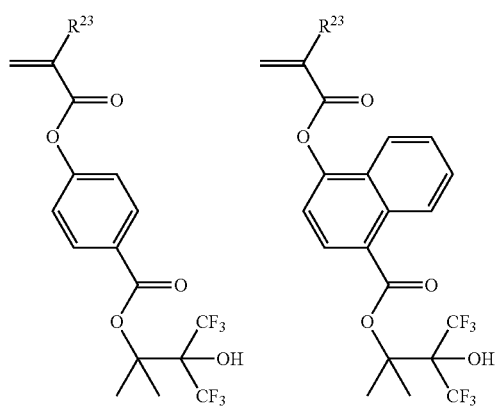
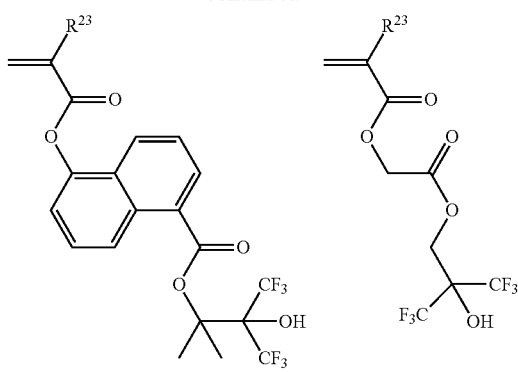
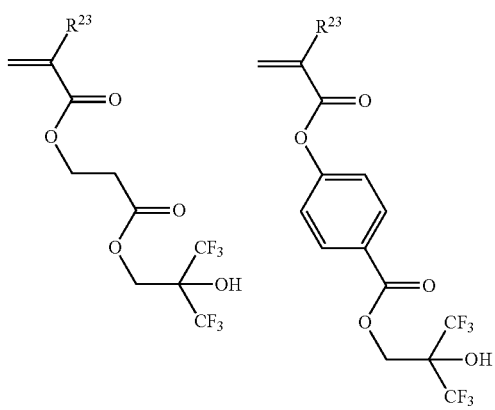
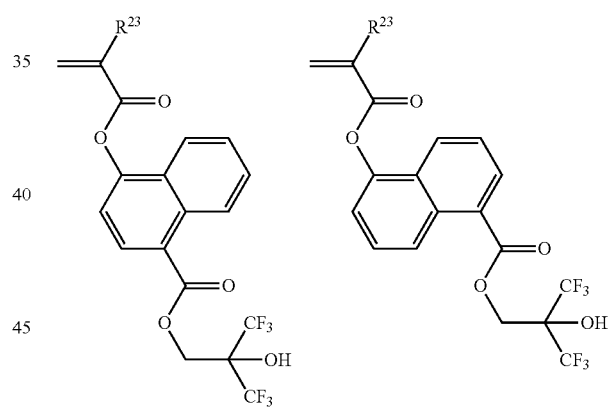
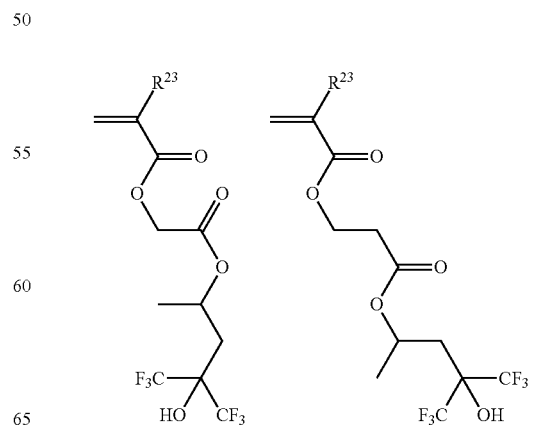

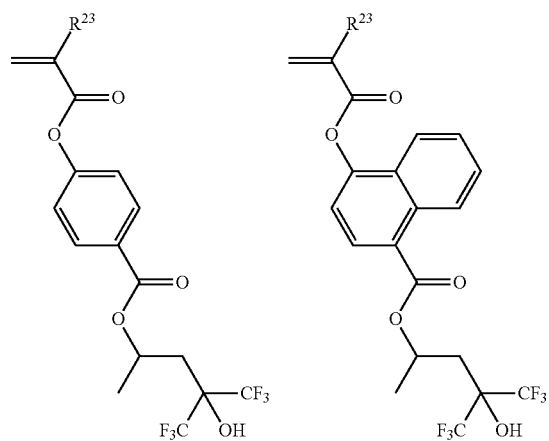
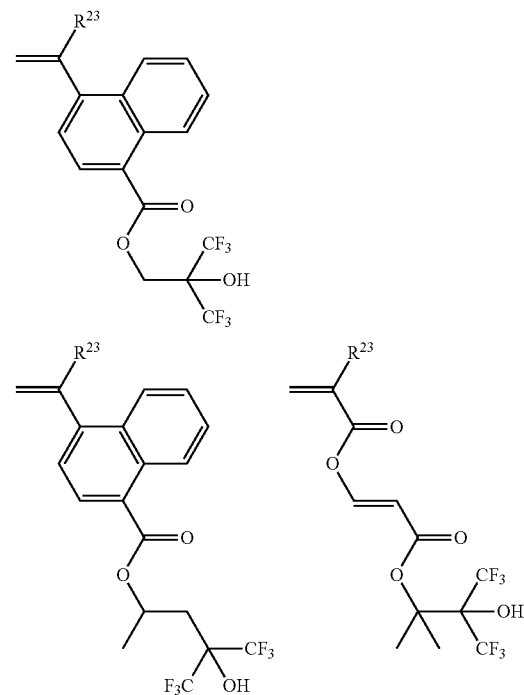
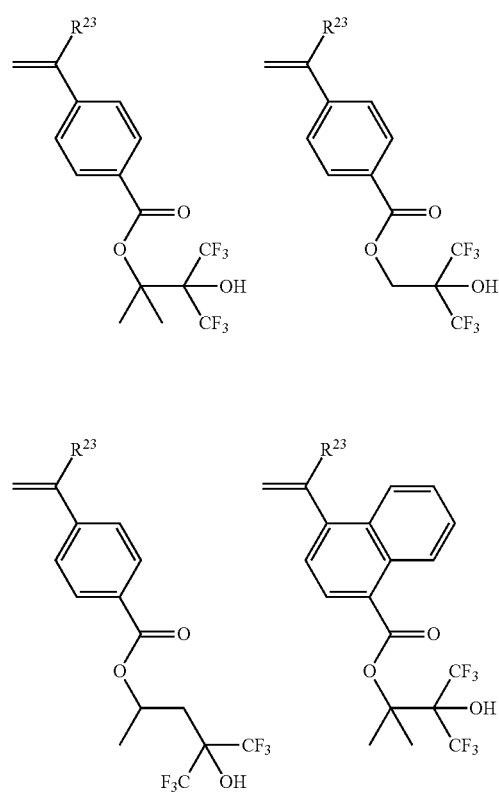

-continued
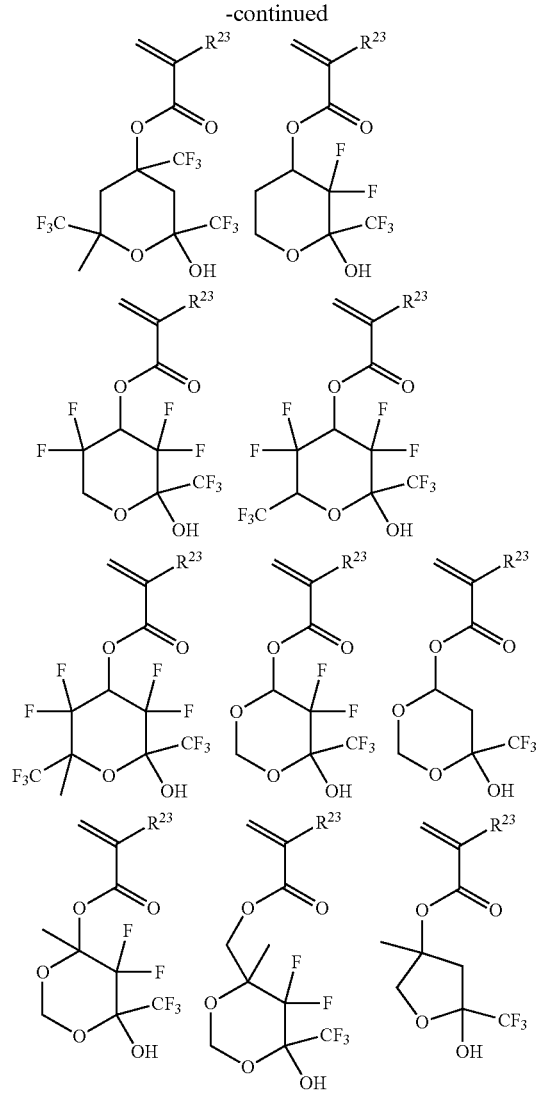
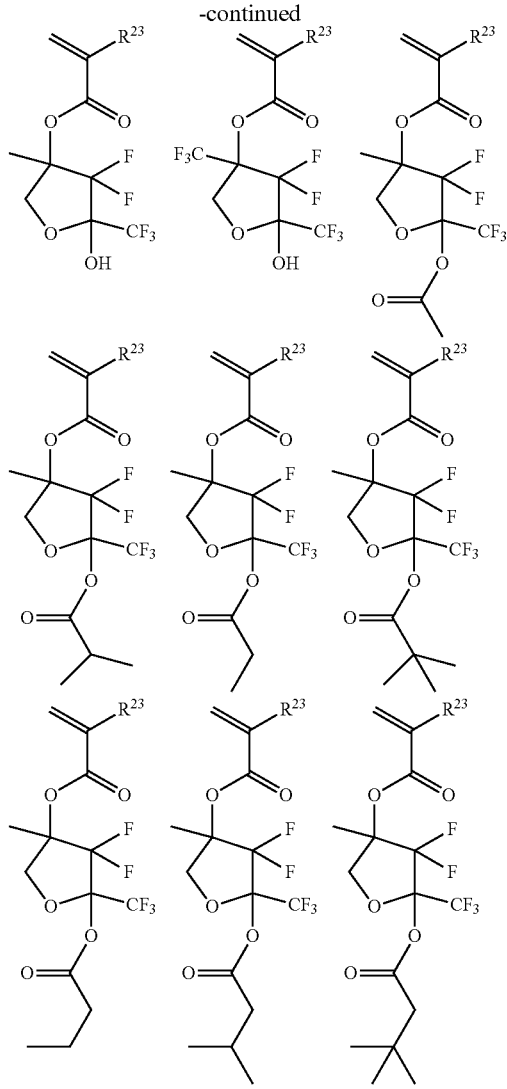
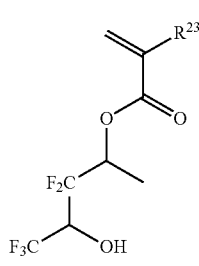
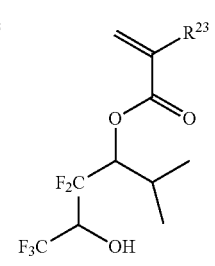
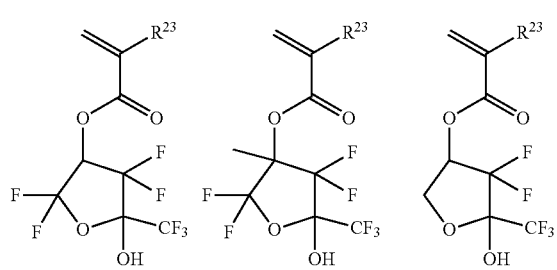

-continued
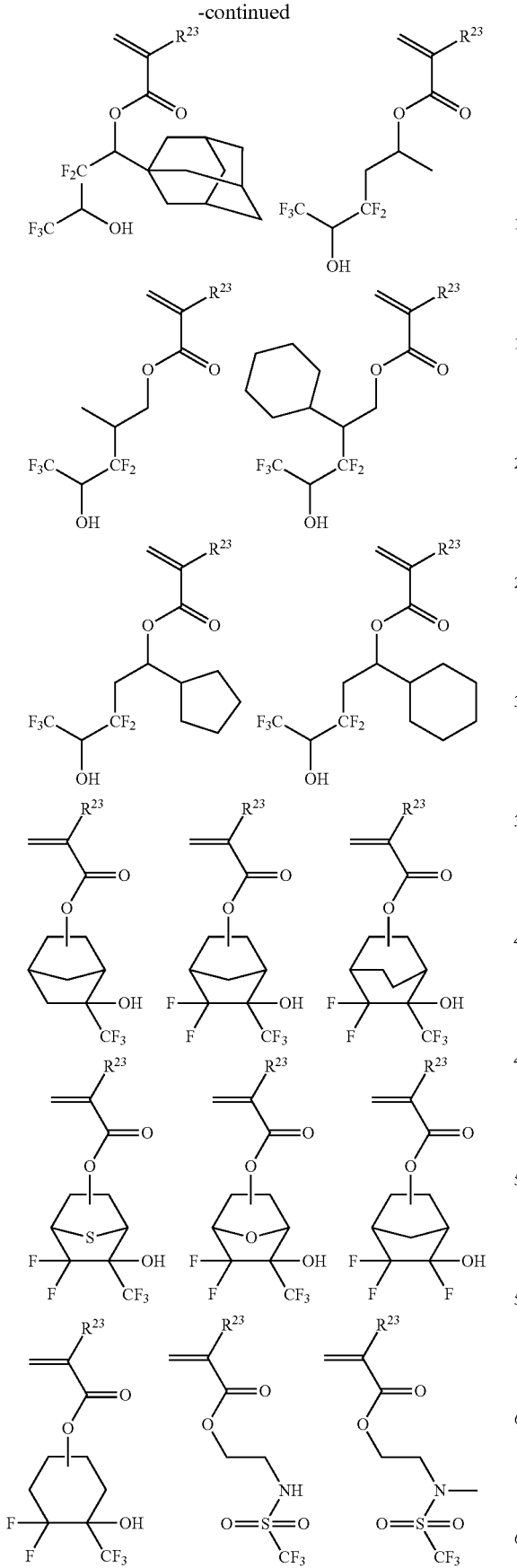
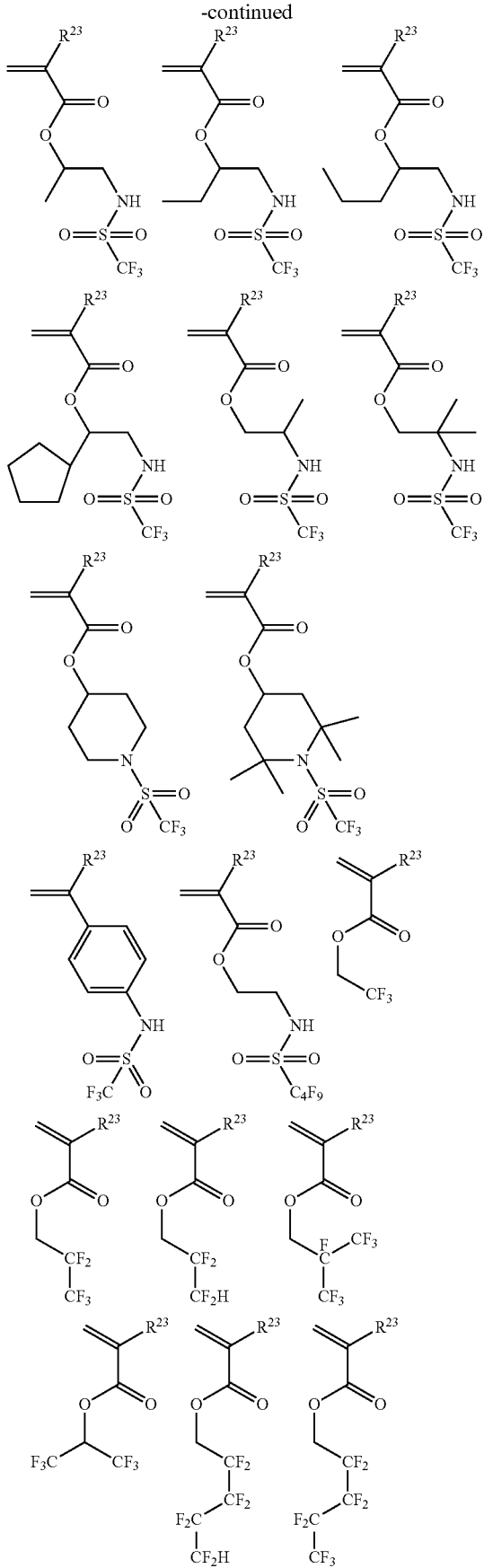

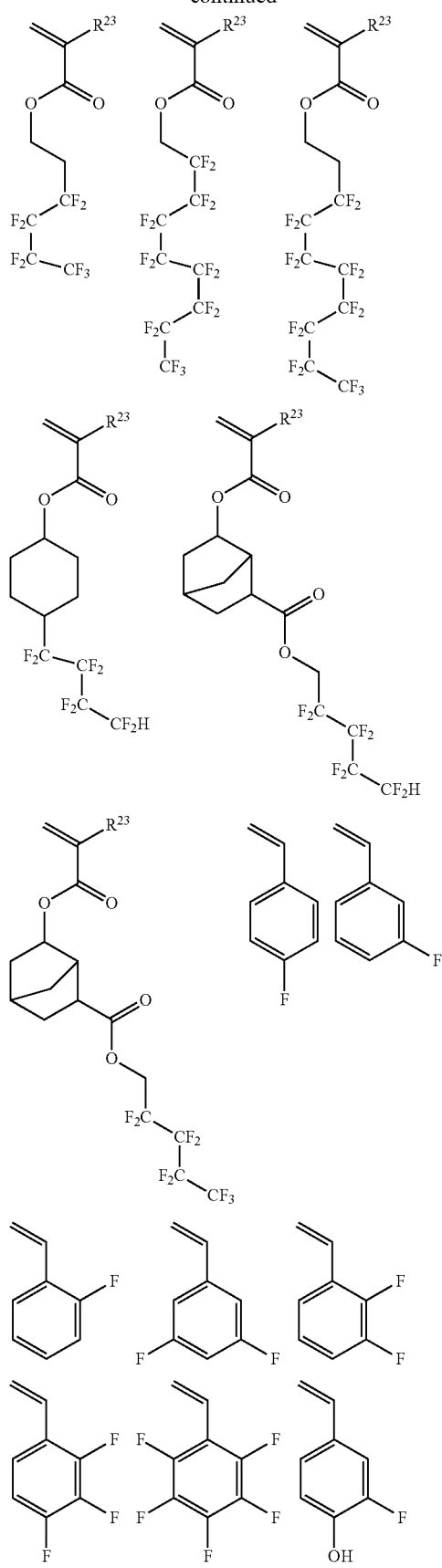
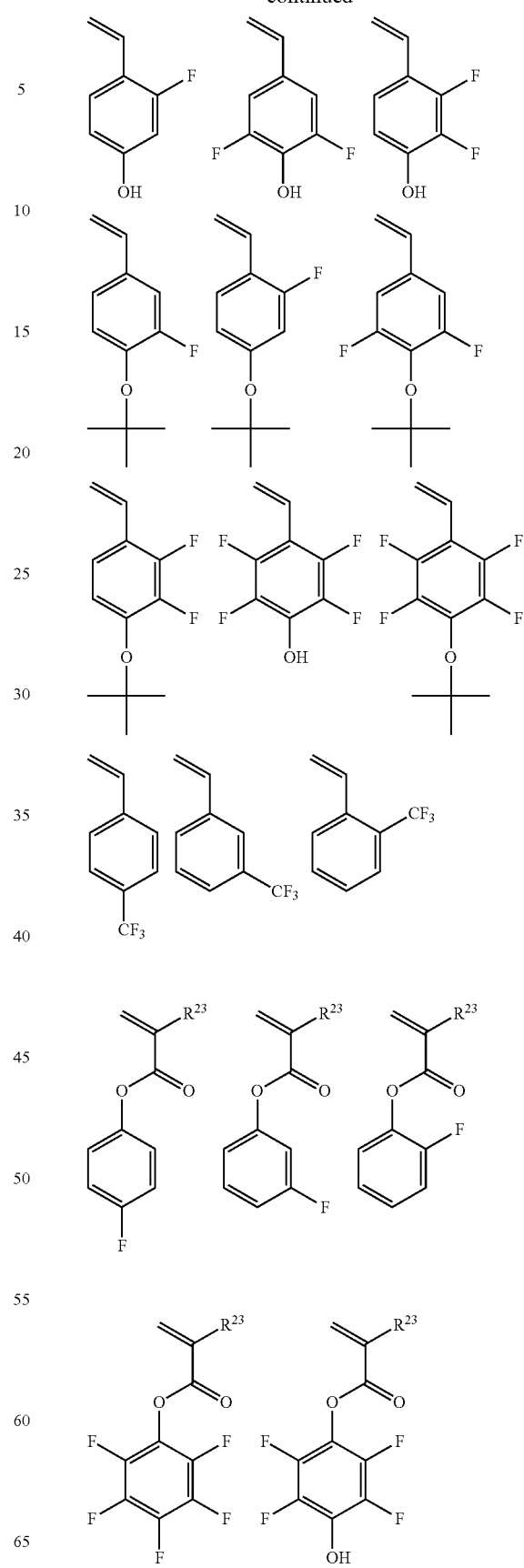

-continued

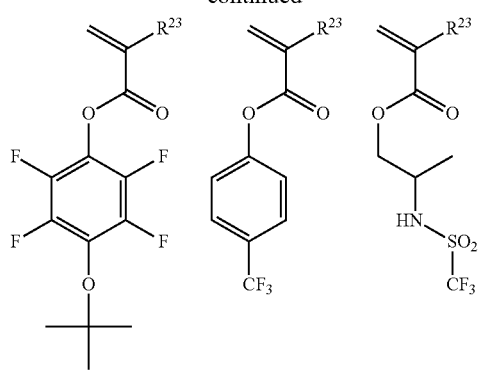

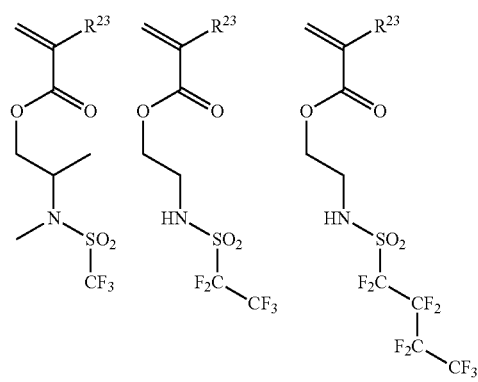

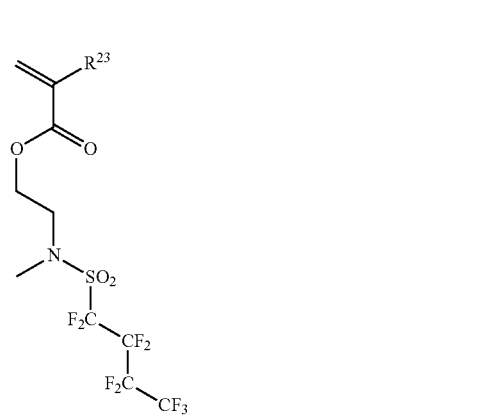

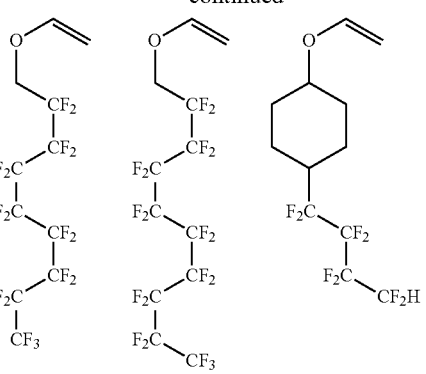

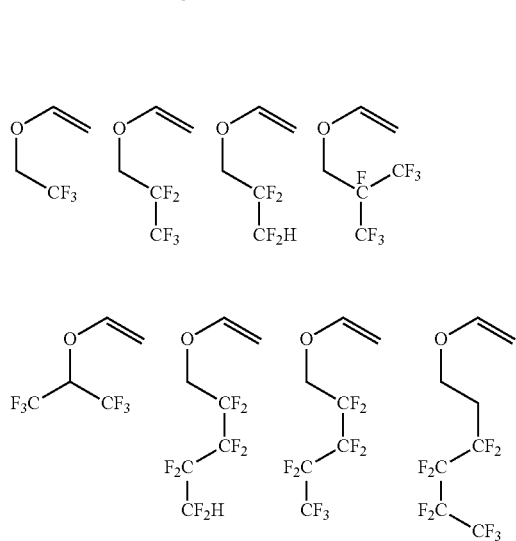

-continued

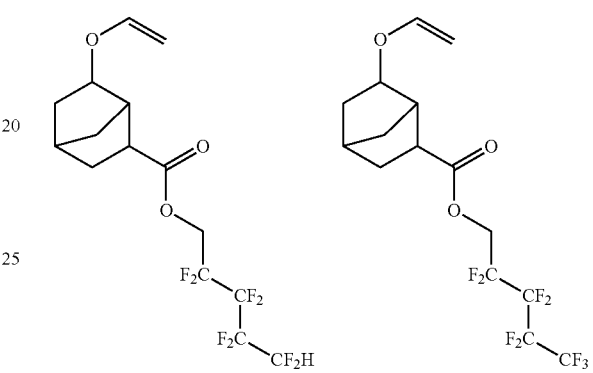

The first polymer comprising recurring units (a1) to (a4) having formula (1) for the shrink agent, the second polymer comprising recurring units (b1) and (b2) having formula (2) for the shrink agent, and the resist polymer comprising recurring units (a5) having formula (3) each may further comprise recurring units (c) having a hydroxyl, carboxyl, lactone ring, lactam ring, sultone ring, sulfone, sulfonic acid ester, sulfonamide, carboxylic acid amide, nitro, cyano, thienyl, furyl, pyrrole, acid anhydride, imide, —NH—(C=O)—O—, —S—(C=O)—O—, or —ON(=O$_2$)—. Examples of the monomer from which recurring units (c) are derived are given below.

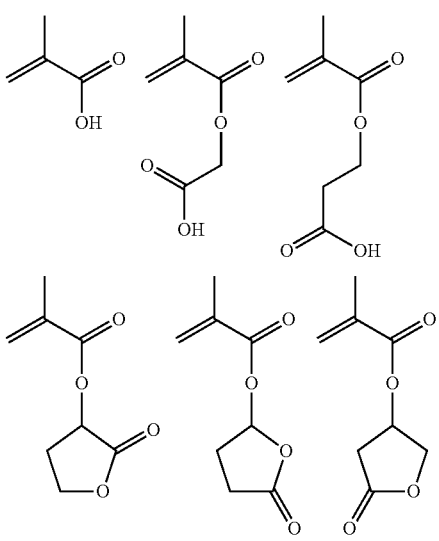

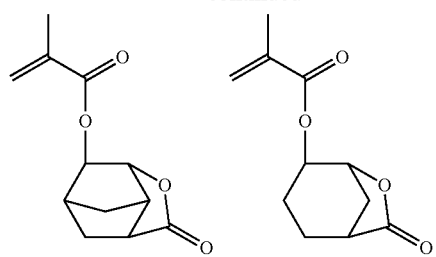
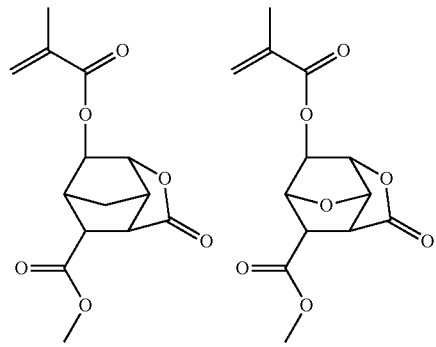
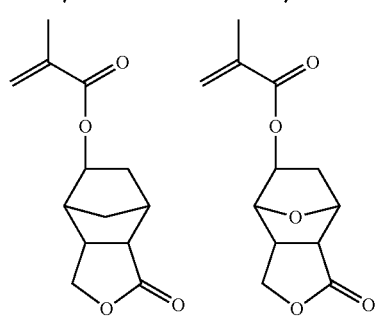
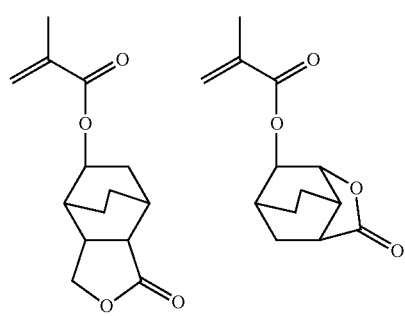
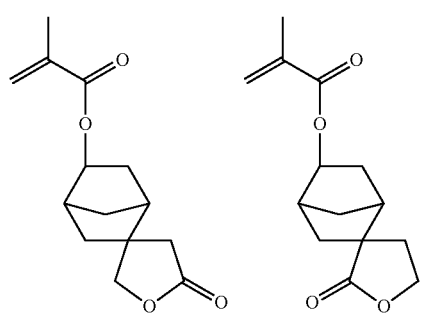
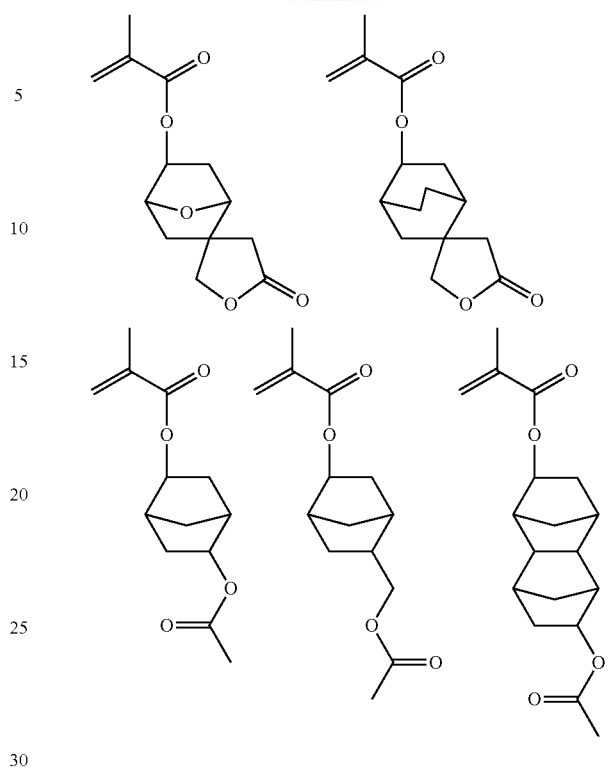
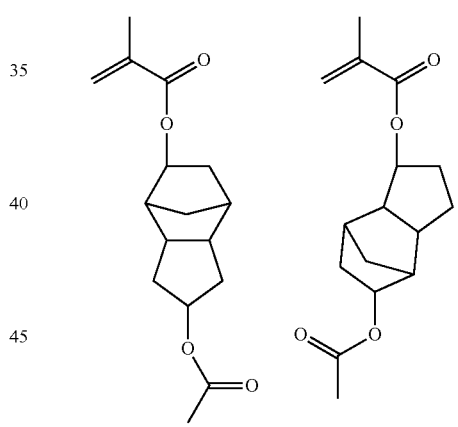
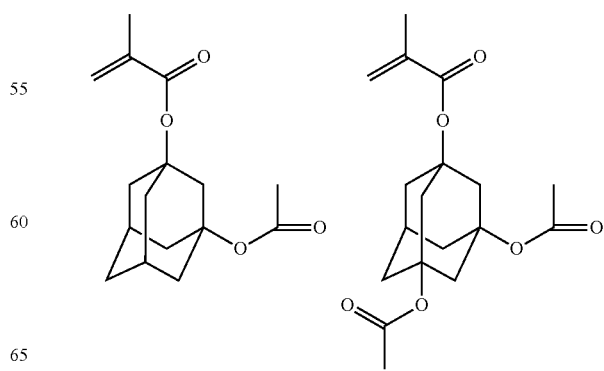

91
-continued
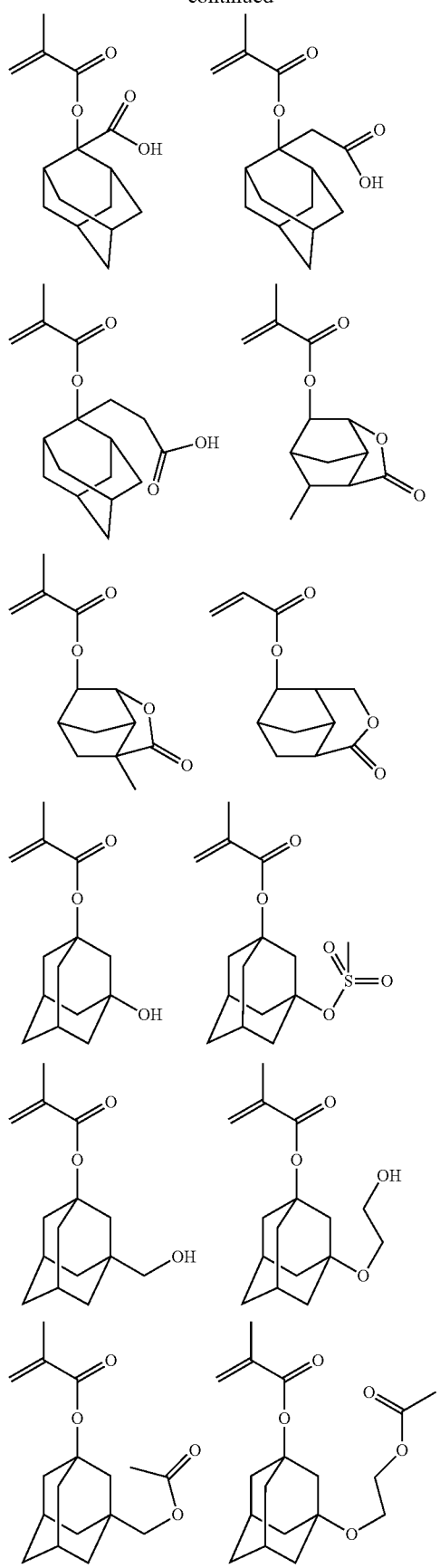
92
-continued
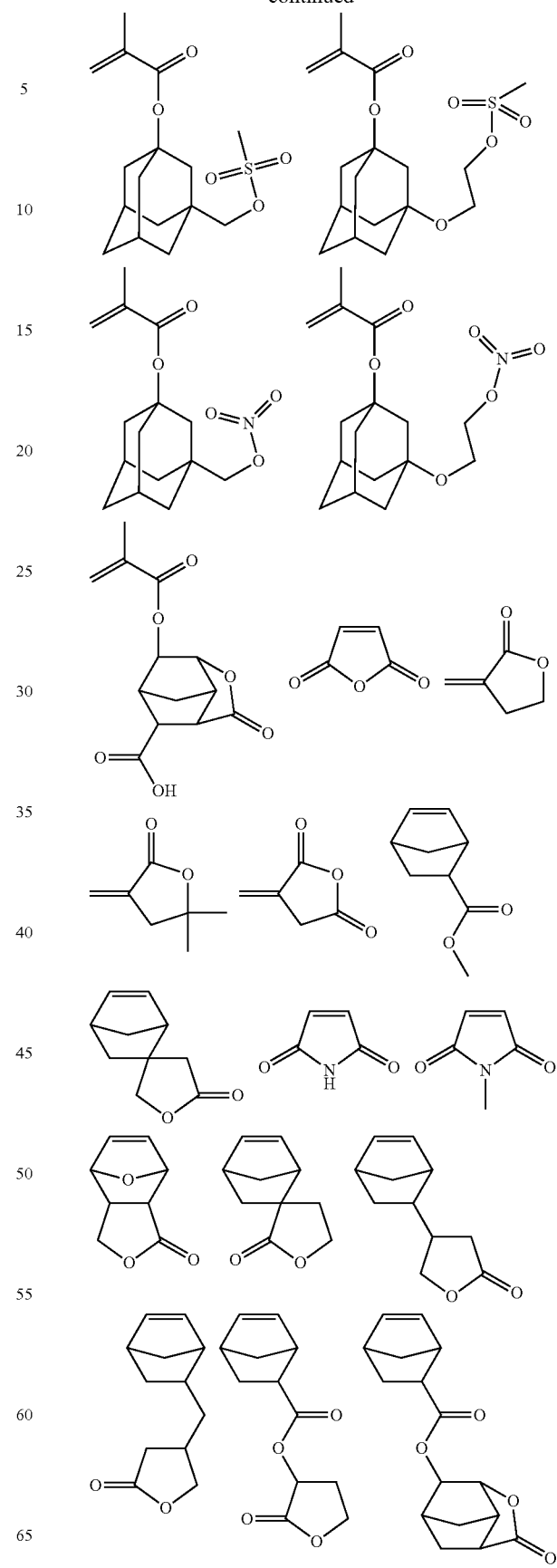

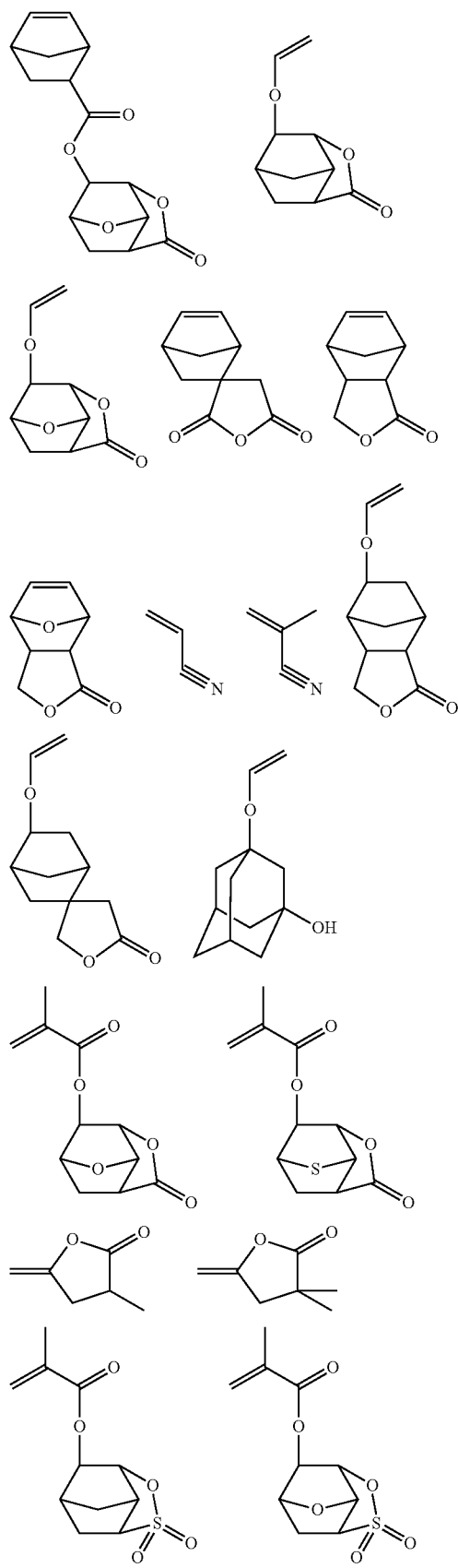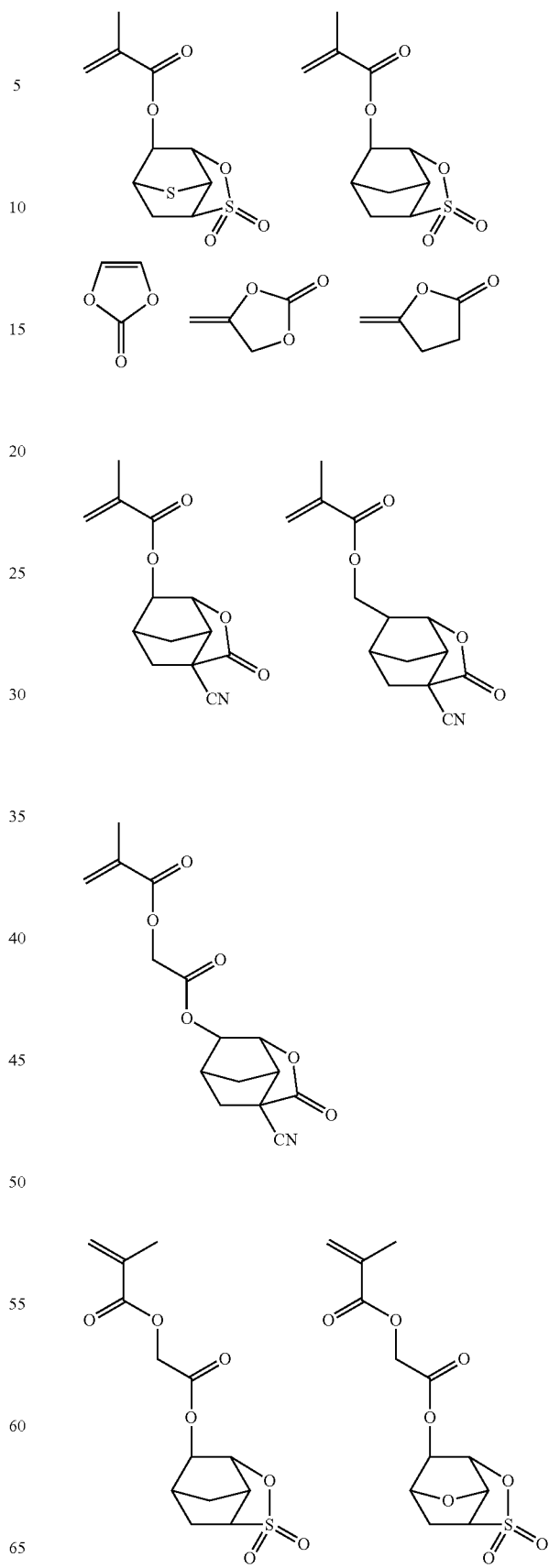

-continued
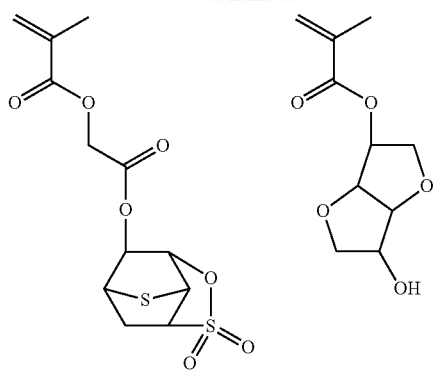
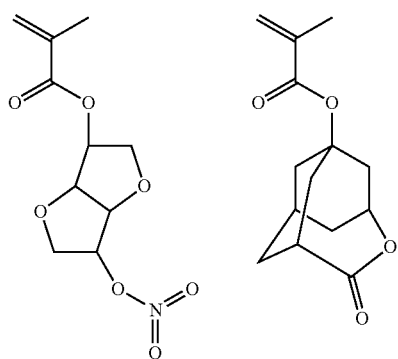
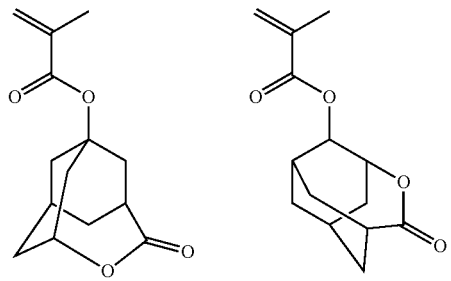
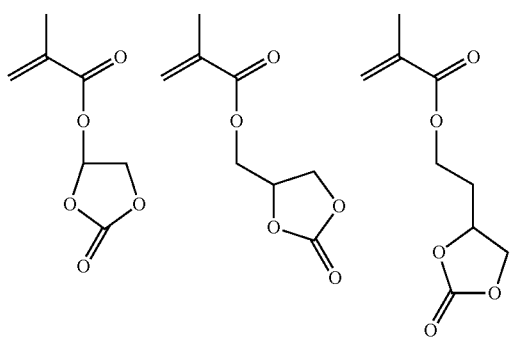
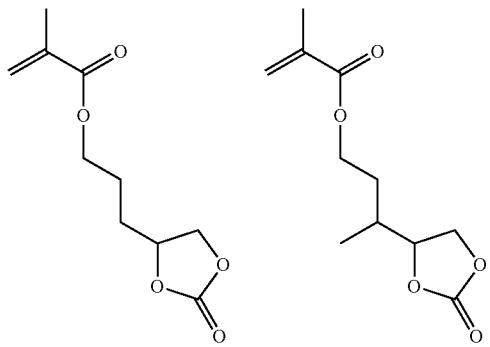
-continued
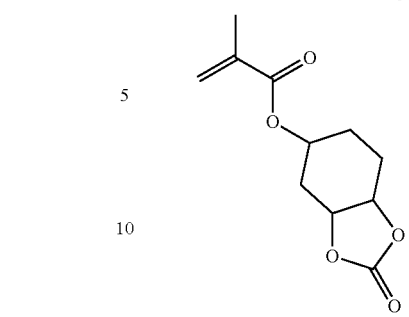
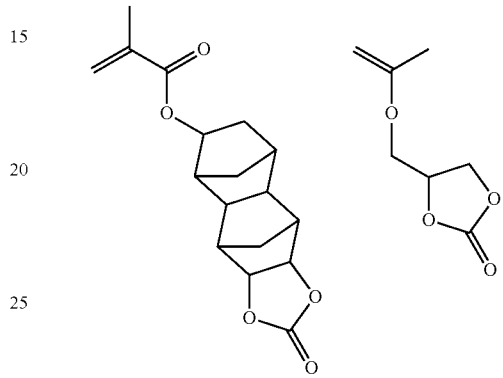
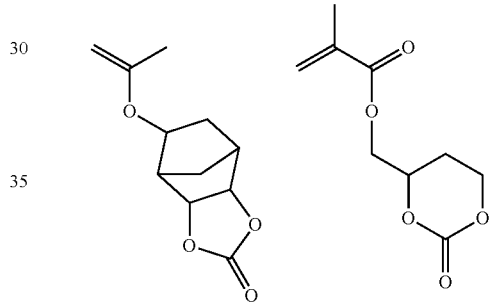
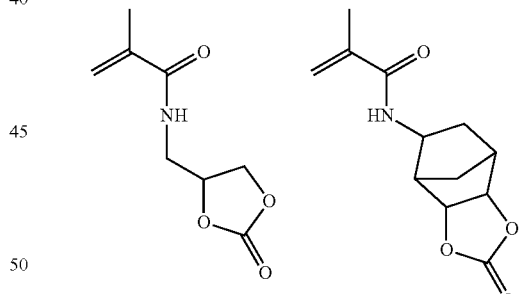
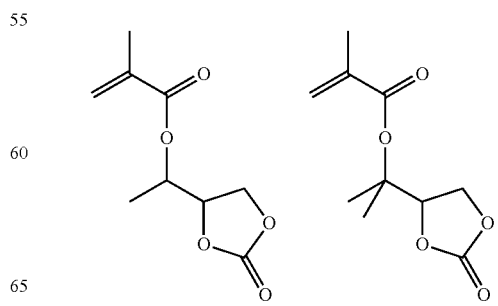

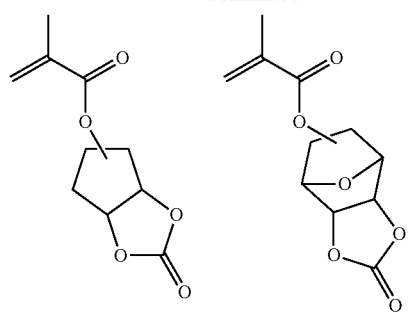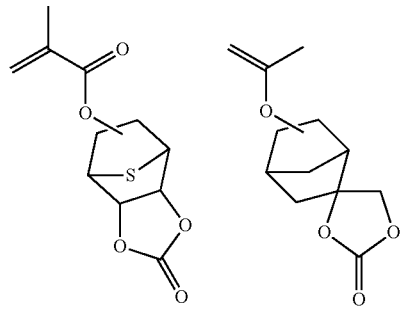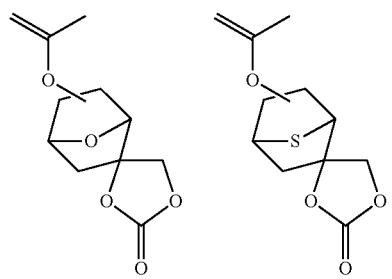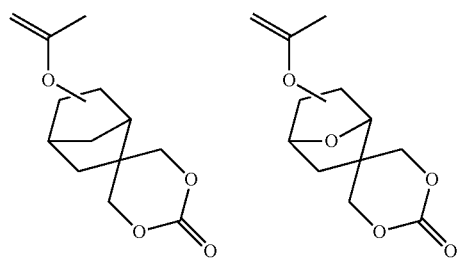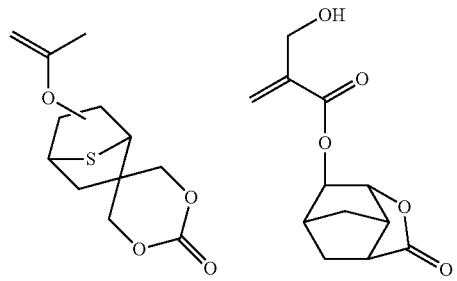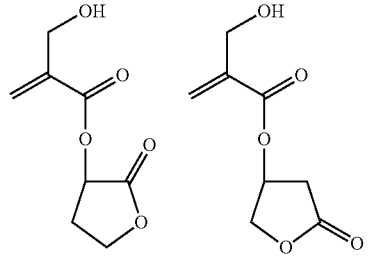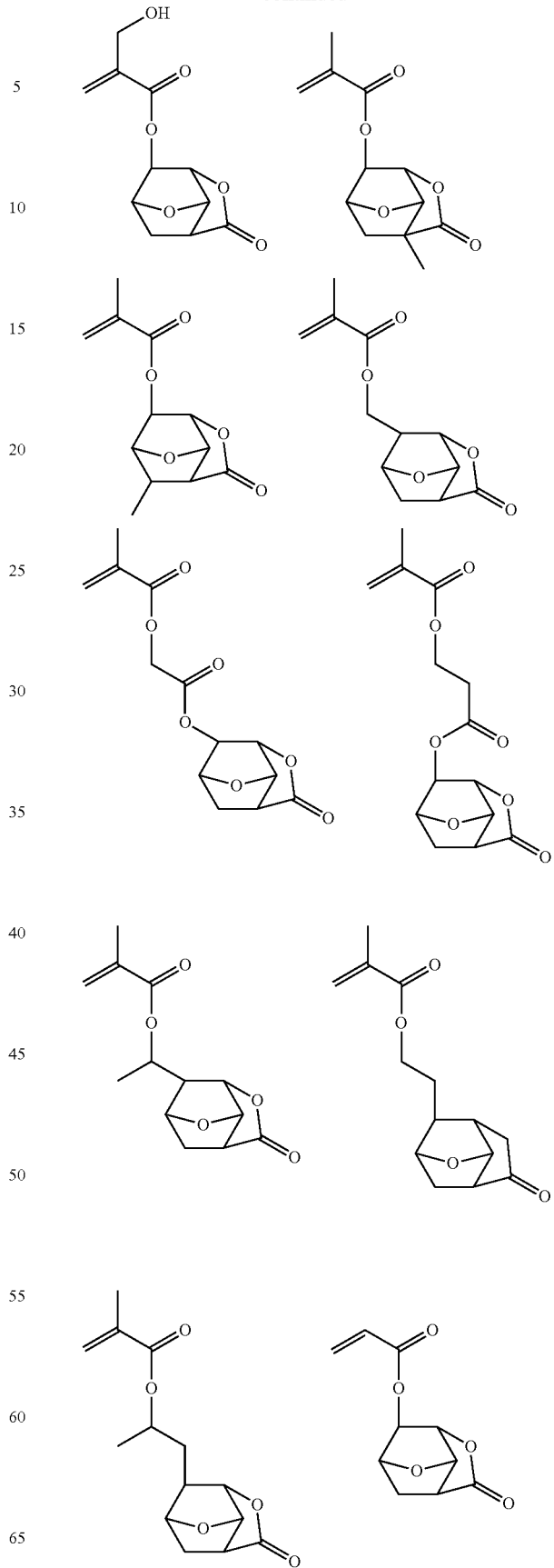

99
-continued
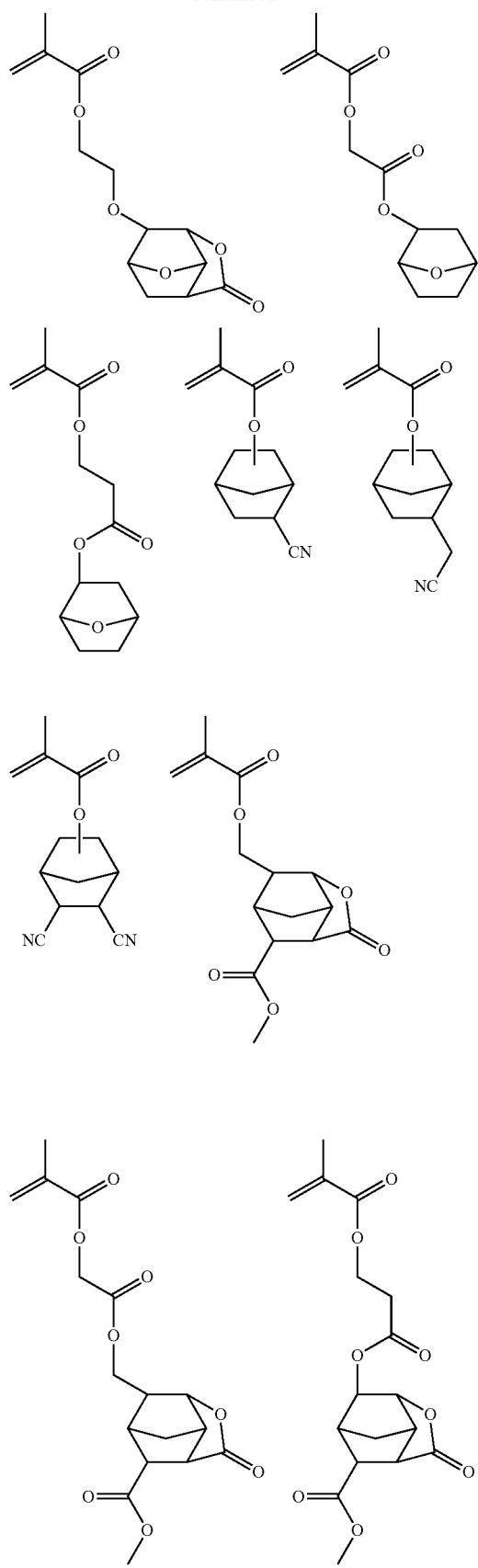
100
-continued
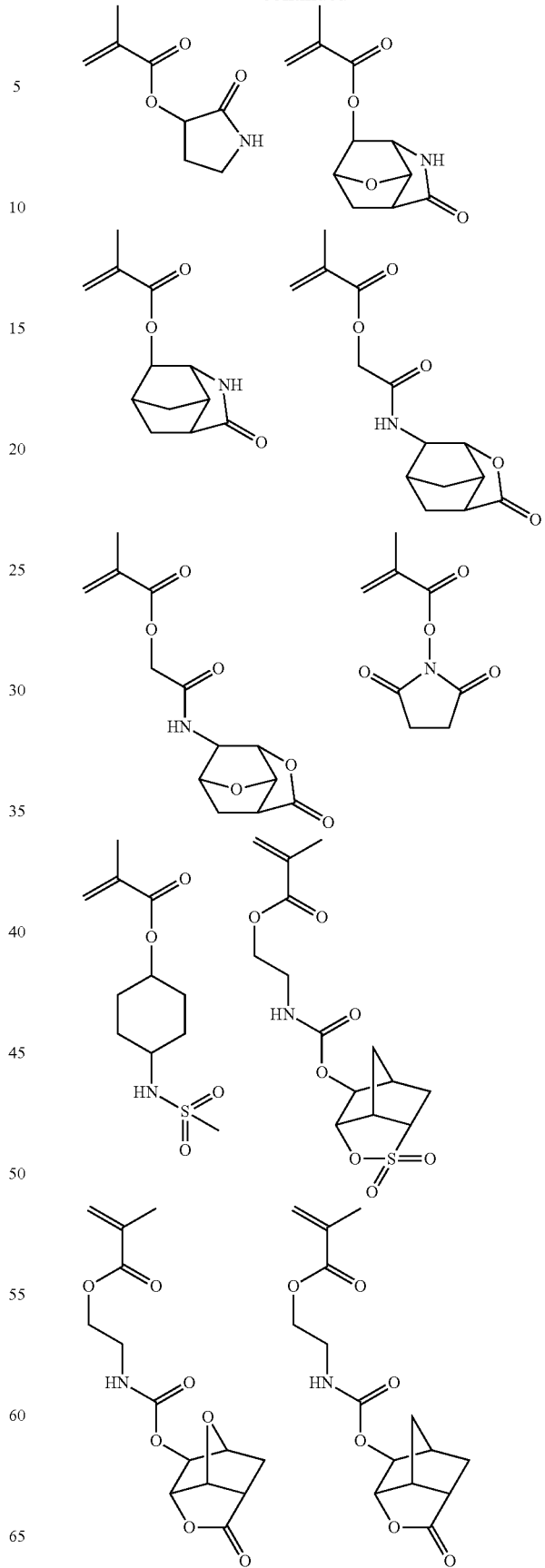

101
-continued
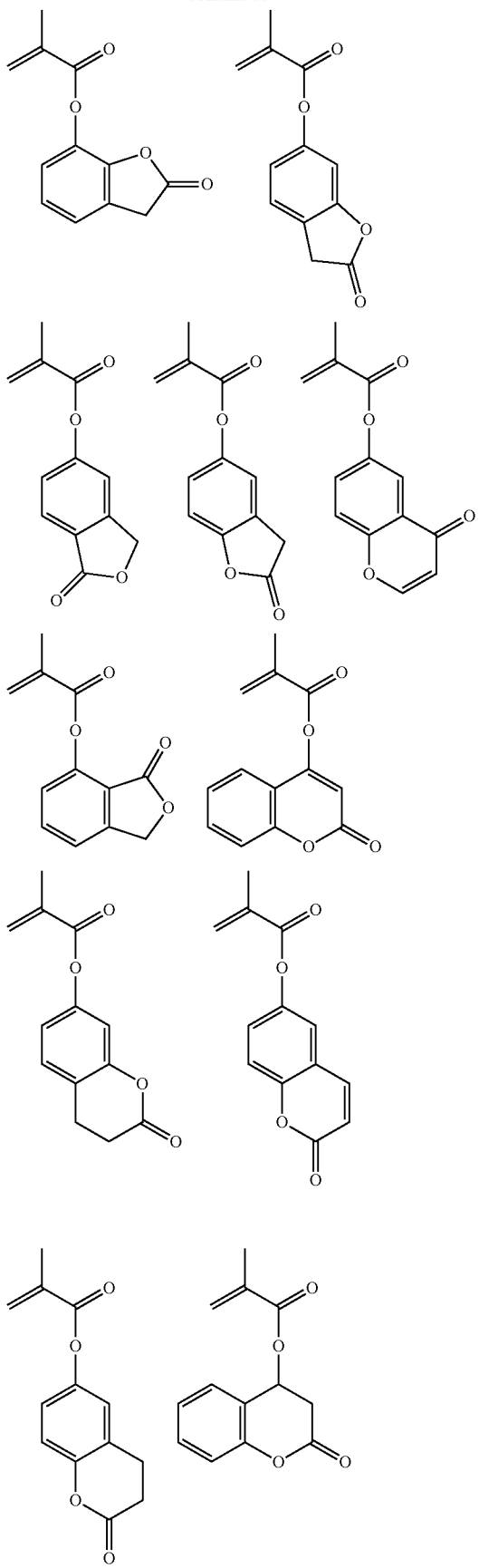
102
-continued
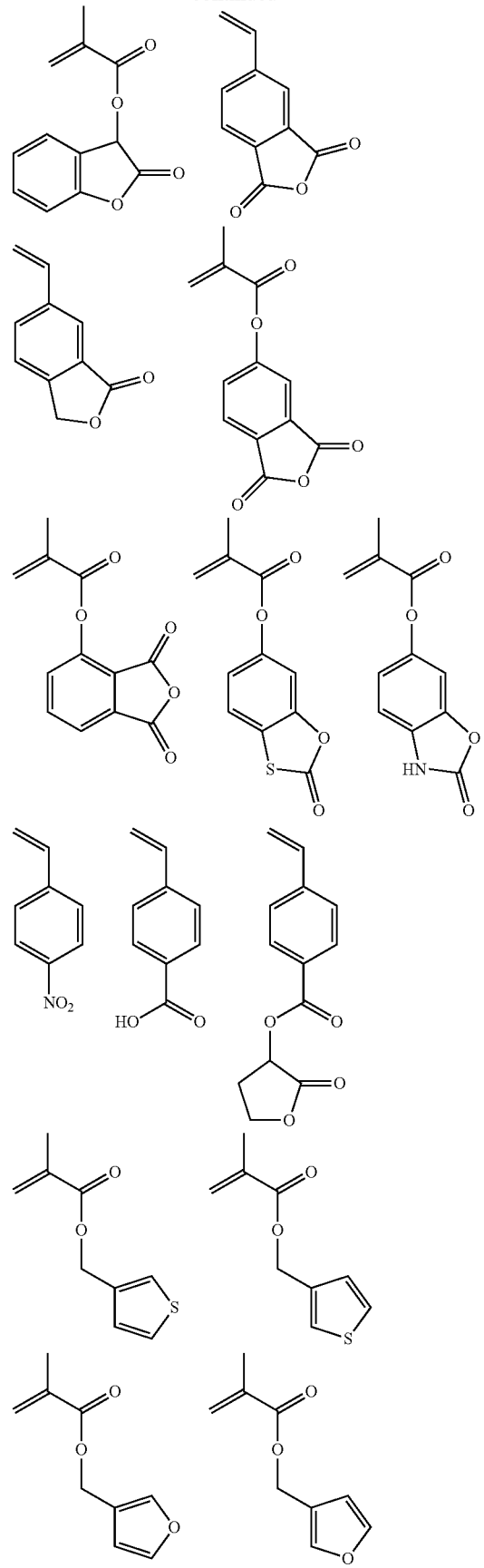

103
-continued
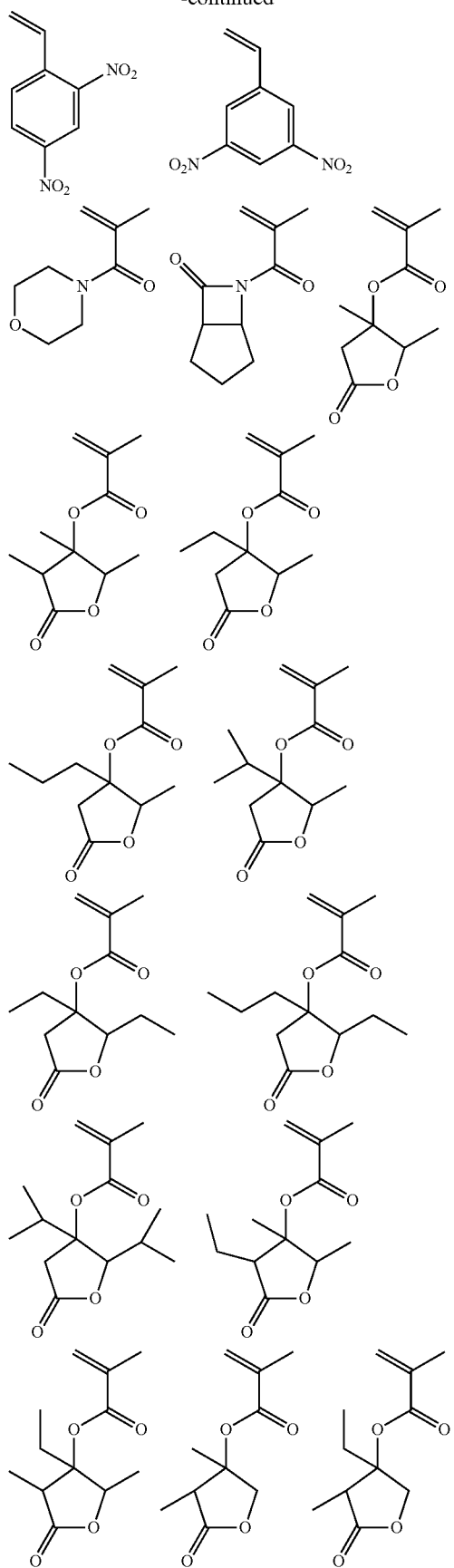
104
-continued
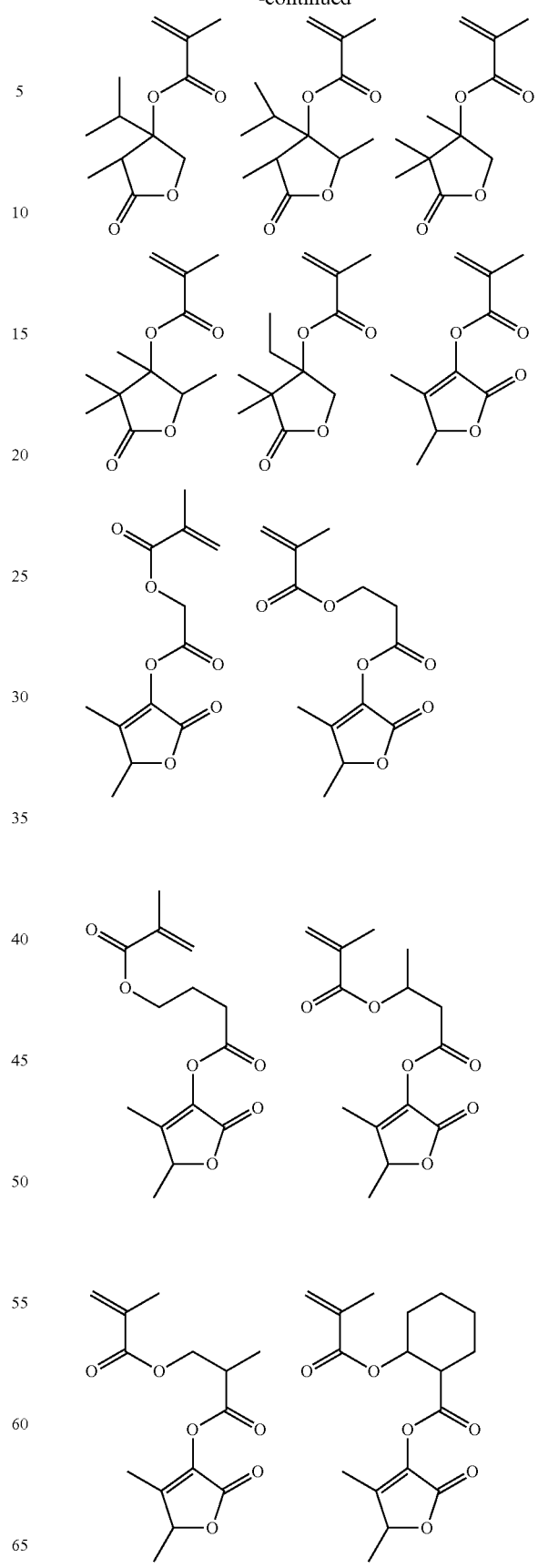

105
-continued
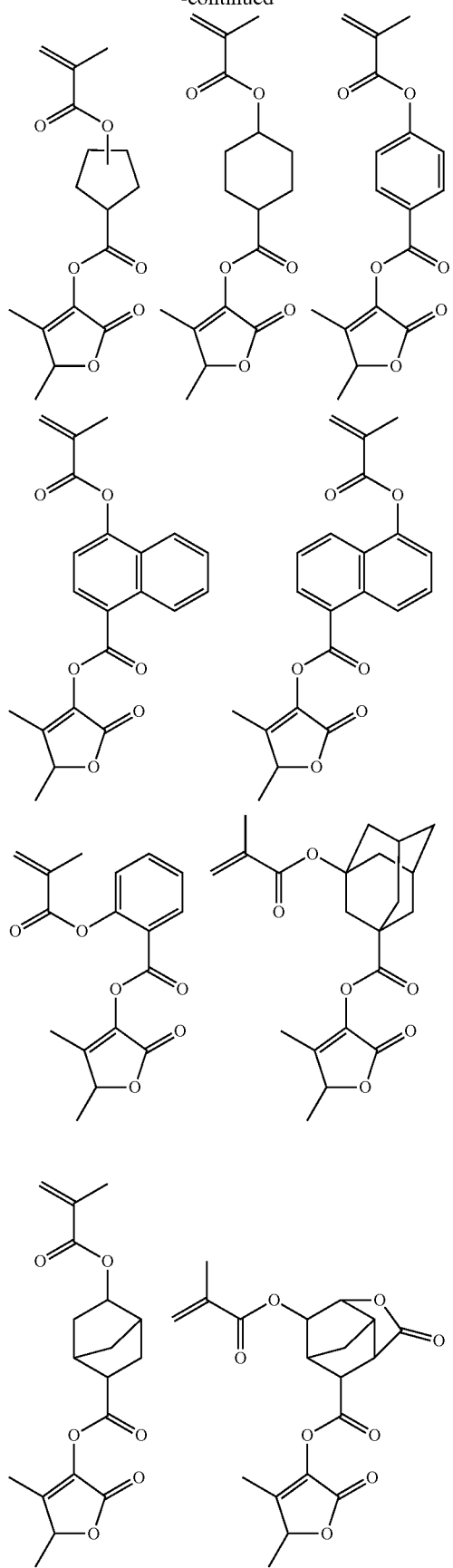
106
-continued
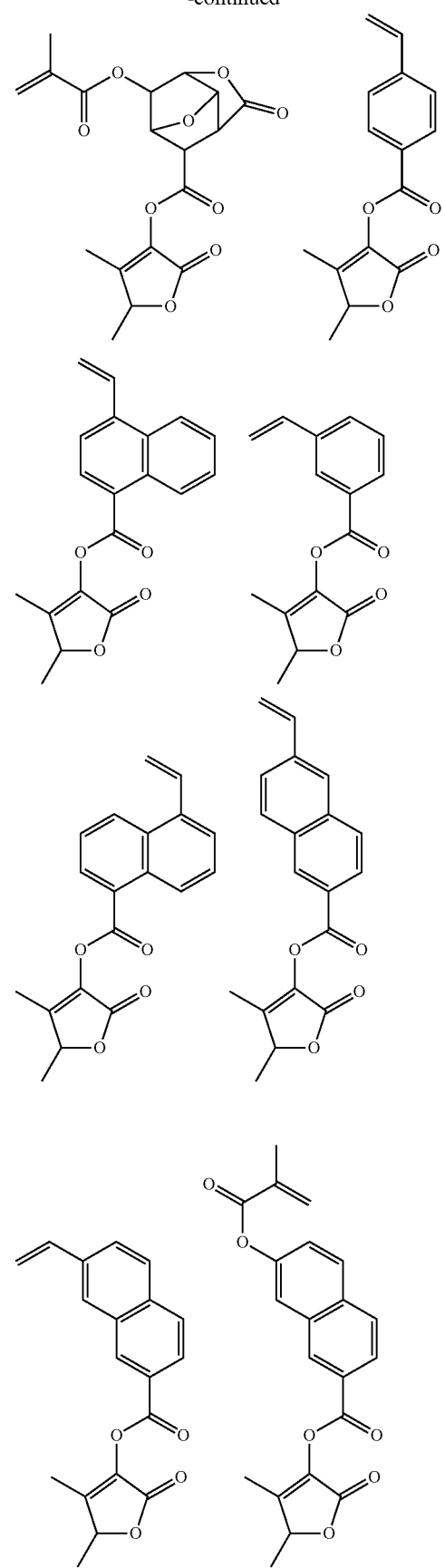

107
-continued
108
-continued
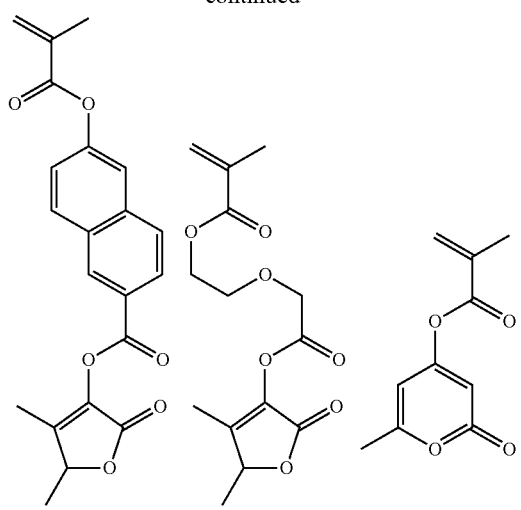
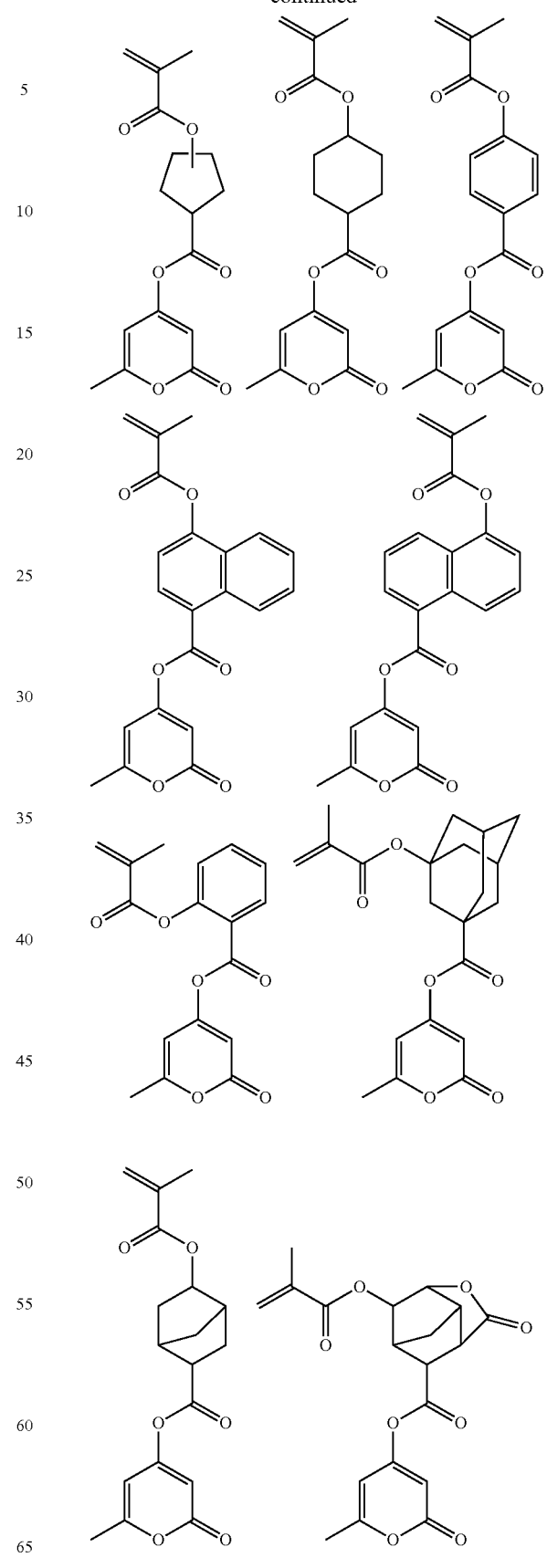

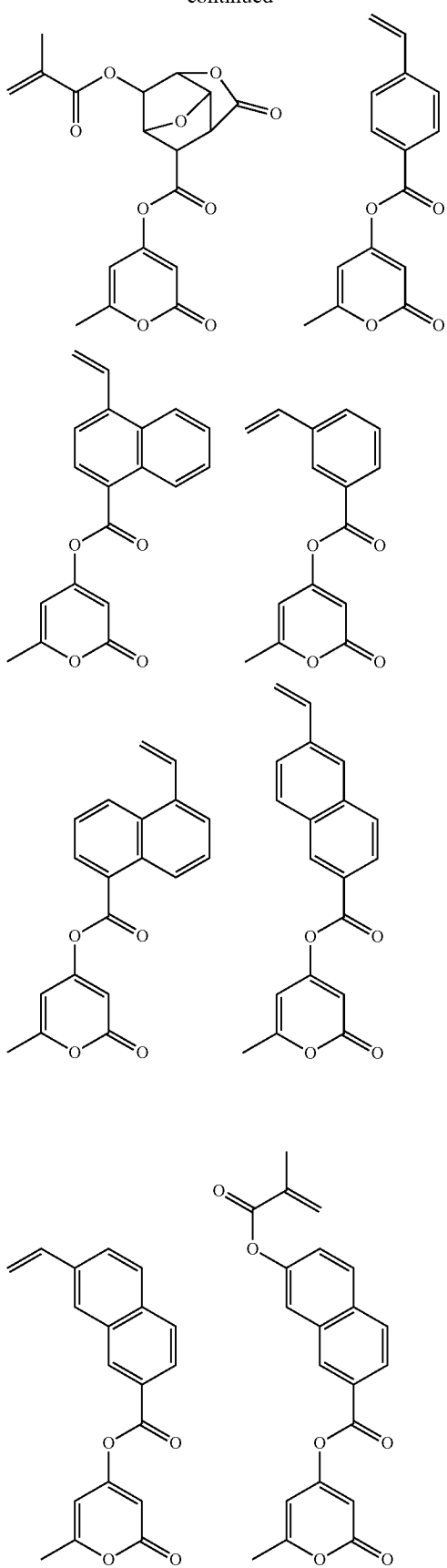

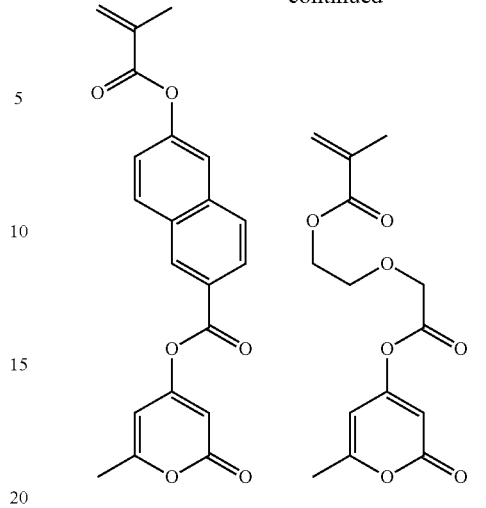

Besides the recurring units (a1), (a2), (a3), (a4), (a5), (b1), (b2) and (c) described above, the polymer may have further copolymerized therein additional recurring units, for example, recurring units (d) having a non-leaving hydrocarbon group as described in JP-A 2008-281980. Examples of the non-leaving hydrocarbon group other than those described in JP-A 2008-281980 include indene, acenaphthylene, and norbornadiene derivatives, and further include styrene, vinylnaphthalene, vinylbiphenyl, and vinylcarbazole. By copolymerizing recurring units (d) having a non-leaving hydrocarbon group, the polymer in the shrink agent is improved in solubility in the $C_7$-$C_{16}$ ester and $C_8$-$C_{16}$ ketone solvents, and also improved in dry etching resistance when the substrate is etched through the pattern after shrinkage.

Further, recurring units (e) having an oxirane or oxetane ring may be copolymerized. Once recurring units (e) are copolymerized, crosslinking can take place at the interface between the shrink agent and the resist film, leading to an increase of shrinkage. Examples of the recurring units (e) having an oxirane or oxetane ring are shown below. Note that $R^{41}$ is hydrogen or methyl.

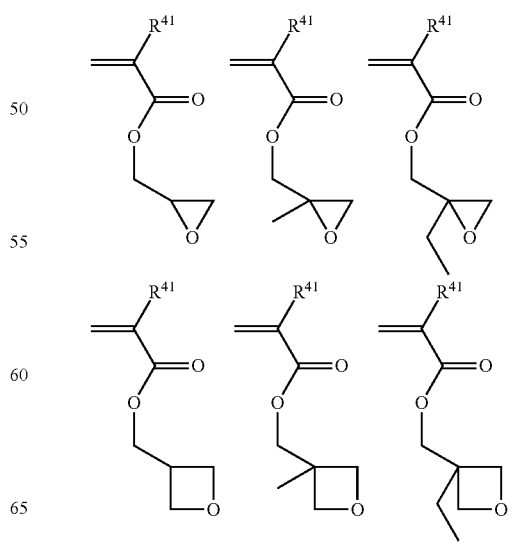

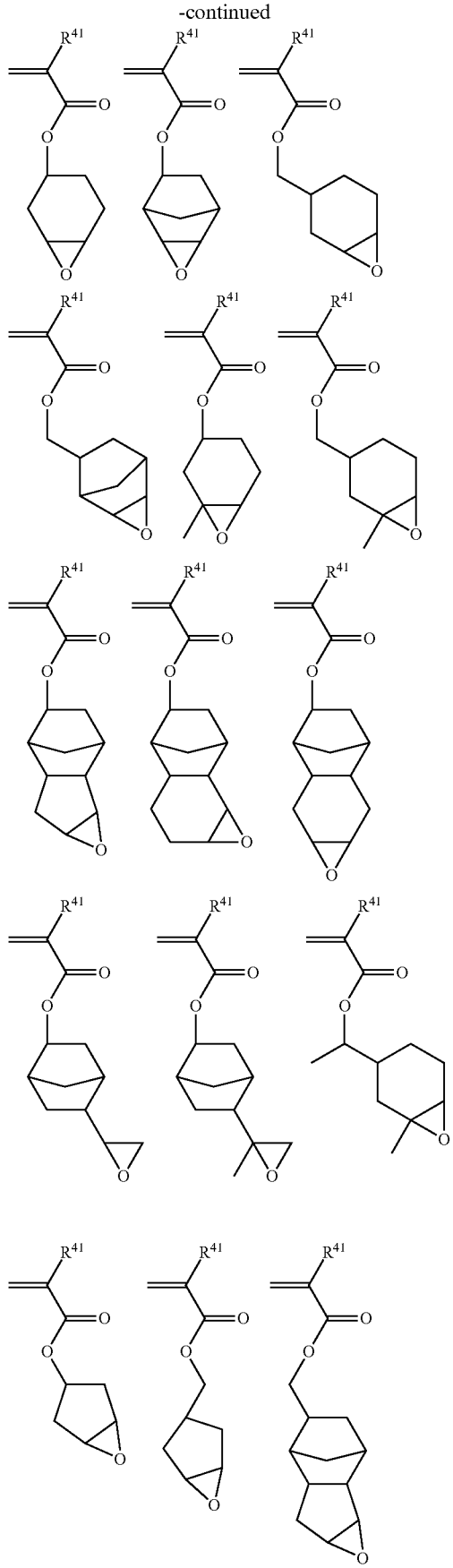
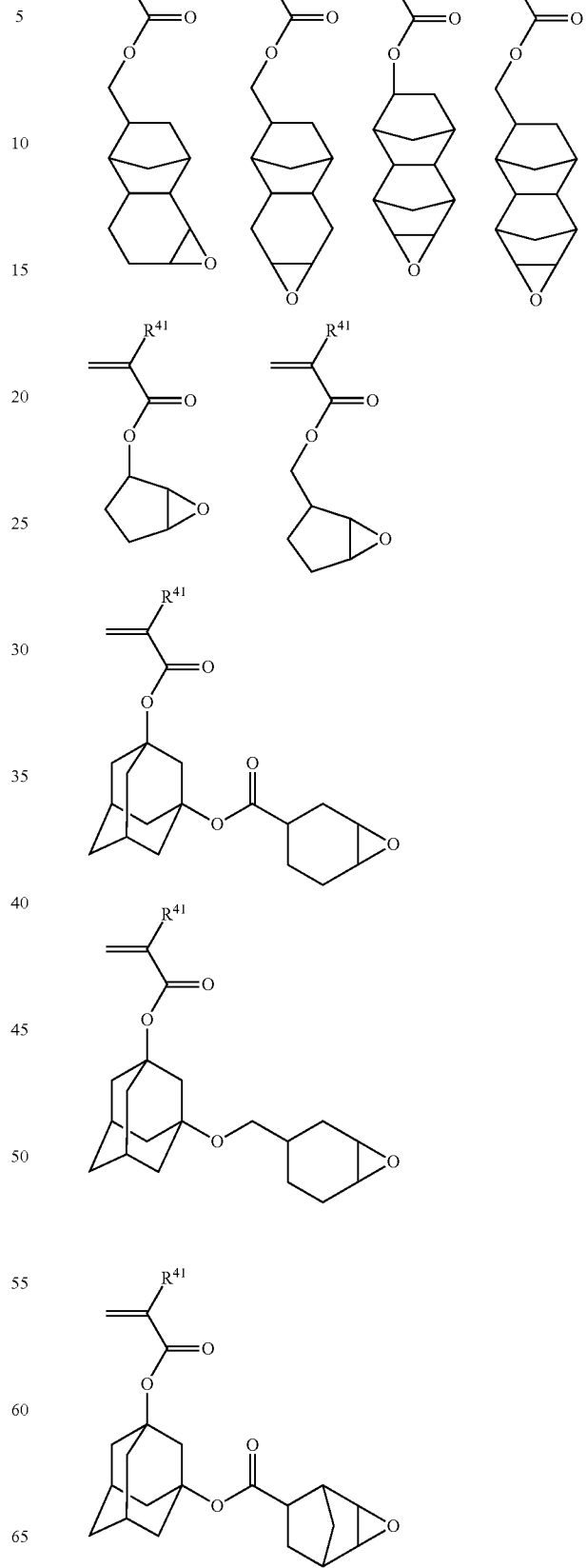

-continued
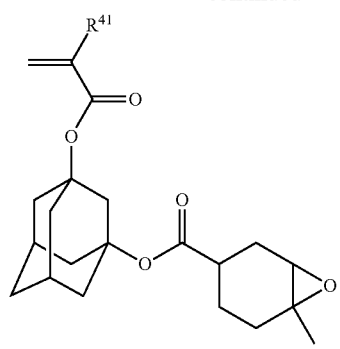
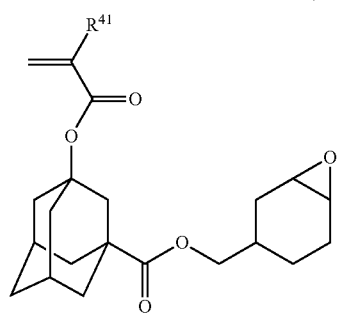
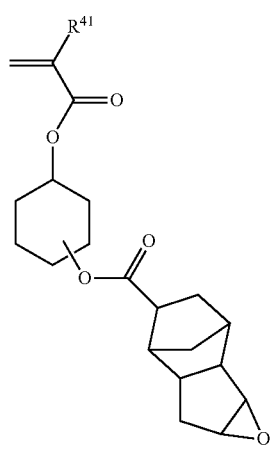
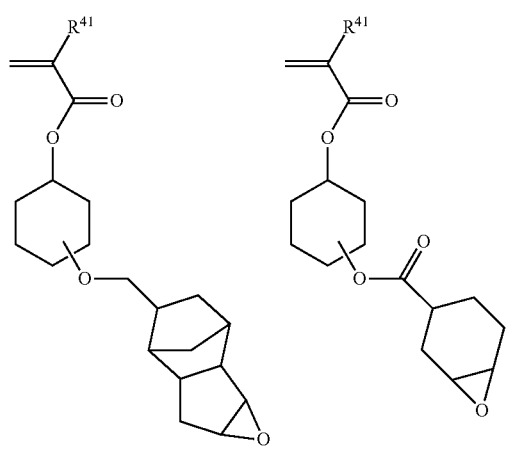
-continued
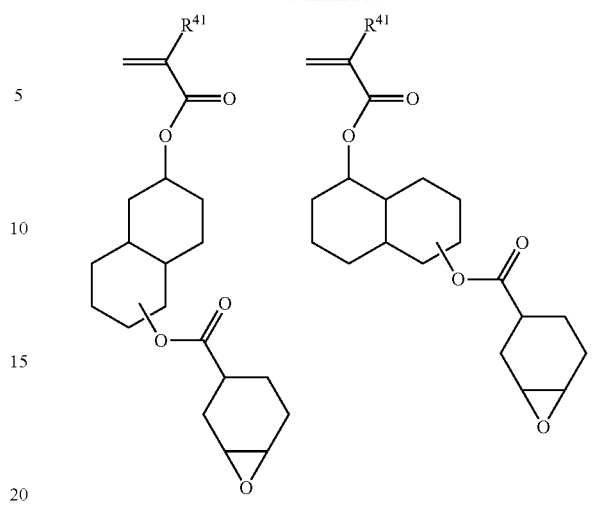
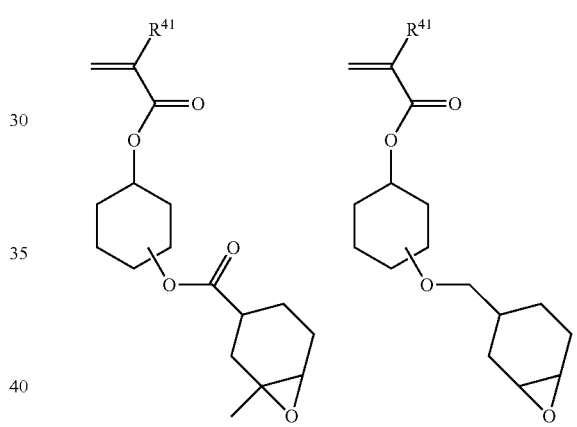
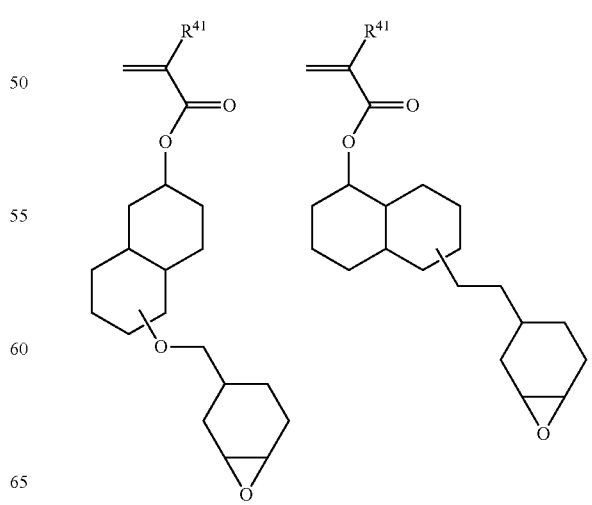

-continued

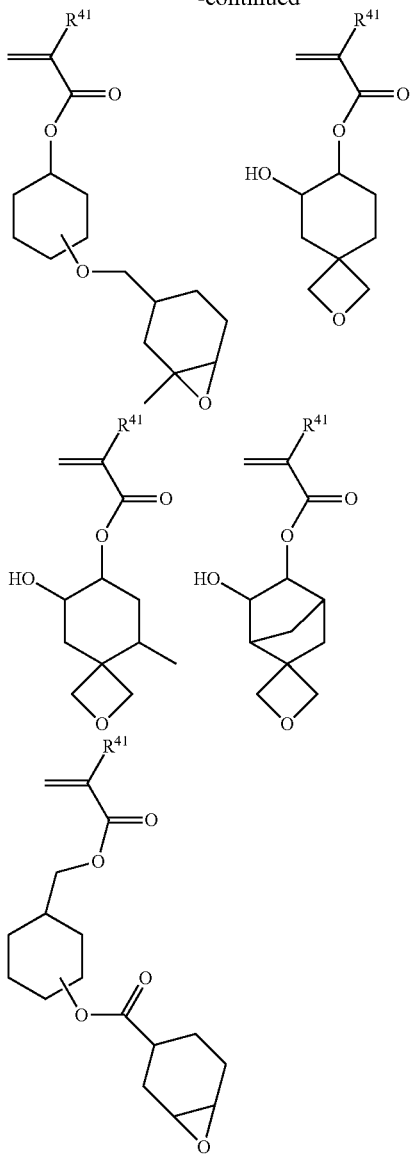

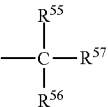

(AL-12)

In formulae (AL-10) and (AL-11), $R^{51}$ and $R^{54}$ each are a monovalent hydrocarbon group, typically a straight, branched or cyclic alkyl group of 1 to 40 carbon atoms, more specifically 1 to 20 carbon atoms, which may contain a heteroatom such as oxygen, sulfur, nitrogen or fluorine. The subscript "z" is an integer of 0 to 10, preferably 1 to 5. $R^{52}$ and $R^{53}$ each are hydrogen or a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{52}$ and $R^{53}$, $R^{52}$ and $R^{54}$, or $R^{53}$ and $R^{54}$, taken together, may form a ring, specifically aliphatic ring, with the carbon atom or the carbon and oxygen atoms to which they are attached, the ring having 3 to 20 carbon atoms, especially 4 to 16 carbon atoms.

In formula (AL-12), $R^{55}$, $R^{56}$ and $R^{57}$ each are a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{55}$ and $R^{56}$, $R^{55}$ and $R^{57}$, or $R^{56}$ and $R^{57}$, taken together, may form a ring, specifically aliphatic ring, with the carbon atom to which they are attached, the ring having 3 to 20 carbon atoms, especially 4 to 16 carbon atoms.

Illustrative examples of the groups of formula (AL-10) include tert-butoxycarbonyl, tert-butoxycarbonylmethyl, tert-pentyloxycarbonyl, tert-pentyloxycarbonylmethyl, 1-ethoxyethoxycarbonylmethyl, 2-tetrahydropyranyloxycarbonylmethyl and 2-tetrahydrofuranyloxycarbonylmethyl as well as substituent groups of the following formulae (AL-10)-1 to (AL-10)-10.

The acid labile groups including $R^2$ substituting on the carboxyl group, $R^5$ substituting on the hydroxyl group, $R^{14}$ on the lactone ring-forming unit, and $R^{22}$ in the base polymer for the shrink agent, and $R^{31}$ substituting on the carboxyl group in the base polymer for the photoresist (to be described later) may be selected from a variety of such groups while they may be the same or different. Preferred acid labile groups include groups of formula (AL-10), acetal groups of formula (AL-11), tertiary alkyl groups of formula (AL-12), and oxoalkyl groups of 4 to 20 carbon atoms.

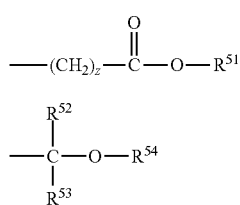

(AL-10)

(AL-11)

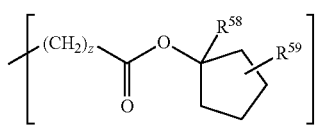

(AL-10)-1

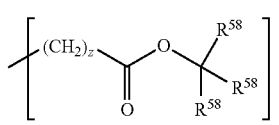

(AL-10)-2

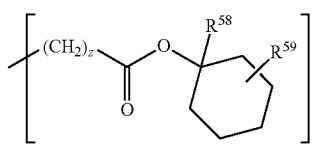

(AL-10)-3

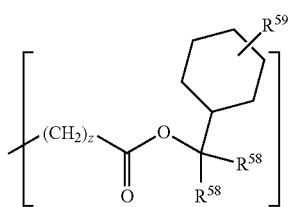

(AL-10)-4

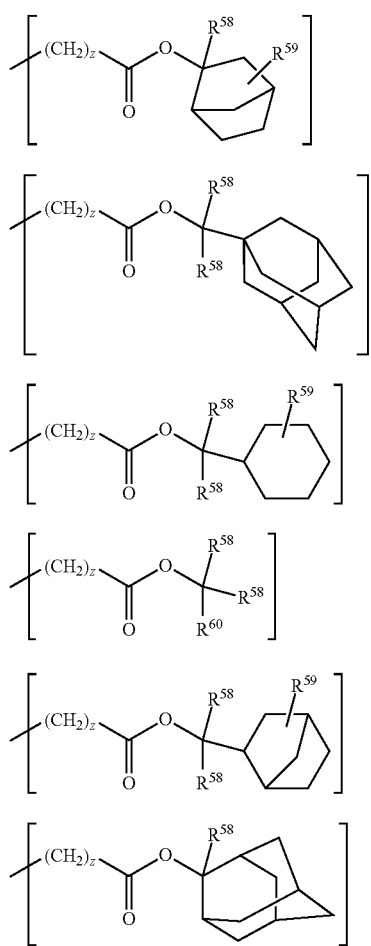

In formulae (AL-10)-1 to (AL-10)-10, $R^{58}$ is independently a straight, branched or cyclic $C_1$-$C_8$ alkyl group, $C_6$-$C_{20}$ aryl group or $C_7$-$C_{20}$ aralkyl group; $R^{59}$ is hydrogen or a straight, branched or cyclic $C_1$-$C_{20}$ alkyl group; $R^{60}$ is a $C_6$-$C_{20}$ aryl group or $C_7$-$C_{20}$ aralkyl group; and "z" is as defined above.

Illustrative examples of the acetal group of formula (AL-11) include those of the following formulae (AL-11)-1 to (AL-11)-112.

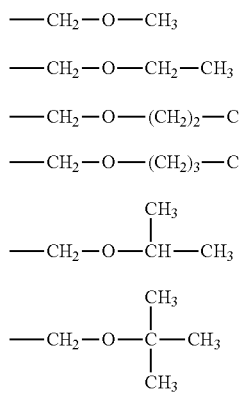

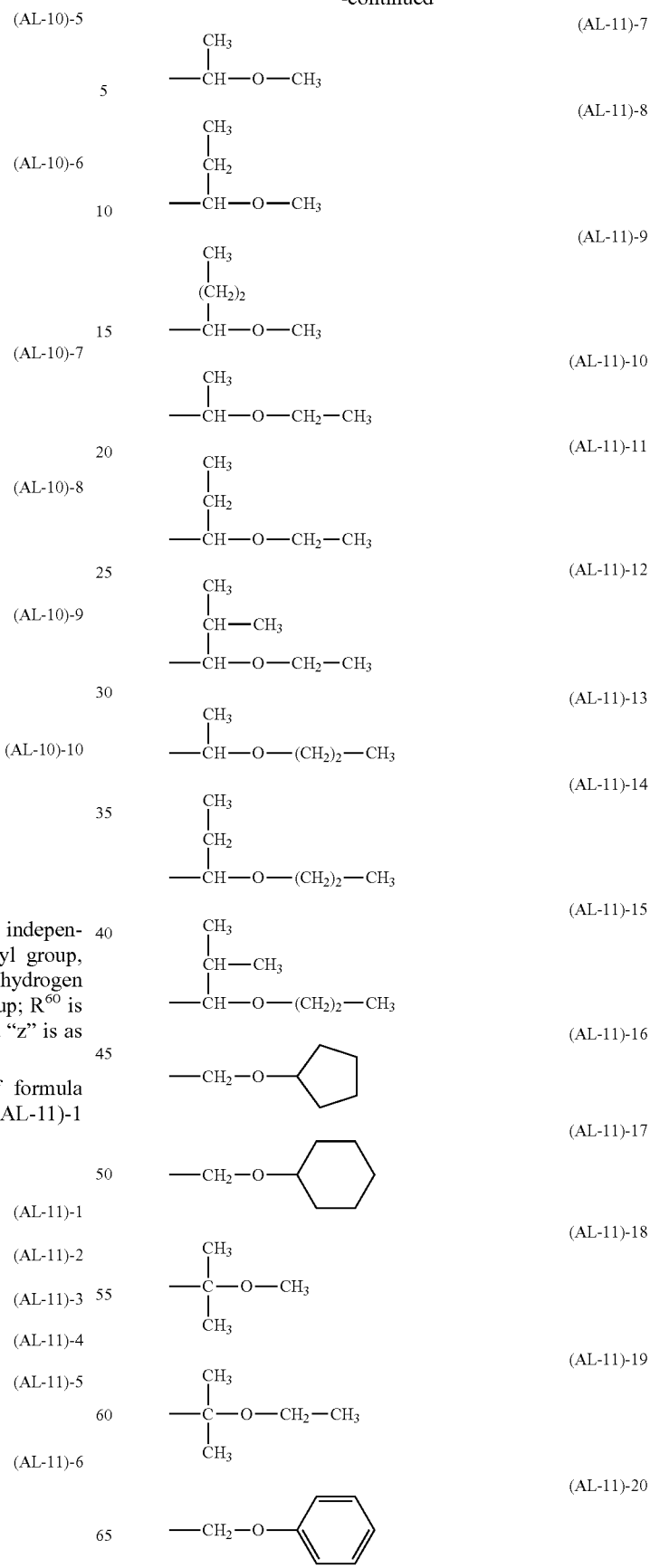

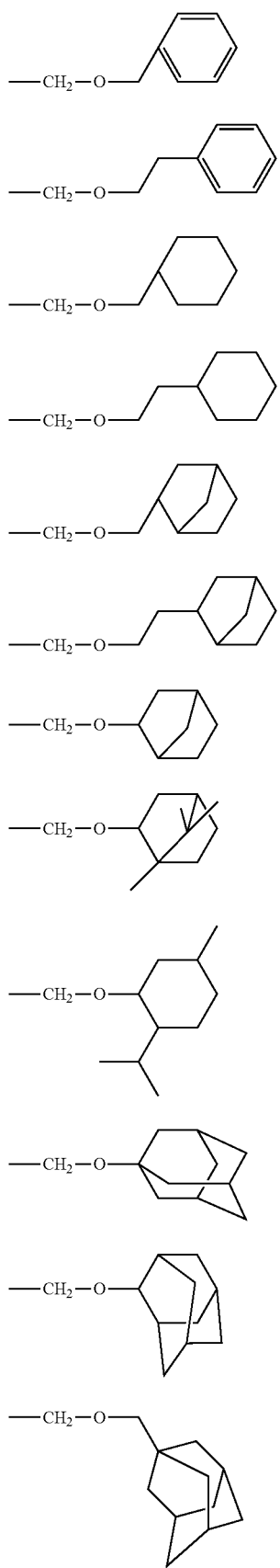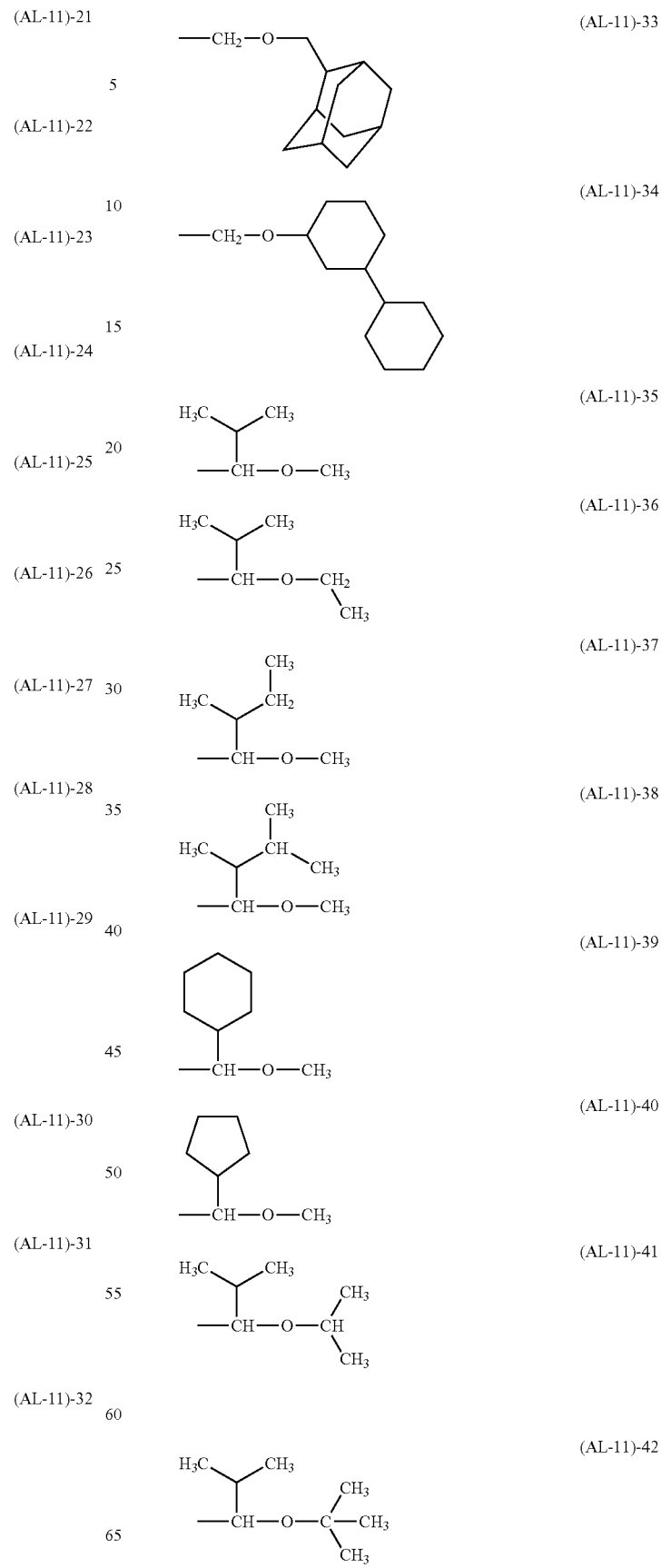

(AL-11)-43 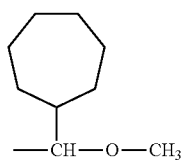
(AL-11)-44 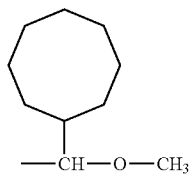
(AL-11)-45 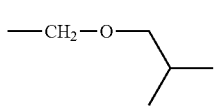
(AL-11)-46 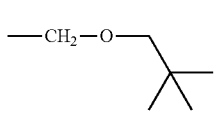
(AL-11)-47 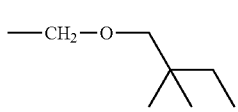
(AL-11)-48 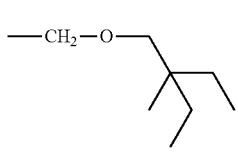
(AL-11)-49 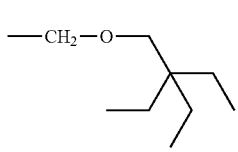
(AL-11)-50 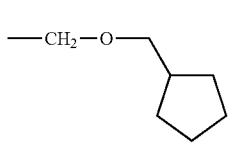
(AL-11)-51 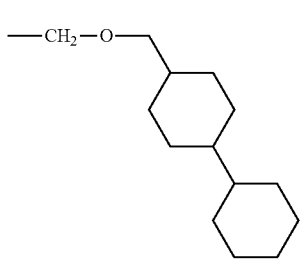
(AL-11)-52 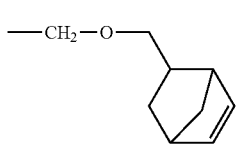
(AL-11)-53 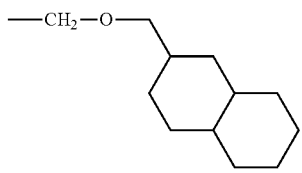
(AL-11)-54 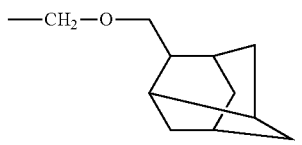
(AL-11)-55 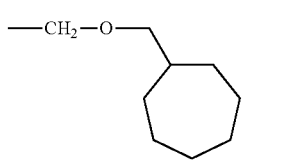
(AL-11)-56 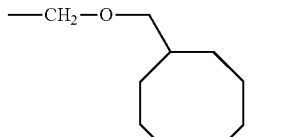
(AL-11)-57 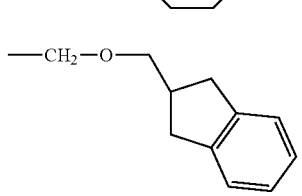
(AL-11)-58 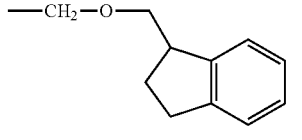
(AL-11)-59 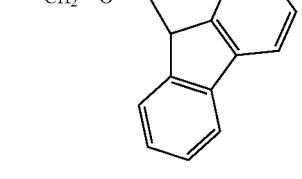
(AL-11)-60 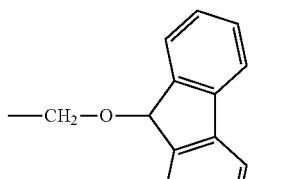
(AL-11)-61 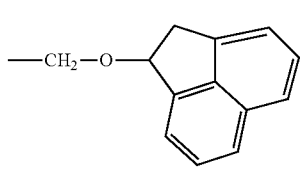

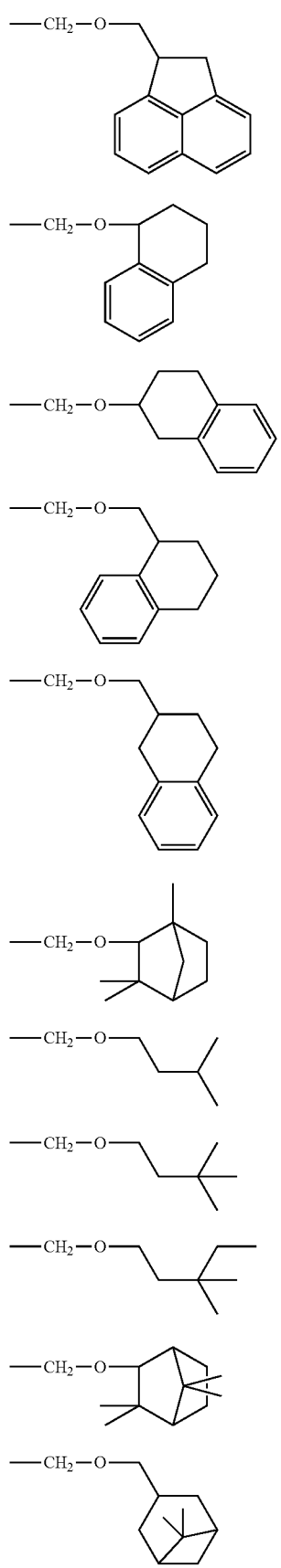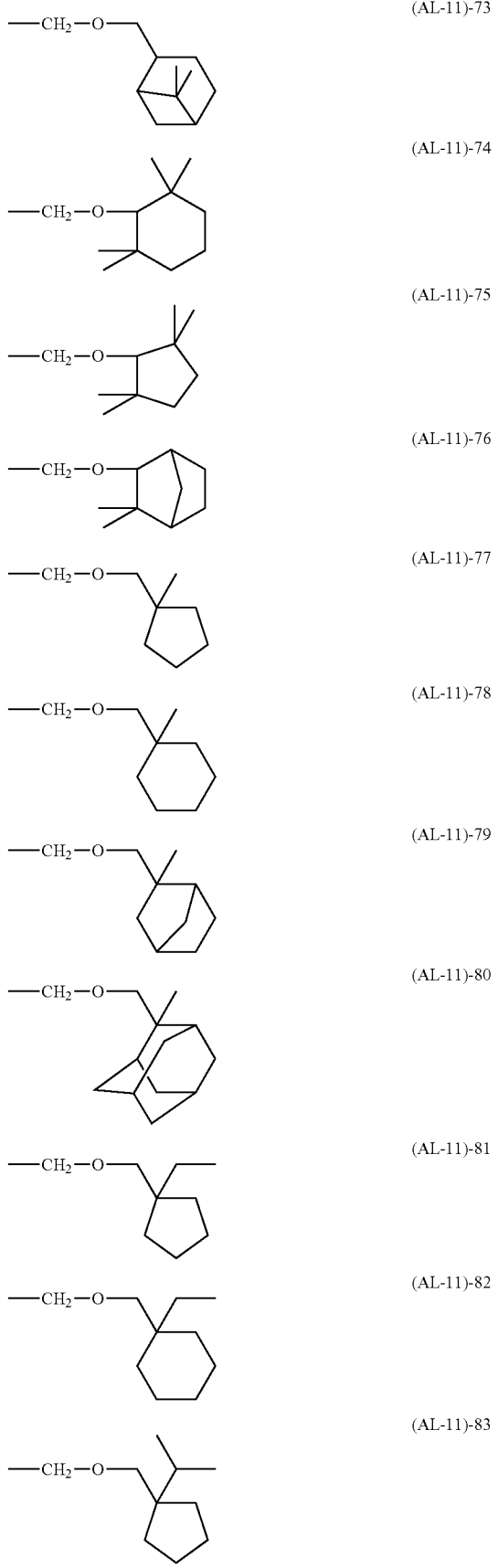

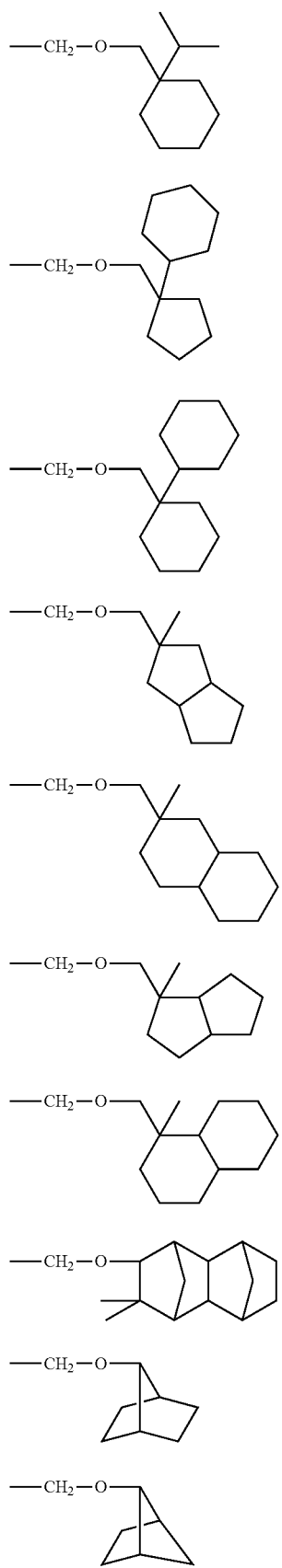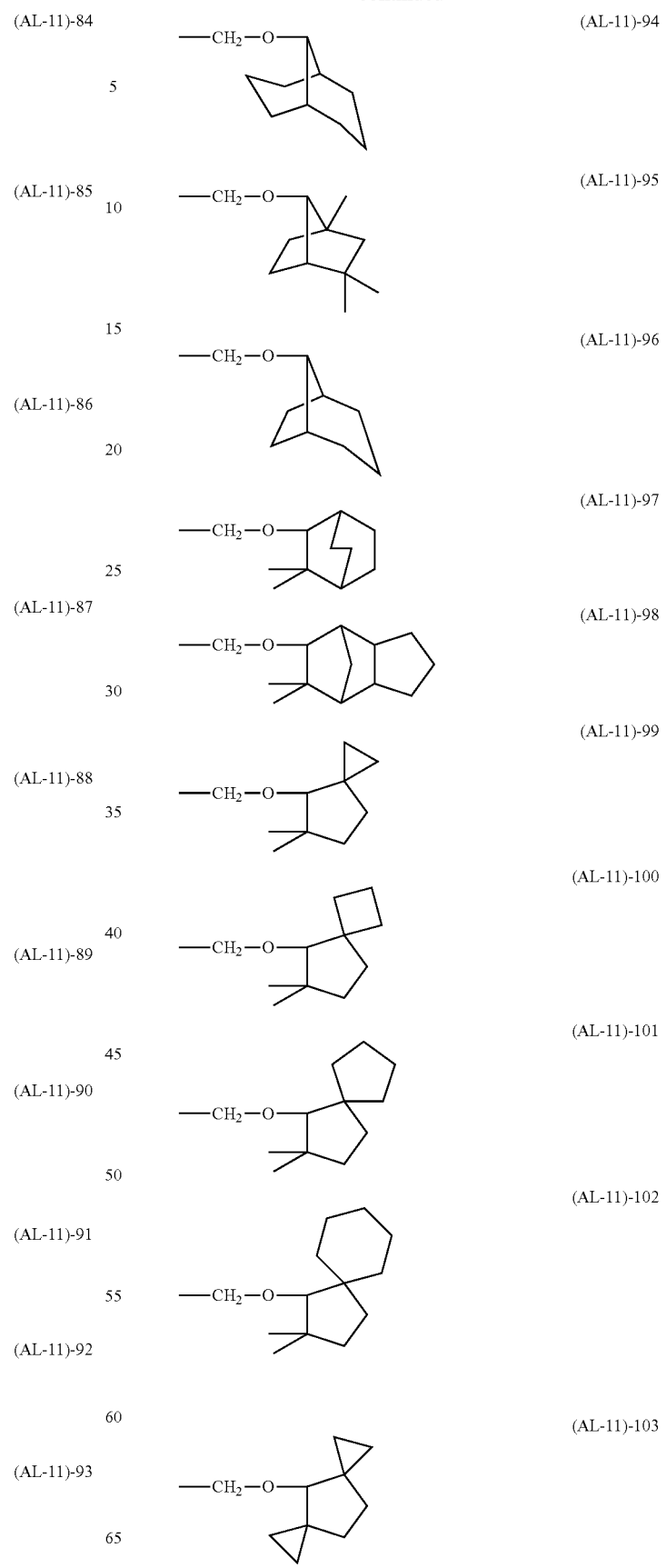

(AL-11)-104 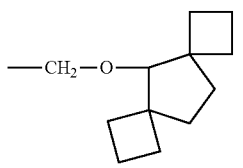

(AL-11)-105 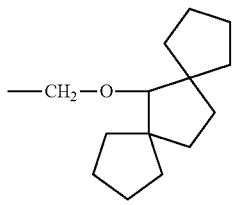

(AL-11)-106 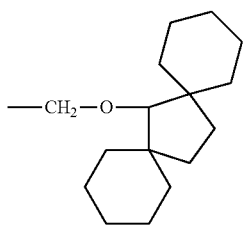

(AL-11)-107 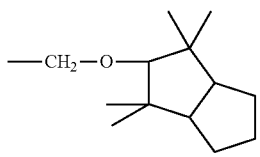

(AL-11)-108 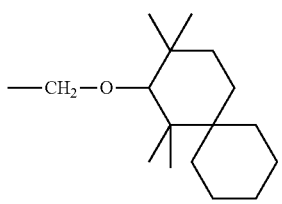

(AL-11)-109 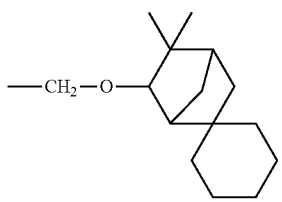

(AL-11)-110 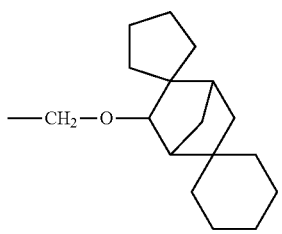

(AL-11)-111 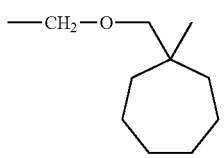

(AL-11)-112 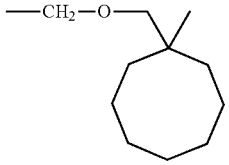

The polymer may be crosslinked within the molecule or between molecules with acid labile groups of formula (AL-11a) or (AL-11b).

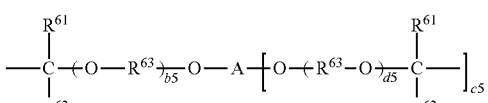
(AL-11a)

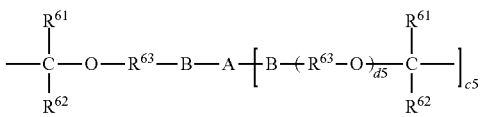
(AL-11b)

Herein $R^{61}$ and $R^{62}$ each are hydrogen or a straight, branched or cyclic $C_1$-$C_8$ alkyl group, or $R^{61}$ and $R^{62}$, taken together, may form a ring with the carbon atom to which they are attached, and $R^{61}$ and $R^{62}$ are straight or branched $C_1$-$C_8$ alkylene groups when they form a ring. $R^{63}$ is a straight, branched or cyclic $C_1$-$C_{10}$ alkylene group. Each of b5 and d5 is 0 or an integer of 1 to 10, preferably 0 or an integer of 1 to 5, and c5 is an integer of 1 to 7. "A" is a (c5+1)-valent aliphatic or alicyclic saturated hydrocarbon group, aromatic hydrocarbon group or heterocyclic group having 1 to 50 carbon atoms, which may be separated by a heteroatom such as oxygen, sulfur or nitrogen or in which some of the hydrogen atoms attached to carbon atoms may be substituted by hydroxyl, carboxyl, carbonyl radicals or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkanetriyl and alkanetetrayl groups, and $C_6$-$C_{30}$ arylene groups, which may be separated by a heteroatom such as oxygen, sulfur or nitrogen or in which some of the hydrogen atoms attached to carbon atoms may be substituted by hydroxyl, carboxyl, acyl radicals or halogen atoms. The subscript c5 is preferably an integer of 1 to 3.

The crosslinking acetal groups of formulae (AL-11a) and (AL-11b) are exemplified by the following formulae (AL-11)-113 through (AL-11)-120.

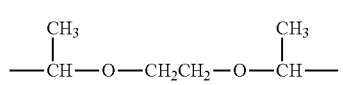
(AL-11)-113
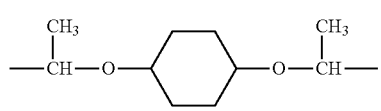
(AL-11)-114
(AL-11)-115
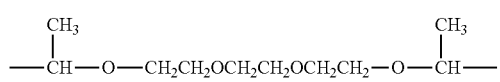
(AL-11)-116
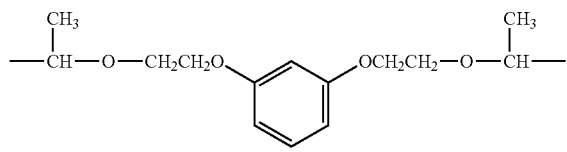
(AL-11)-117
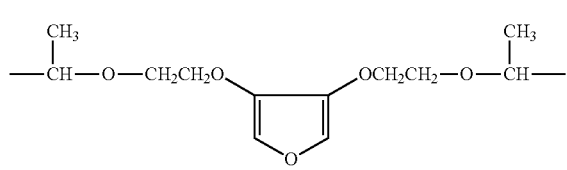
(AL-11)-118
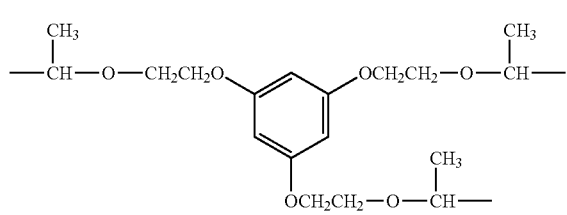
(AL-11)-119
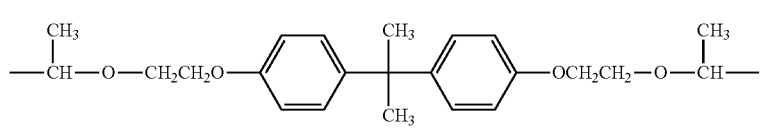
(AL-11)-120
Illustrative examples of the tertiary alkyl of formula (AL-12) include tert-butyl, triethylcarbyl, 1-ethylnorbornyl, 1-methylcyclohexyl, 1-ethylcyclopentyl, and tert-pentyl groups as well as those of (AL-12)-1 to (AL-12)-16.
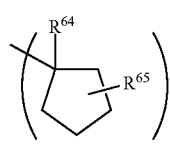
(AL-12)-1
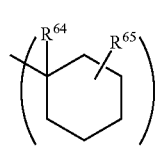
(AL-12)-2
-continued
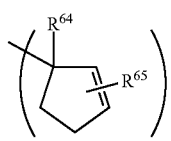
(AL-12)-3
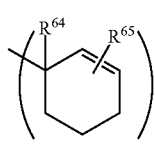
(AL-12)-4
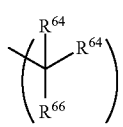
(AL-12)-5

(AL-12)-6

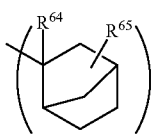

(AL-12)-7

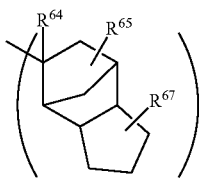

(AL-12)-8

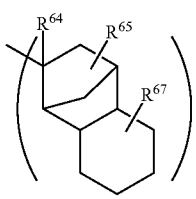

(AL-12)-9

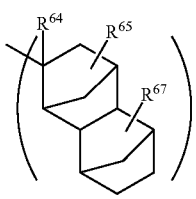

(AL-12)-10

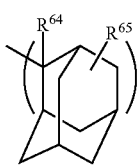

(AL-12)-11

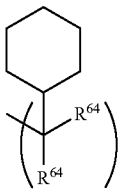

(AL-12)-12

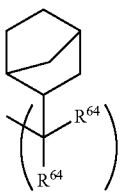

(AL-12)-13

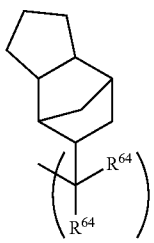

(AL-12)-14

(AL-12)-15

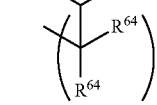

(AL-12)-16

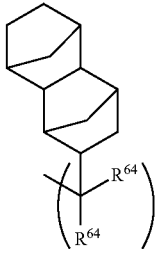

Herein $R^{64}$ is each independently a straight, branched or cyclic $C_1$-$C_8$ alkyl group, $C_6$-$C_{20}$ aryl group or $C_7$-$C_{20}$ aralkyl group, or two $R^{64}$ groups may bond together to form a ring. $R^{65}$ and $R^{67}$ each are hydrogen, methyl or ethyl. $R^{66}$ is a $C_6$-$C_{20}$ aryl group or $C_7$-$C_{20}$ aralkyl group.

With acid labile groups containing $R^{68}$ representative of a di- or poly-valent alkylene or arylene group as shown by formula (AL-12)-17, the polymer may be crosslinked within the molecule or between molecules. In formula (AL-12)-17, $R^{64}$ is as defined above, $R^{68}$ is a single bond, a straight, branched or cyclic $C_1$-$C_{20}$ alkylene group or arylene group, which may contain a heteroatom such as oxygen, sulfur or nitrogen, and b6 is an integer of 0 to 3. It is noted that formula (AL-12)-17 is applicable to all the foregoing acid labile groups.

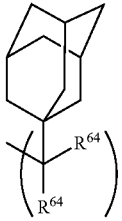

(AL-12)-17

The groups represented by $R^{64}$, $R^{65}$, $R^{66}$ and $R^{67}$ may contain a heteroatom such as oxygen, nitrogen or sulfur. Such groups are exemplified by those of the following formulae (AL-13)-1 to (AL-13)-7.

—(CH$_2$)$_4$OH  (AL-13)-1

—(CH$_2$)$_2$O(CH$_2$)$_3$CH$_3$  (AL-13)-2

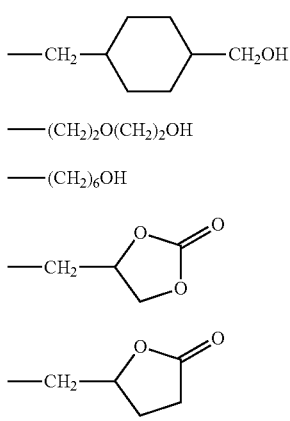

(AL-13)-3

—CH₂—⟨cyclohexyl⟩—CH₂OH (AL-13)-4

—(CH₂)₂O(CH₂)₂OH (AL-13)-5

—(CH₂)₆OH (AL-13)-6

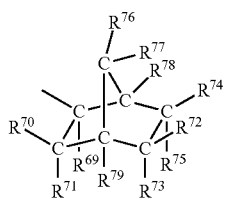

(AL-13)-7

Of the acid labile groups of formula (AL-12), groups of exo-form structure having the following formula (AL-12)-18 are preferred.

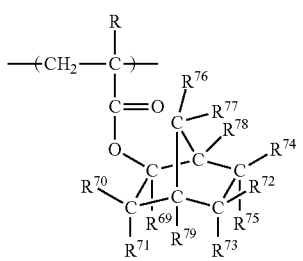 (AL-12)-18

Herein $R^{69}$ is a straight, branched or cyclic $C_1$-$C_8$ alkyl group or optionally substituted $C_6$-$C_{20}$ aryl group. $R^{70}$ to $R^{75}$, $R^{78}$, and $R^{79}$ are each independently hydrogen or a monovalent $C_1$-$C_{15}$ hydrocarbon group, typically alkyl, which may contain a heteroatom, $R^{76}$ and $R^{77}$ are hydrogen; or a pair of $R^{70}$ and $R^{71}$, $R^{72}$ and $R^{74}$, $R^{72}$ and $R^{75}$, $R^{73}$ and $R^{75}$, $R^{73}$ and $R^{79}$, $R^{74}$ and $R^{78}$, $R^{76}$ and $R^{77}$, or $R^{77}$ and $R^{78}$ may bond together to form a ring, typically aliphatic ring, with the carbon atom to which they are attached, and in this case, the ring-forming participant is a divalent $C_1$-$C_{15}$ hydrocarbon group, typically alkylene, which may contain a heteroatom. Also, a pair of $R^{70}$ and $R^{79}$, $R^{76}$ and $R^{79}$, or $R^{72}$ and $R^{74}$ which are attached to vicinal carbon atoms may bond together directly to form a double bond. The formula also represents an enantiomer.

The ester form monomers from which recurring units having an exo-form structure represented by the formula (AL-12)-18 shown below are derived are described in U.S. Pat. No. 6,448,420 (JP-A 2000-327633).

R is hydrogen or methyl. Illustrative non-limiting examples of suitable monomers are given below.

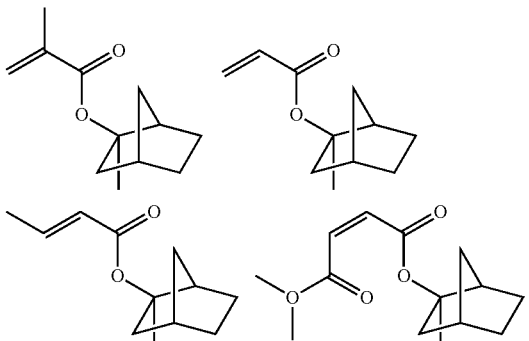
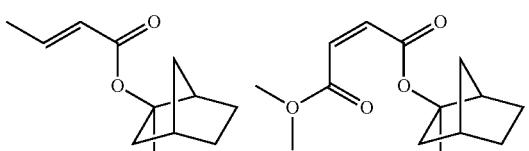
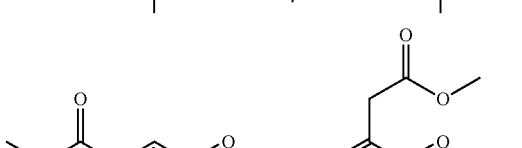
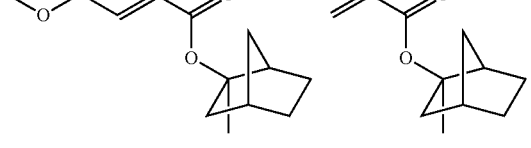
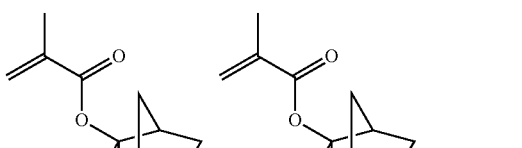
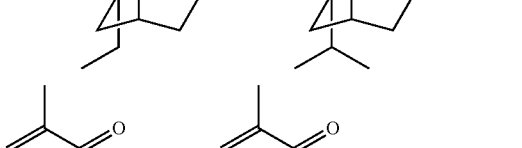
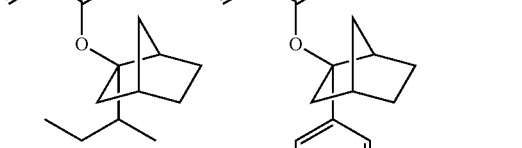
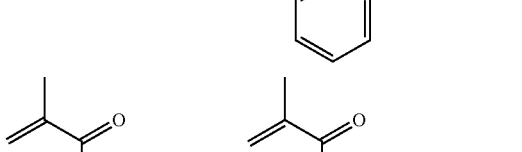
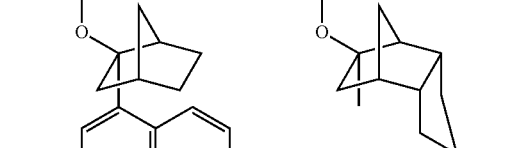
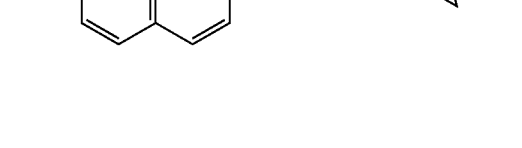
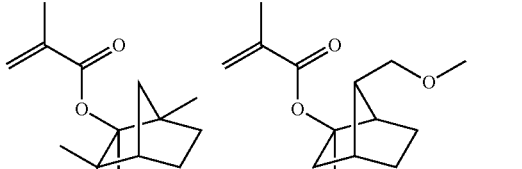

-continued

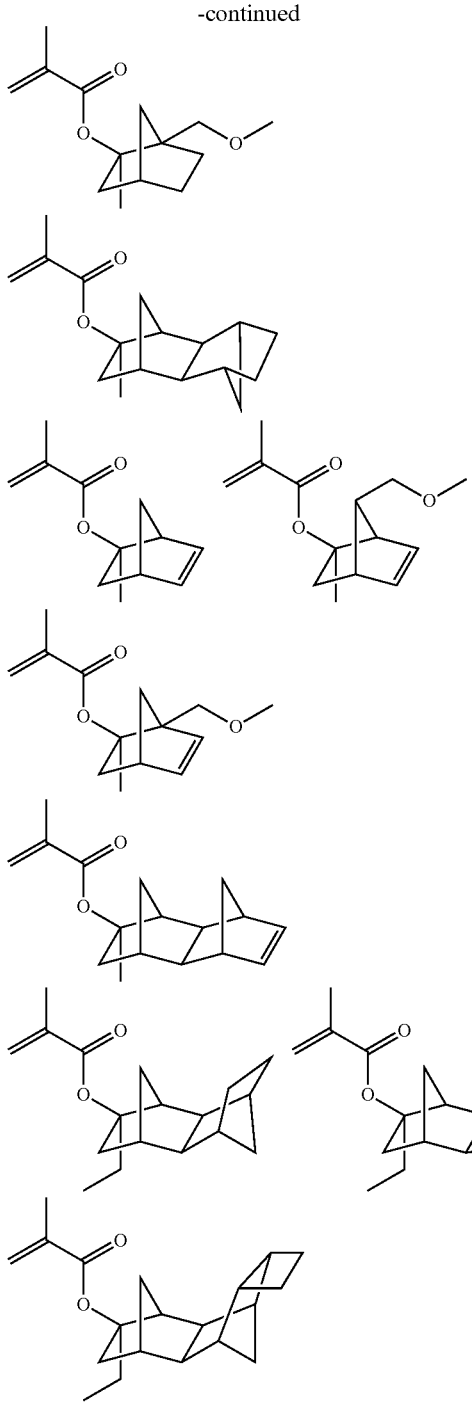

Also included in the acid labile groups of formula (AL-12) are acid labile groups having furandiyl, tetrahydrofurandiyl or oxanorbornanediyl as represented by the following formula (AL-12)-19.

(AL-12)-19

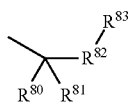

Herein, $R^{80}$ and $R^{81}$ are each independently a monovalent hydrocarbon group, typically a straight, branched or cyclic $C_1$-$C_{10}$ alkyl group. $R^{80}$ and $R^{81}$, taken together, may form an aliphatic hydrocarbon ring of 3 to 20 carbon atoms with the carbon atom to which they are attached. $R^{82}$ is a divalent group selected from furandiyl, tetrahydrofurandiyl and oxanorbornanediyl. $R^{83}$ is hydrogen or a monovalent hydrocarbon group, typically a straight, branched or cyclic $C_1$-$C_{10}$, alkyl group, which may contain a heteroatom.

Recurring units substituted with an acid labile group having furandiyl, tetrahydrofurandiyl or oxanorbornanediyl as represented by the formula:

$$-\!\!\!\left(\!CH_2\!-\!\!\underset{\underset{\underset{\underset{R^{80}\ \ R^{81}}{|}}{O-\!\!\overset{\overset{R^{83}}{|}}{\underset{|}{C}}\!-\!R^{82}}}{\underset{|}{C=O}}}{\overset{\overset{R}{|}}{C}}\!\right)\!\!-$$

(wherein R, $R^{80}$ to $R^{83}$ are as defined above) are derived from monomers, examples of which are shown below. Note that Me is methyl and Ac is acetyl.

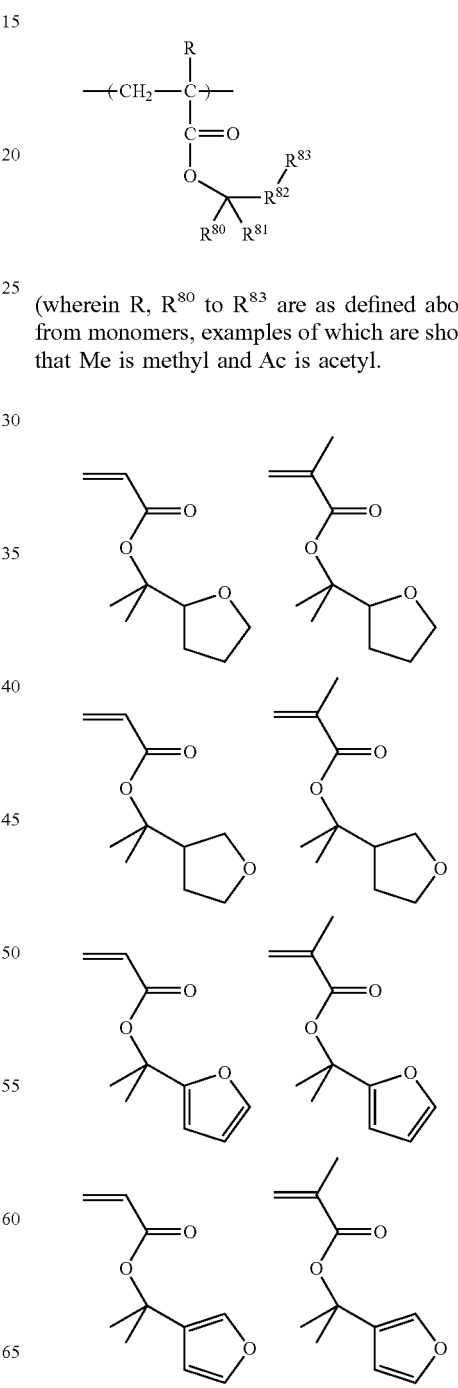

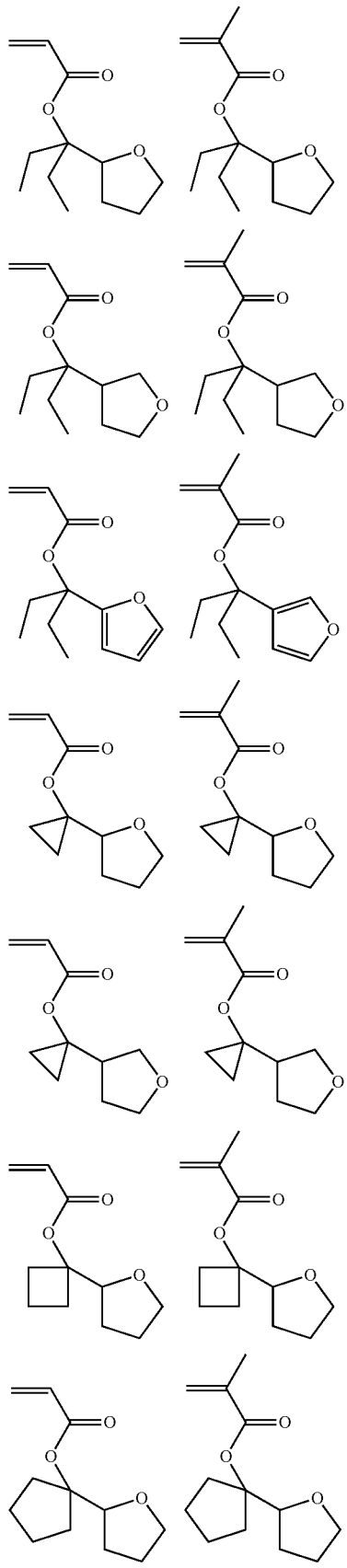
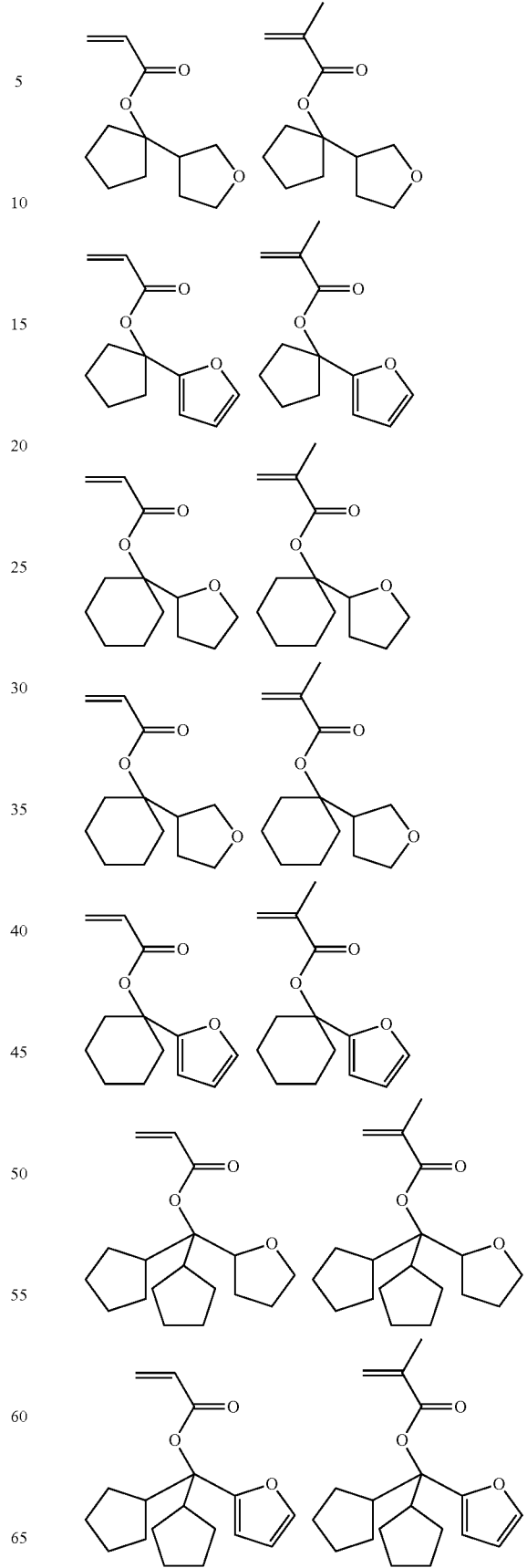

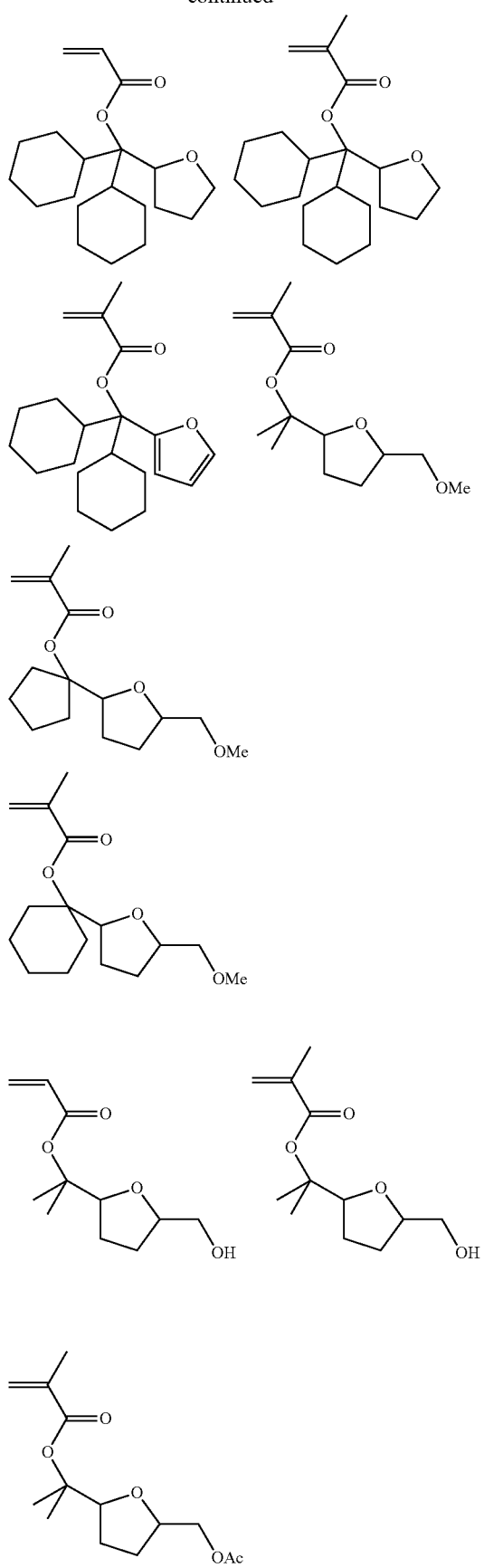
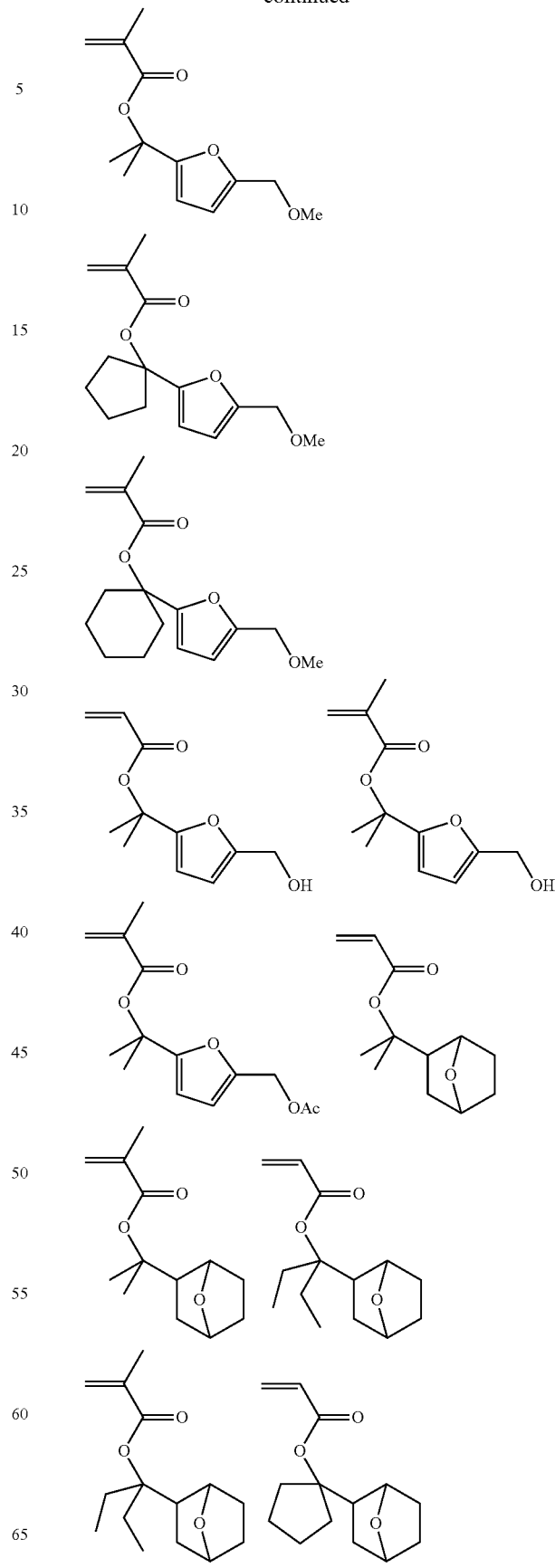

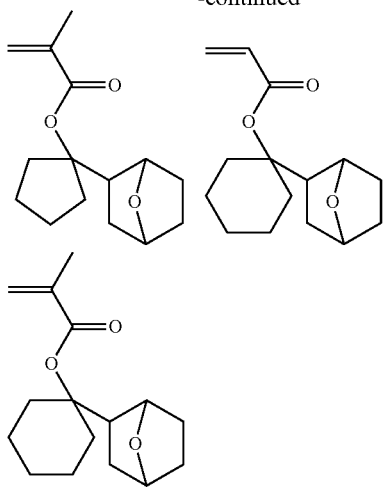
Of the acid labile groups of tertiary alkyl form having formula (A1-12), those acid labile groups having a branched alkyl directly attached to the ring offer high solubility in organic solvents. Such acid labile groups are exemplified below. In the following formula, the line segment protruding out of the bracket denotes a valence bond.
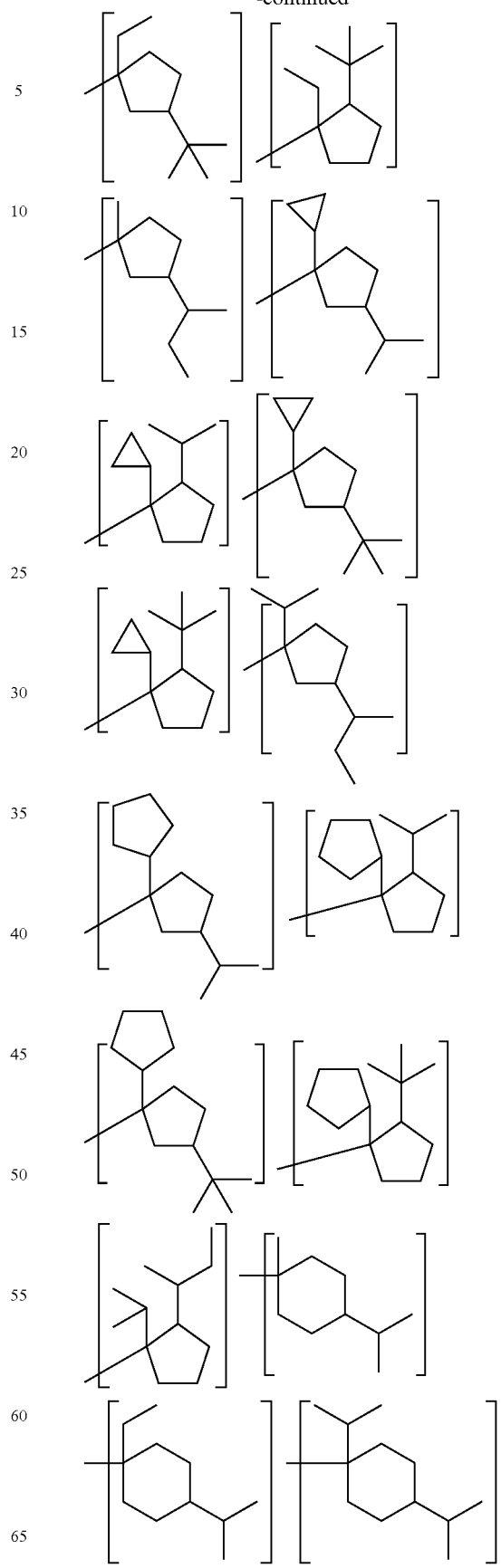

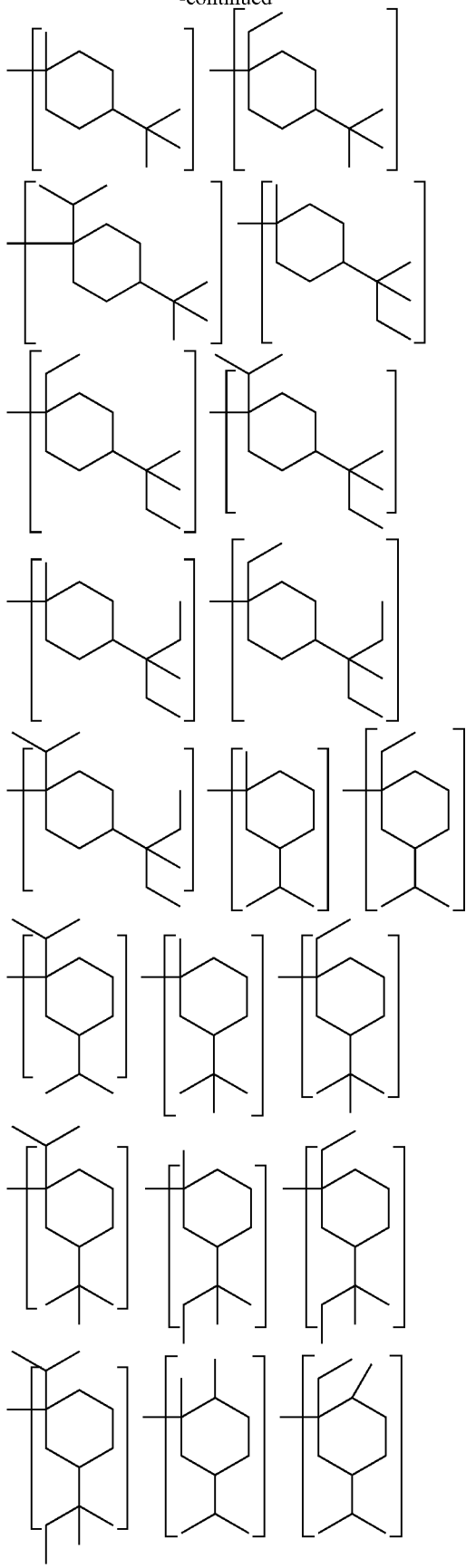

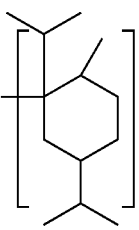

The first polymer for the shrink agent comprises recurring units (a1), (a2), (a3) and (a4) having formula (1) and optionally recurring units (c), (d) and (e) in the range: 0≤a1≤1.0, 0≤a2≤1.0, 0≤a3≤1.0, 0≤a4≤1.0, 0<a1+a2+a3+a4≤1.0, 0≤c≤0.8, 0≤d≤0.8, and 0≤e≤0.8; preferably 0≤a1≤0.9, 0≤a2≤0.9, 0≤a3≤0.9, 0≤a4≤0.9, 0.1≤a1+a2+a3+a4≤0.9, 0≤c≤0.7, 0≤d≤0.7, and 0≤e≤0.7; and more preferably 0≤a1≤0.8, 0≤a2≤0.8, 0≤a3≤0.8, 0≤a4≤0.8, 0.2≤a1+a2+a3+a4≤0.8, 0≤c≤0.6, 0≤d≤0.6, and 0≤e≤0.6; provided that a1+a2+a3+a4+c+d+e=1.

The second polymer for the shrink agent comprises recurring units (b1) and (b2) having formula (2) and optionally recurring units (c), (d) and (e) in the range: 0<b1<1.0, 0<b2<1.0, 0<b1+b2≤1.0, 0≤c≤0.8, 0≤d≤0.8, and 0≤e≤0.8; preferably 0.1≤b1≤0.9, 0.1≤b2≤0.9, 0.2≤b1+b2≤1.0, 0≤c≤0.7, 0≤d≤0.7, and 0≤e≤0.7; and more preferably 0.2≤b1≤0.8, 0.2≤b2≤0.8, 0.3≤b1+b2≤1.0, 0≤c≤0.6, 0≤d≤0.6, and 0≤e≤0.6; and; provided that b1+b2+c+d+e=1.

In the shrink agent of the present invention, the weight ratio of the first polymer and the second polymer is preferably 100:0.1 to 100:100, more preferably 100:0.2 to 100:50. If the ratio of the first polymer is lower, the shrinking rate may reduce. If the ratio of the first polymer is higher, the ratio of the second polymer become lower, whereby the surface of the shrink agent may not be fully covered and hole pattern may not be fully prevented from being blocked at the surface during shrinking.

On the other hand, the base polymer in the resist composition used to form a resist pattern is defined as comprising recurring units (a5) having an acid labile group-substituted carboxyl group, preferably represented by the general formula (3).

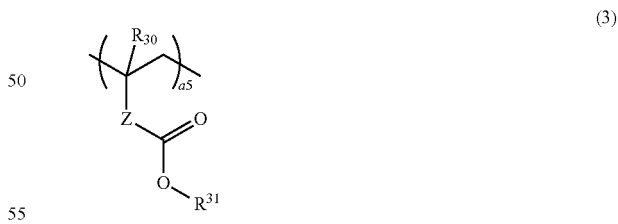

(3)

Herein $R^{30}$ is hydrogen or methyl. $R^{31}$ is an acid labile group. Z is a single bond or —C(=O)—O—$R^{32}$— wherein $R^{32}$ is a straight, branched or cyclic $C_1$-$C_{10}$ alkylene group which may contain an ether or ester moiety, or naphthylene group, and a5 is a number in the range: 0<a5<1.0, preferably 0.2≤a5≤0.8.

In the polymer comprising recurring units (a5) for use in the photoresist composition for pattern formation, the aforementioned recurring units (c) may be copolymerized for facilitating the insolubilization of the exposed region in organic solvent developer, improving adhesion to the substrate, and preventing pattern collapse. Besides the recurring units (a5) having an acid labile group-substituted carboxyl group and the recurring units (c) having an adhesive group selected from among hydroxyl, lactone ring, ether, ester, carbonyl and cyano groups, the polymer may have further copolymerized therein an indene, acenaphthylene, chromone, coumarin, and norbornadiene as described in JP-A 2012-37867, paragraph [0085], a styrene, vinylnaphthalene, vinylanthracene, vinylpyrene, and methyleneindane as described in paragraph [0088], and an acid generator in the form of an onium salt having polymerizable olefin as described in paragraphs [0089]-[0091].

The following discussion applies to the first and second polymers for the shrink agent and the polymer serving as the base polymer in the resist composition, used in the patterning process. The polymer should preferably have a weight average molecular weight (Mw) in the range of 1,000 to 500,000, and more preferably 2,000 to 100,000, as measured by GPC versus polystyrene standards. If Mw is too low, in the case of shrink agent, the amount of shrinkage may become excessive or even uncontrollable due to an extended acid diffusion distance, and in the case of resist composition, the diffusion distance of acid generated by PAG may be extended to invite a drop of resolution. If Mw is too high, in the case of shrink agent, the solubility of the polymer in stripper solvent may be reduced, leaving scum in spaces at the end of removal step, and in the case of resist composition, a footing phenomenon is likely to occur after pattern formation.

If a polymer has a wide molecular weight distribution or dispersity (Mw/Mn), which indicates the presence of lower and higher molecular weight polymer fractions, there is a possibility that foreign matter is left on the pattern after exposure or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size. It is acceptable to use a blend of two or more polymers which differ in compositional ratio, molecular weight or dispersity.

The polymers used herein may be synthesized by any desired method, for example, by dissolving one or more monomers in an organic solvent, adding a radical initiator thereto, and effecting heat polymerization. The monomers used herein include monomers corresponding to recurring units (a1), (a2), (a3), (a4), (b1) and (b2) in the case of shrink agent polymer, and monomers corresponding to acid labile group-bearing recurring units (a5) and adhesive group-bearing recurring units (c) in the case of resist polymer, and other unsaturated bond-bearing monomers. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethyl-valeronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to hours. The acid labile group that has been incorporated in the monomer may be kept as such, or the acid labile group may be once removed with an acid catalyst and the resulting polymer be protected or partially protected. In the polymers serving as the shrink agent, recurring units (a1), (a2), (a3) and (a4), and (b1) and (b2) may be arranged randomly or blockwise.

The shrink agent used in the pattern forming process further contains an organic solvent and optionally a salt, basic compound and surfactant.

It is essential that the organic solvent do not dissolve the resist film after development. The organic solvent is at least one solvent selected from ester solvents of 7 to 16 carbon atoms and ketone solvents of 8 to 16 carbon atoms. Suitable ester solvents include pentyl acetate, isopentyl acetate, 2-methylbutyl acetate, hexyl acetate, 2-ethylhexyl acetate, cyclohexyl acetate, methylcyclohexyl acetate, hexyl formate, ethyl valerate, propyl valerate, isopropyl valerate, butyl valerate, isobutyl valerate, tert-butyl valerate, pentyl valerate, isopentyl valerate, ethyl isovalerate, propyl isovalerate, isopropyl isovalerate, butyl isovalerate, isobutyl isovalerate, tert-butyl isovalerate, isopentyl isovalerate, ethyl 2-methylvalerate, butyl 2-methylvalerate, ethyl pivalate, propyl pivalate, isopropyl pivalate, butyl pivalate, tert-butyl pivalate, ethyl pentenoate, propyl pentenoate, isopropyl pentenoate, butyl pentenoate, tert-butyl pentenoate, propyl crotonate, isopropyl crotonate, butyl crotonate, tert-butyl crotonate, butyl propionate, isobutyl propionate, tert-butyl propionate, benzyl propionate, ethyl hexanoate, allyl hexanoate, propyl butyrate, butyl butyrate, isobutyl butyrate, 3-methylbutyl butyrate, tert-butyl butyrate, ethyl 2-methylbutyrate, isopropyl 2-methylbutyrate, methyl benzoate, ethyl benzoate, propyl benzoate, butyl benzoate, phenyl acetate, benzyl acetate, methyl phenylacetate, benzyl formate, phenylethyl formate, methyl 3-phenylpropionate, ethyl phenylacetate, and 2-phenylethyl acetate, Suitable ketone solvents include 2-octanone, 3-octanone, 4-octanone, 2-nonanone, 3-nonanone, 4-nonanone, 5-nonanone, diisobutyl ketone, ethylcyclohexanone, ethylacetophenone, ethyl n-butyl ketone, di-n-butyl ketone, and diisobutyl ketone.

For the purpose of preventing intermixing of the shrink agent and the resist pattern, any of $C_3$-$C_{10}$ alcohol, $C_8$-$C_{12}$ ether, $C_6$-$C_{12}$ alkane, alkene, alkyne and aromatic solvents may be added in an amount of 5 to 100 parts by weight per 100 parts by weight of the above solvent. Specifically, suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-pentyl ether, and di-n-hexyl ether. Suitable aromatic solvents include toluene, xylene, ethylbenzene, isopropylbenzene, tert-butylbenzene, mesitylene, and anisole. The solvents may be used alone or in admixture.

In the shrink agent solution, the solvent is preferably used in an amount of 100 to 100,000 parts, more preferably 200 to 50,000 parts by weight per 100 parts by weight of the polymers.

To the shrink agent, a salt and basic compound may be added if desired. The salt that can be added is typically selected from sulfonium salts and iodonium salts which are typically added to resist compositions, and ammonium salts. The basic compound that can be added may be selected from those basic compounds which are typically added to resist compositions, for example, primary, secondary and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives. The addition of the salt or basic compound is effective for suppressing excessive diffusion of acid from within the resist film and for controlling the amount of shrinkage. The surfactant that can be added may be selected from those surfactants which are typically added to resist compositions.

As the salt, a salt compound having the general formula (4) is preferred.

$$R^{27}-CO_2^-M^+ \quad (4)$$

Herein $R^{27}$ is a straight, branched or cyclic $C_1$-$C_{20}$ alkyl group, $C_2$-$C_{20}$ alkenyl group or $C_6$-$C_{20}$ aryl group which may contain fluorine, ether moiety, ester moiety, lactone ring, lactam ring, carbonyl moiety or hydroxyl moiety, and M is sulfonium, iodonium or ammonium.

Examples of the anion: $R^{27}-CO_2^-$ are shown below.

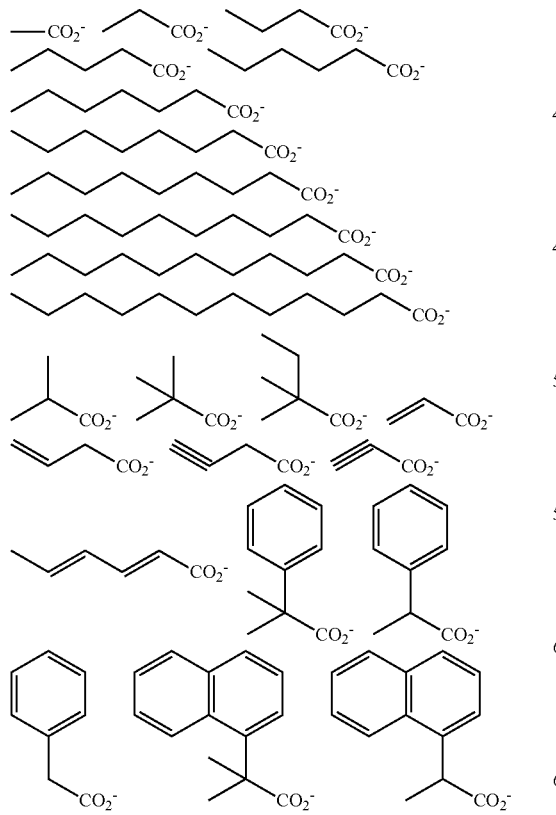

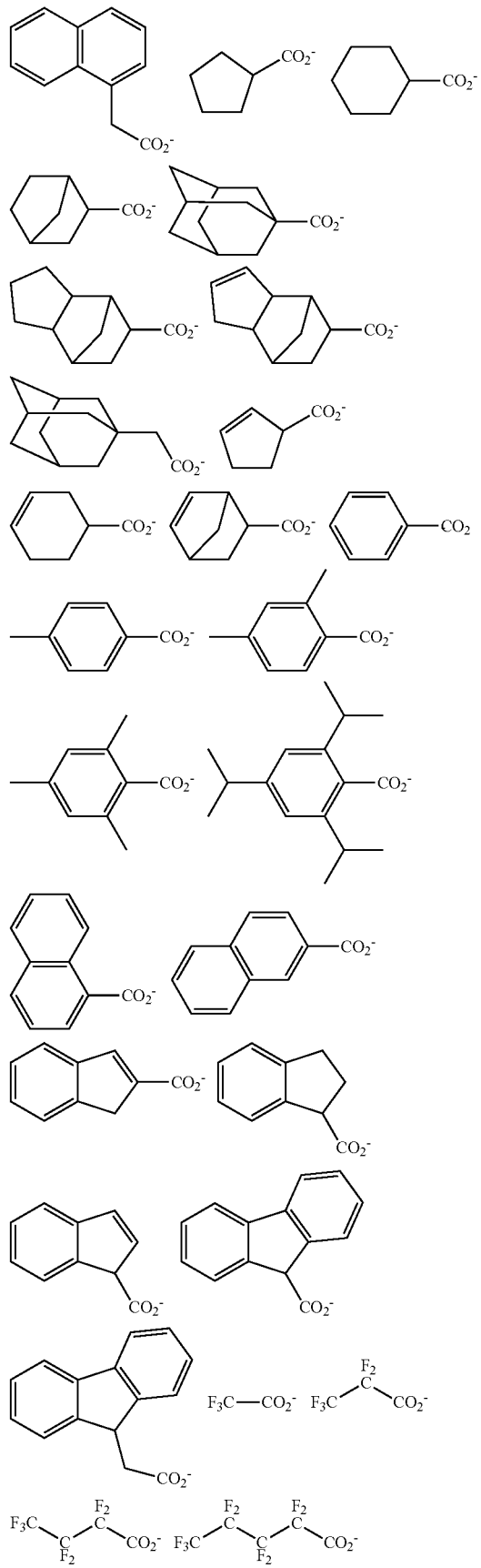

-continued

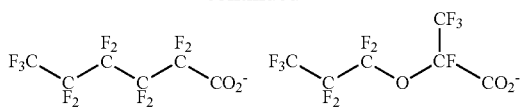
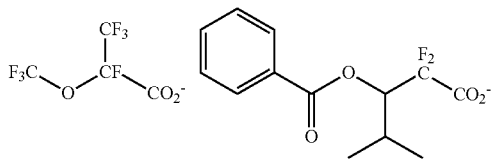
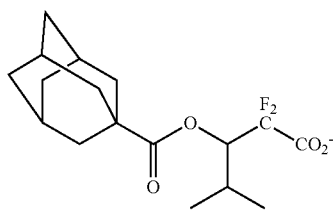
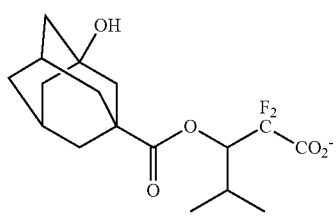
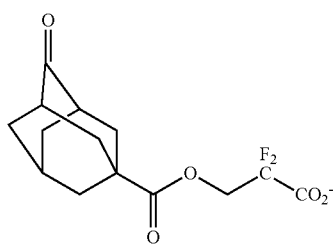
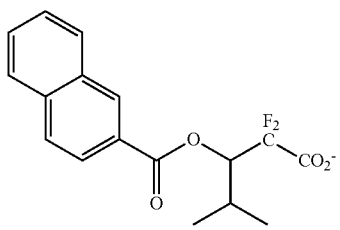
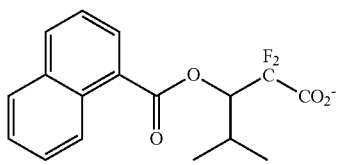
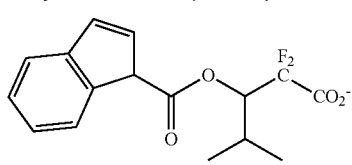
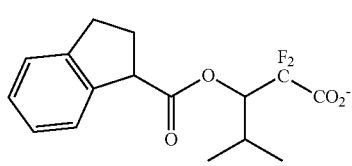

-continued

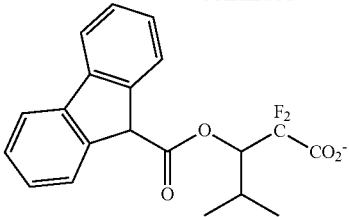
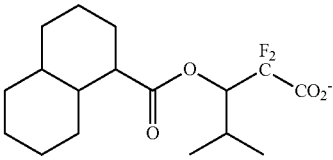
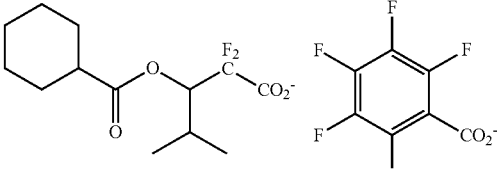
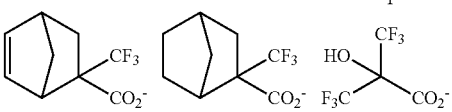

Of the salt compounds of formula (4), sulfonium, iodonium and ammonium salts of carboxylic acid represented by formulae (P1a-1) to (P1a-3) are preferred. Acid diffusion may be effectively controlled by adding these salts.

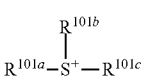
(P1a-1)

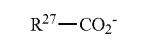
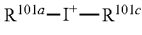
(P1a-2)

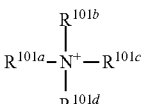
(P1a-3)

Herein $R^{101a}$, $R^{101b}$, $R^{101c}$ and $R^{101d}$ are each independently a straight, branched or cyclic $C_1$-$C_{12}$ alkyl, alkenyl, oxoalkyl or oxoalkenyl, $C_6$-$C_{20}$ aryl, or $C_7$-$C_{12}$ aralkyl or aryloxoalkyl group, in which some or all hydrogen atoms may be replaced by alkoxy or other groups. $R^{101b}$ and $R^{101c}$ may bond together to form a ring which may contain an ether, ester, sultone or amino moiety, each of $R^{101b}$ and $R^{101c}$ is $C_1$-$C_{10}$ alkylene or arylene when they form a ring. $R^{27}$ is as defined above.

In the shrink agent, preferably the salt is used in an amount of 0 to 50 parts by weight, the basic compound is used in an amount of 0 to 30 parts by weight, and the surfactant is used in an amount of 0 to 10 parts, more preferably 0 to 5 parts by weight, all per 100 parts by weight of the first and second polymers combined. When added, each additive is preferably used in an amount of at least 0.1 part by weight.

The resist composition comprises the polymer as base resin, an organic solvent, and an acid generator (i.e., compound capable of generating an acid in response to high-energy radiation), and optionally, a dissolution regulator, basic compound, surfactant, acetylene alcohol, and other components.

Specifically, the resist composition contains an acid generator such that it may function as a chemically amplified resist composition. The acid generator is typically a compound capable of generating an acid in response to actinic light or radiation, known as photoacid generator (PAG). An appropriate amount of the PAG used is 0.5 to 30 parts, more preferably 1 to 20 parts by weight per 100 parts by weight of the base resin. The PAG is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The acid generators may be used alone or in admixture of two or more. Exemplary of the acid generated by PAG are sulfonic acids, imidic acids and methide acids. Of these, sulfonic acids which are fluorinated at α-position are most commonly used. Where the acid labile group is an acetal group susceptible to deprotection, fluorination at α-position is not always necessary. Where the base polymer has recurring units of acid generator copolymerized therein, the acid generator need not be separately added.

Examples of the organic solvent used herein are described in JP-A 2008-111103, paragraphs [0144] to [0145](U.S. Pat. No. 7,537,880). Specifically, exemplary solvents include ketones such as cyclohexanone and methyl-2-n-pentyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, and mixtures thereof. Where an acid labile group of acetal form is used, a high-boiling alcohol solvent such as diethylene glycol, propylene glycol, glycerol, 1,4-butanediol or 1,3-butanediol may be added for accelerating deprotection reaction of acetal.

Exemplary basic compounds include primary, secondary and tertiary amine compounds, specifically amine compounds having a hydroxyl, ether, ester, lactone, cyano or sulfonate group, as described in JP-A 2008-111103, paragraphs [0146] to [0164], and compounds having a carbamate group, as described in JP 3790649. Also, onium salts such as sulfonium salts, iodonium salts and ammonium salts of sulfonic acids which are not fluorinated at α-position as described in US 2008153030 (JP-A 2008-158339) and similar onium salts of carboxylic acid as described in JP 3991462 and JP 4226803 may be used as the quencher. They may also be added to the shrink agent.

Where the acid labile group is an acetal group which is very sensitive to acid, the acid for eliminating the protective group need not necessarily be a sulfonic acid which is fluorinated at α-position, imidic acid or methide acid. Even with a sulfonic acid which is not fluorinated at α-position, deprotection reaction may take place in some cases. Since an onium salt of sulfonic acid cannot be used as the quencher in this event, an onium salt of imidic acid is preferably used alone.

Exemplary surfactants are described in JP-A 2008-111103, paragraphs [0165]-[0166]. Exemplary dissolution regulators are described in JP-A 2008-122932 (US 2008090172), paragraphs [0155]-[0178], and exemplary acetylene alcohols in paragraphs [0179]-[0182].

Also a polymeric additive may be added for improving the water repellency on surface of a resist film as spin coated. This additive may be used in the topcoatless immersion lithography. These additives have a specific structure with a 1,1,1,3,3,3-hexafluoro-2-propanol residue and are described in JP-A 2007-297590 and JP-A 2008-111103. The water repellency improver to be added to the resist composition should be soluble in the organic solvent as the developer. The water repellency improver of specific structure with a 1,1,1,3,3,3-hexafluoro-2-propanol residue is well soluble in the developer. A polymer having an amino group or amine salt copolymerized as recurring units may serve as the water repellent additive and is effective for preventing evaporation of acid during PEB and avoiding any hole pattern opening failure after development. An appropriate amount of the water repellency improver is 0.1 to parts, preferably 0.5 to 10 parts by weight per 100 parts by weight of the base resin.

Notably, an appropriate amount of the organic solvent is 100 to 10,000 parts, preferably 300 to 8,000 parts by weight, and an appropriate amount of the basic compound is 0.0001 to 30 parts, preferably 0.001 to 20 parts by weight, per 100 parts by weight of the base resin. The dissolution regulator, surfactant and acetylene alcohol may be used in any suitable amounts, depending on their purpose of addition.

Figure 2E:
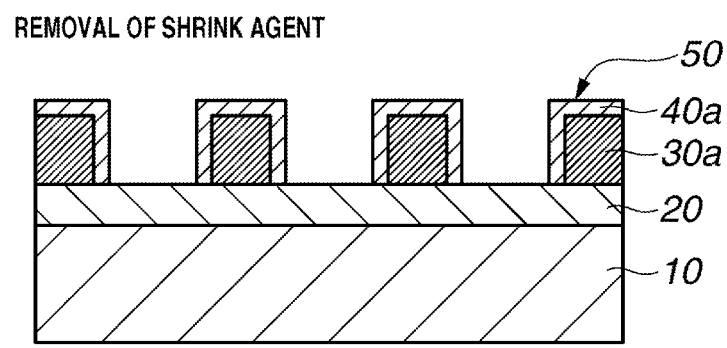
Figure 2F:
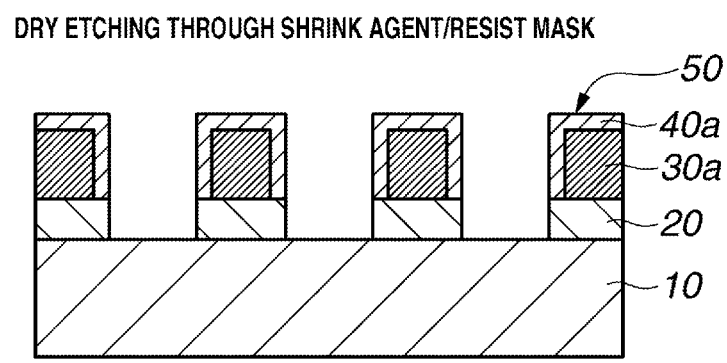

Referring to FIG. 1(A) to FIG. 1(C) and FIG. 2(D) to FIG. 2(F), the pattern shrinking process of the invention is described. First, as shown in FIG. 1(A), a chemically amplified resist composition is applied onto a processable substrate 20 on a substrate 10 to form a photoresist film 30 thereon. If necessary, a hard mask layer (not shown) may intervene between the resist film 30 and the processable substrate 20. By standard techniques, the resist film 30 is subjected to exposure (FIG. 1(B)), PEB, and organic solvent development to form a negative resist pattern 30a (FIG. 1(C)). A shrink agent 40 is applied onto the negative resist pattern 30a to cover the pattern as shown in FIG. 2(D). The shrink agent coating is baked, during which the heat functions to cause the acid to diffuse from the resist pattern 30a into the shrink agent coating 40. With the acid, the polymer in the shrink agent coating undergoes deprotection reaction. Thereafter, a solvent is applied to remove the excessive shrink agent 40, leaving a shrink agent film 40a over the resist pattern 30a. This means that the resist pattern 30a is thickened at 50, that is, the width of spaces in the resist pattern is shrunk as shown in FIG. 2(E). Using the shrunk pattern 50 as a mask, the processable substrate 20 is dry etched as shown in FIG. 2(F).

The substrate 10 used herein is generally a silicon substrate. The processable substrate (or target film) 20 used herein includes $SiO_2$, SiN, SiON, SiOC, p-Si, α-Si, TiN, WSi, BPSG, SOG, Cr, CrO, CrON, MoSi, low dielectric film, and etch stopper film. The hard mask may be of $SiO_2$, SiN, SiON or p-Si. Sometimes, an undercoat in the form of carbon film or a silicon-containing intermediate film may be laid instead of the hard mask, and an organic antireflective coating may be interposed between the hard mask and the resist film.

While a resist film 30 of a resist composition is formed on a processable substrate 20 on a substrate 10 directly or via an intermediate intervening layer as mentioned above, the resist film preferably has a thickness of 10 to 1,000 nm and more preferably 20 to 500 nm. Prior to exposure, the resist film is heated or prebaked, preferably at a temperature of 50 to 180° C., especially 60 to 150° C. for a time of 10 to 300 seconds, especially 15 to 200 seconds.

Next the resist film is exposed. For the exposure, preference is given to high-energy radiation having a wavelength of 140 to 250 nm, especially ArF excimer laser radiation of 193 nm. The exposure may be done either in a dry atmosphere such as air or nitrogen stream or by immersion lithography in water. The ArF immersion lithography uses deionized water or liquids having a refractive index of at least 1 and highly transparent to the exposure wavelength such as alkanes as the immersion solvent. In the immersion lithography, the prebaked resist film is exposed to light through a projection lens, with pure water or another liquid introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective film may be applied onto the resist film after pre-baking for preventing any leach-out from the resist film and improving water slip on the film surface. The resist protective film used in the immersion lithography is preferably formed from a solution of a polymer having 1,1,1,3,3,3-hexafluoro-2-propanol residues which is insoluble in water, but soluble in an alkaline developer liquid, in a solvent selected from alcohols of 4 to 10 carbon atoms, ethers of 8 to 12 carbon atoms, and mixtures thereof. After formation of the photoresist film, deionized water rinsing (or post-soaking) may be carried out for extracting the acid generator and the like from the film surface or washing away particles, or after exposure, rinsing (or post-soaking) may be carried out for removing water droplets left on the resist film.

Exposure is preferably performed in an exposure dose of about 1 to 200 mJ/cm$^2$, more preferably about 10 to 100 mJ/cm$^2$. This is followed by baking (PEB) on a hot plate at 50 to 150° C. for 1 to 5 minutes, preferably at 60 to 120° C. for 1 to 3 minutes.

Thereafter the exposed resist film is developed with a developer consisting of an organic solvent for 0.1 to 3 minutes, preferably 0.5 to 2 minutes by any conventional techniques such as dip, puddle and spray techniques. In this way, a negative resist pattern is formed on the substrate.

The organic solvent used as developer is preferably selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

At the end of development, the resist film may be rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-pentyl ether, and di-n-hexyl ether. Suitable aromatic solvents include toluene, xylene, ethylbenzene, isopropylbenzene, t-butylbenzene, and mesitylene. The solvents may be used alone or in admixture.

After the rinse liquid is applied, the substrate may be dried by spin drying and bake. However, rinsing is not essential. As long as the step of spin drying the substrate after the developer is applied thereto is included, the rinsing step may be omitted.

Following the development, the shrink agent of the invention is applied onto the resist pattern to form a shrink agent coating, preferably having a thickness of 1 to 100 nm, more preferably 1.5 to 50 nm. The shrink agent coating is baked at a temperature of 40 to 180° C. for 5 to 300 seconds. Bake functions to evaporate off the solvent and to induce acid diffusion from the resist film to the shrink agent and deprotection reaction to generate carboxyl or hydroxyl groups in the shrink agent coating, for thereby rendering the shrink agent coating insoluble in the organic solvent developer due to a polarity change by the generated carboxyl or hydroxyl groups.

The organic solvent used for stripping of the excessive shrink agent may be identical with the organic solvent used as the developer. This means that development of the resist film and removal of the shrink agent can be performed with an identical organic solvent. Advantageously the nozzle needed is only one.

EXAMPLE

Examples of the invention are given below by way of illustration and not by way of limitation. The abbreviation "pbw" is parts by weight, and PGMEA is propylene glycol monomethyl ether acetate. For all polymers, Mw and Mn are determined by GPC versus polystyrene standards.

Synthesis Example

Polymers (for use in shrink agent and resist composition) were synthesized by combining suitable monomers in tetrahydrofuran solvent, effecting copolymerization reaction, crystallizing from methanol, repeatedly washing with hexane, isolation and drying. There were obtained polymers, designated Polymers 1-1 to 1-16 (as first polymer), Polymers 2-1 to 2-10 (as second polymer), Resist Polymer 1, and Water-repellent Polymer 1. The polymers were analyzed for composition by ¹H-NMR spectroscopy and for Mw and Mw/Mn by GPC. The polymers are identified below with their analytical data.

Polymer 1-1

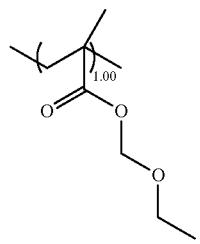

Mw = 9,800
Mw/Mn = 1.94

Polymer 1-2

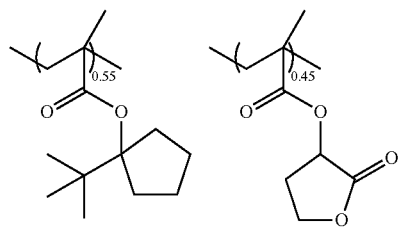

Mw = 9,100
Mw/Mn = 1.78

Polymer 1-3

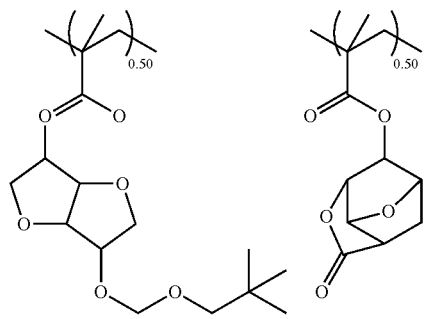

Mw = 7,800
Mw/Mn = 1.88

Polymer 1-4

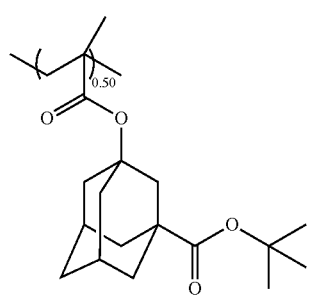

-continued

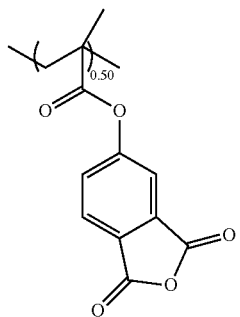

Mw = 9,500
Mw/Mn = 1.71

Polymer 1-5

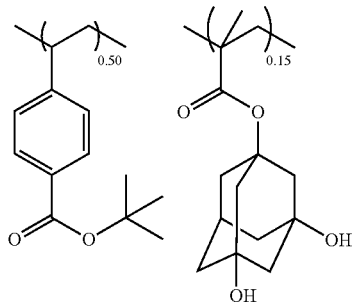

Polymer 1-6

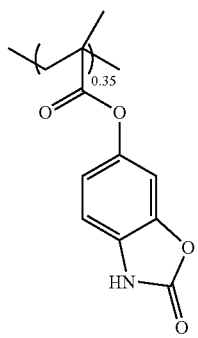

Mw = 9,100
Mw/Mn = 1.78

Polymer 1-6

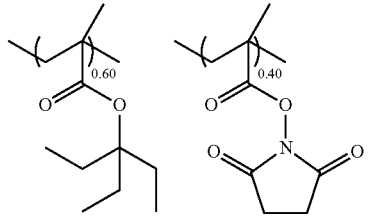

Mw = 8,800
Mw/Mn = 1.88

-continued
Polymer 1-7
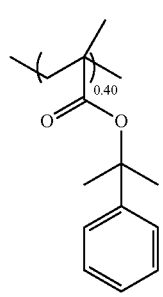
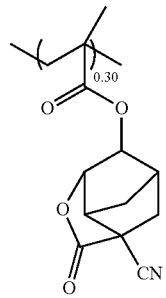
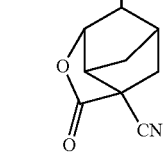
Mw = 8,200
Mw/Mn = 1.84
Polymer 1-8
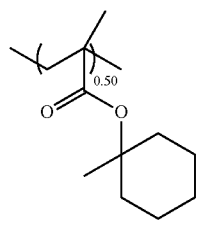
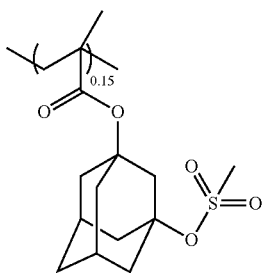
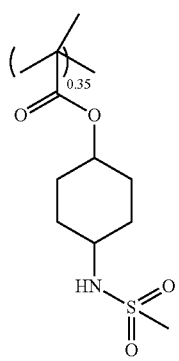
Mw = 8,300
Mw/Mn = 1.88
Polymer 1-9
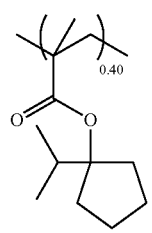
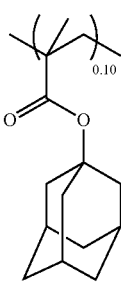
Polymer 1-7
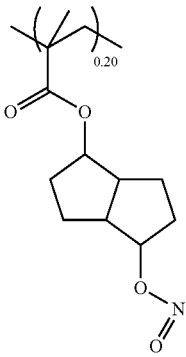
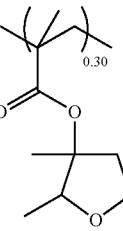
Mw = 8,400
Mw/Mn = 1.68
Polymer 1-10
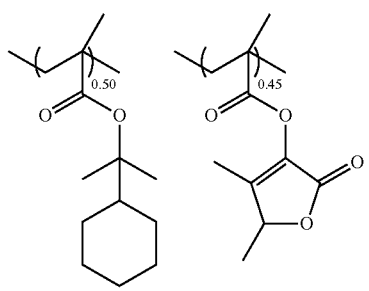
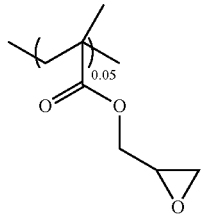
Mw = 9,200
Mw/Mn = 1.71
Polymer 1-11
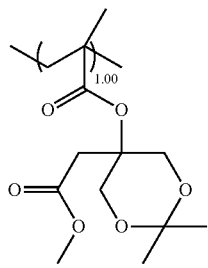
Mw = 9,100
Mw/Mn = 1.67

-continued
Polymer 1-12
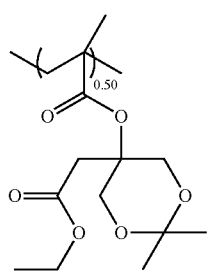
Mw = 9,100
Mw/Mn = 1.78
Polymer 1-13
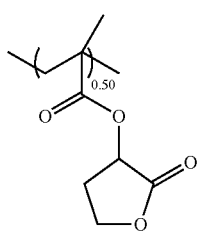
Mw = 7,100
Mw/Mn = 1.82
Polymer 1-14
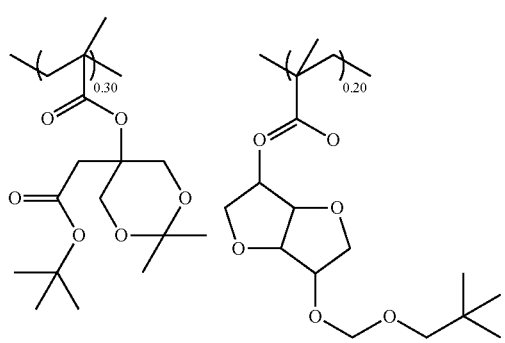
-continued
Polymer 1-12
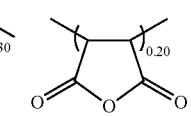
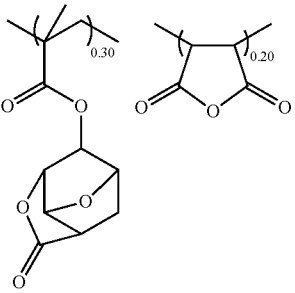
Mw = 7,200
Mw/Mn = 1.77
Polymer 1-15
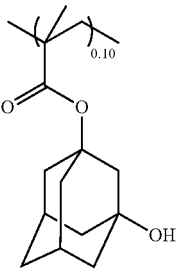
Mw = 9,700
Mw/Mn = 1.9
Polymer 1-16
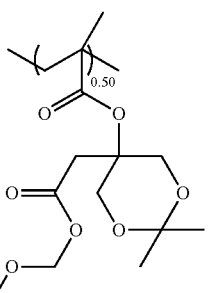 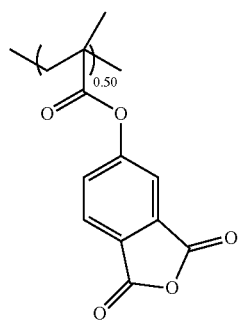
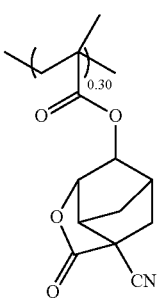
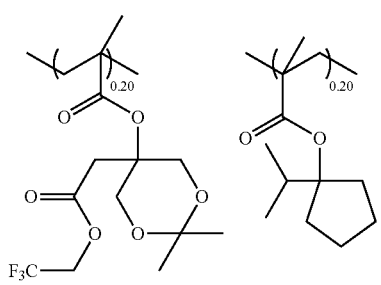
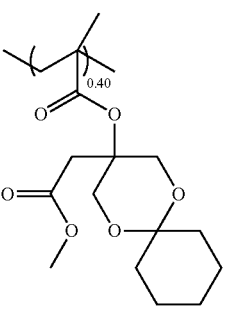 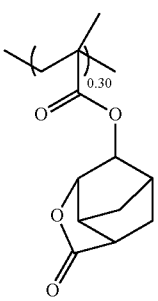
Mw = 8,300
Mw/Mn = 1.84

-continued
Polymer 2-1
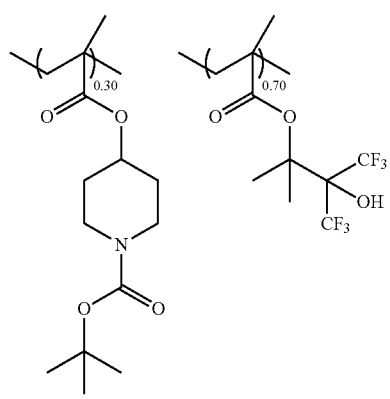
Mw = 8,600
Mw/Mn = 1.81
Polymer 2-2
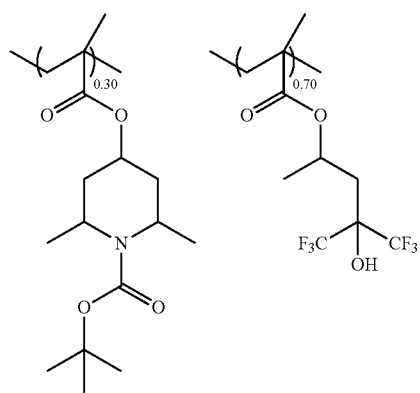
Mw = 8,900
Mw/Mn = 1.62
Polymer 2-3
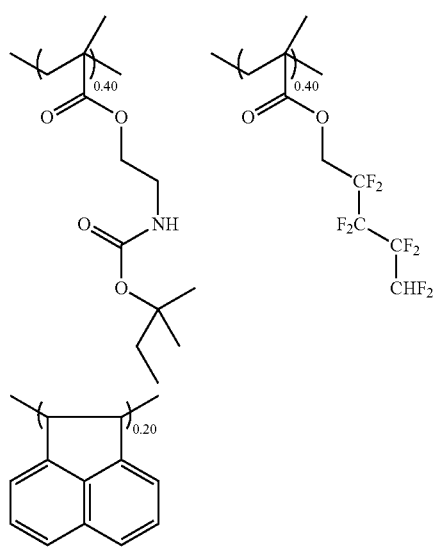
Mw = 8,600
Mw/Mn = 1.69
-continued
Polymer 2-4
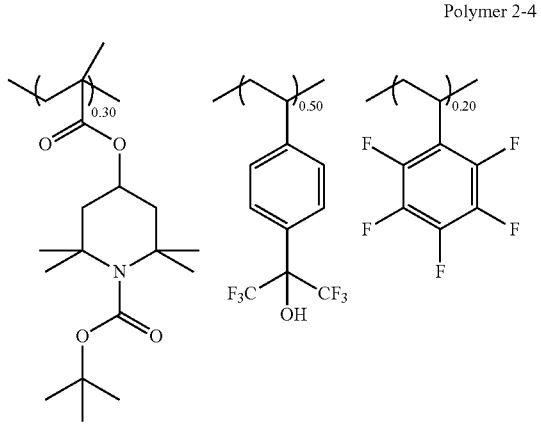
Mw = 9,100
Mw/Mn = 1.61
Polymer 2-5
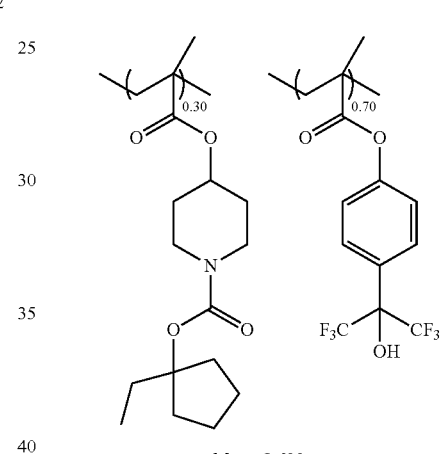
Mw = 8,600
Mw/Mn = 1.81
Polymer 2-6
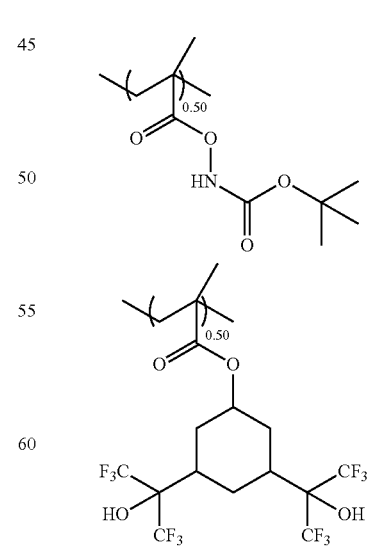
Mw = 8,600
Mw/Mn = 1.61

Polymer 2-7
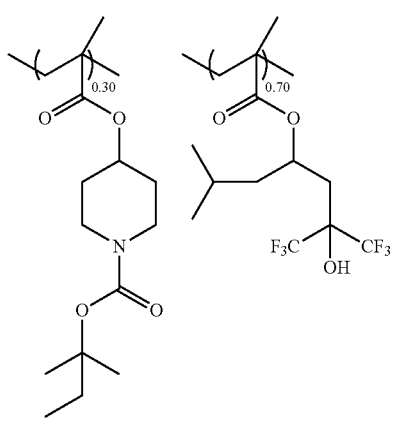
Mw = 8,100
Mw/Mn = 1.60
Polymer 2-8
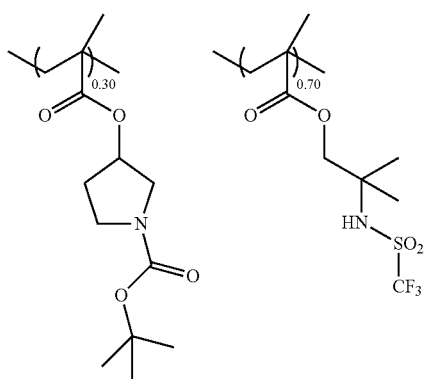
Mw = 9,600
Mw/Mn = 1.63
Polymer 2-9
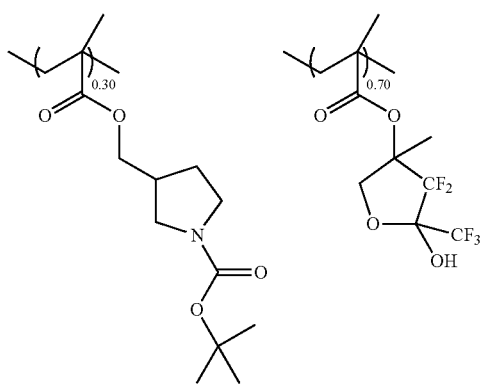
Mw = 7,800
Mw/Mn = 1.55
Polymer 2-10
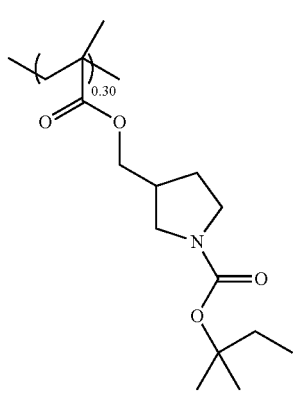
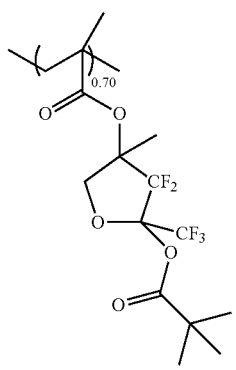
Mw = 7,600
Mw/Mn = 1.53
Resist Polymer 1
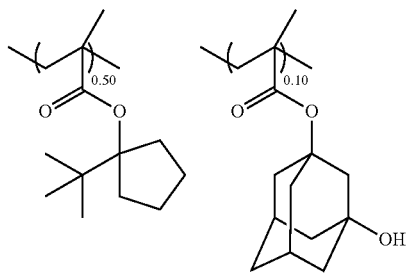
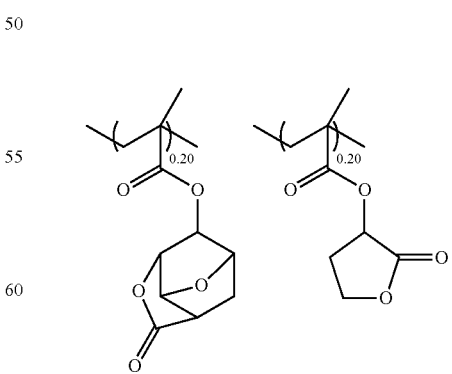
Mw = 7,500
Mw/Mn = 1.61

Water-repellent Polymer 1

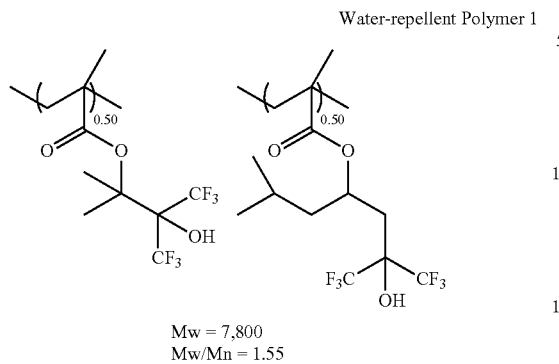

Mw = 7,800
Mw/Mn = 1.55

Examples 1 to 28 and Comparative Examples 1 to 3

A shrink agent solution was prepared by mixing the polymers synthesized above (Polymers 1-1 to 1-16 and Polymers 2-1 to 2-10), an additive (e.g., sulfonium salt, iodonium salt, ammonium salt or amine compound), and solvent in accordance with the formulation of Tables 1 and 2, and filtering through a Teflon® filter having a pore size of 0.2 μm. Components shown in Tables 1 and 2 are identified below. Acid generator: PAG1 of the following structural formula

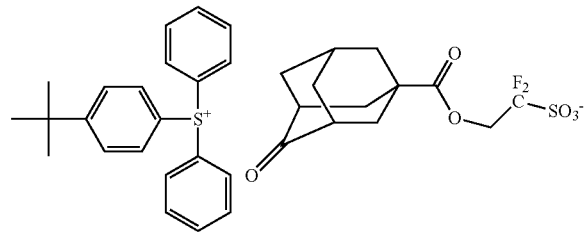

PAG 1

Sulfonium salts 1, 2, Iodonium salt 1, Ammonium salt 1 and Amine quenchers 1, 2 of the following structural formulae

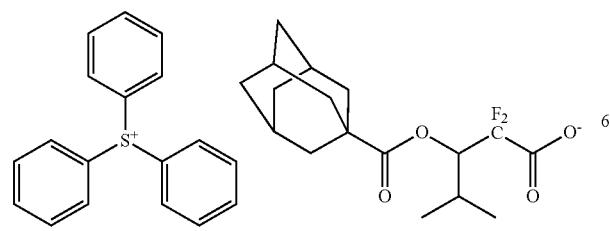

Sulfonium salt 1

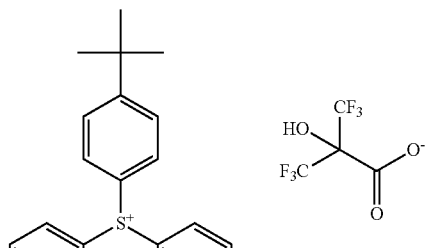

Sulfonium salt 2

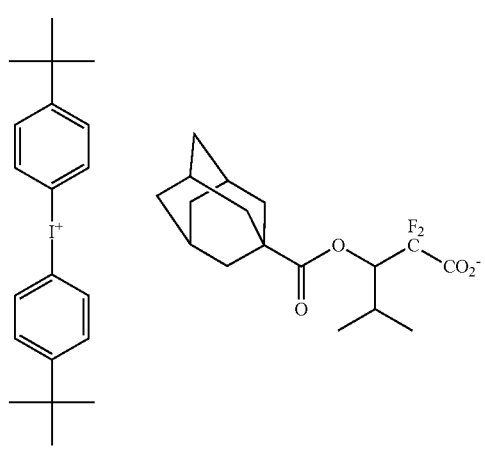

Iodonium salt 1

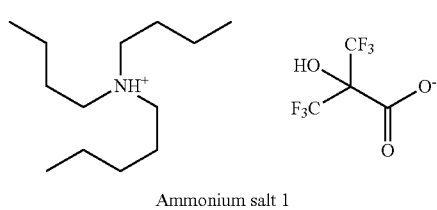

Ammonium salt 1

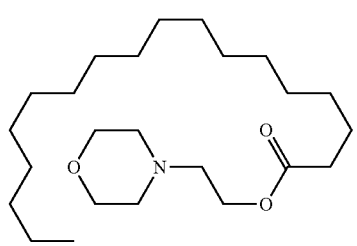

Amine quencher 1

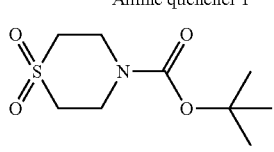

Amine quencher 2

TABLE 1

| Shrink agent | | Polymer 1 (pbw) | Polymer 2 (pbw) | Additive (pbw) | Organic solvent (pbw) |
|---|---|---|---|---|---|
| Shrink agent | 1 | Polymer 1-1 (90) | Polymer 2-1 (10) | — | isopentyl acetate(6,000) |
| | 2 | Polymer 1-2 (90) | Polymer 2-1 (10) | Sulfonium salt 1 (1.0) | isopentyl acetate(6,000) |
| | 3 | Polymer 1-3 (90) | Polymer 2-1 (10) | Sulfonium salt 1 (1.0) | isopentyl acetate(6,000) |
| | 4 | Polymer 1-4 (90) | Polymer 2-1 (10) | Sulfonium salt 1 (1.0) | isopentyl acetate(6,000) |
| | 5 | Polymer 1-5 (90) | Polymer 2-1 (10) | Sulfonium salt 1 (1.0) | isopentyl acetate(6,000) |
| | 6 | Polymer 1-6 (90) | Polymer 2-1 (10) | Sulfonium salt 1 (1.0) | isopentyl acetate(6,000) |
| | 7 | Polymer 1-7 (90) | Polymer 2-1 (10) | Sulfonium salt 1 (1.0) | isopentyl acetate(6,000) |
| | 8 | Polymer 1-8 (70) | Polymer 2-1 (10) | Sulfonium salt 1 (1.0) | ethyl 2-methylvalerate(600) |
| | 9 | Polymer 1-9 (90) | Polymer 2-1 (10) | Sulfonium salt 1 (1.0) | 2-methylbutyl acetate(600) |
| | 10 | Polymer 1-10 (90) | Polymer 2-1 (10) | Sulfonium salt 1 (1.0) | n-pentyl acetate(600) |
| | 11 | Polymer 1-11 (90) | Polymer 2-1 (10) | Sulfonium salt 1 (1.0) | n-hexyl acetate(400) 2-nonanone(200) |
| | 12 | Polymer 1-12 (90) | Polymer 2-1 (10) | Sulfonium salt 1 (1.0) | 3-methylbutyl butyrate(500) anisole(100) |
| | 13 | Polymer 1-13 (90) | Polymer 2-1 (10) | Sulfonium salt 1 (1.0) | ethyl hexanoate(500) diisopentyl ether(100) |
| | 14 | Polymer 1-14 (90) | Polymer 2-1 (10) | Sulfonium salt 2 (1.0) | ethyl 2-methylbutyrate(400) isopentyl isobutyrate(200) |
| | 15 | Polymer 1-15 (90) | Polymer 2-1 (10) | Sulfonium salt 1 (1.0) | allyl hexanoate(300) ethyl 2-methylbutyrate(300) |
| | 16 | Polymer 1-16 (90) | Polymer 2-1 (10) | Sulfonium salt 1 (1.0) | allyl hexanoate(300) ethyl 2-methylbutyrate(300) |
| | 17 | Polymer 1-2 (90) | Polymer 2-2 (10) | Sulfonium salt 1 (1.0) | isopentyl acetate(6,000) |
| | 18 | Polymer 1-2 (96) | Polymer 2-3 (10) | Sulfonium salt 1 (1.0) | isopentyl acetate(6,000) |
| | 19 | Polymer 1-2 (90) | Polymer 2-4 (10) | Sulfonium salt 1 (1.0) | isopentyl acetate(6,000) |
| | 20 | Polymer 1-2 (90) | Polymer 2-5 (10) | Sulfonium salt 1 (1.0) | isopentyl acetate(6,000) |
| | 21 | Polymer 1-2 (90) | Polymer 2-6 (10) | Amine quencher 1 (0.2) | isopentyl acetate(6,000) |

TABLE 2

| Shrink agent | | Polymer 1 (pbw) | Polymer 2 (pbw) | Additive (pbw) | Organic solvent (pbw) |
|---|---|---|---|---|---|
| Shrink agent | 22 | Polymer 1-2 (90) | Polymer 2-7 (10) | Sulfonium salt 1 (1.0) | isopentyl acetate(6,000) |
| | 23 | Polymer 1-2 (90) | Polymer 2-8 (10) | Sulfonium salt 1 (1.0) | isopentyl acetate(6,000) |
| | 24 | Polymer 1-2 (90) | Polymer 2-9 (10) | Sulfonium salt 1 (1.0) | isopentyl acetate(6,000) |
| | 25 | Polymer 1-2 (90) | Polymer 2-10 (10) | Sulfonium salt 2 (1.0) | isopentyl acetate(6,000) |
| | 26 | Polymer 1-2 (90) | Polymer 2-2 (10) | Iodonium salt 1 (1.0) | isopentyl acetate(6,000) |
| | 27 | Polymer 1-2 (90) | Polymer 2-2 (10) | Ammonium salt 1 (1.0) | isopentyl acetate(6,000) |
| | 28 | Polymer 1-2 (90) | Polymer 2-2 (10) | Amine quencher 2 (0.2) | isopentyl acetate(6,000) |
| Comparative shrink agent | 1 | Polymer 1-2 (100) | — | Sulfonium salt 1 (2.0) | isopentyl acetate(6,000) |
| | 2 | — | Polymer 2-2 (100) | Sulfonium salt 1 (2.0) | isopentyl acetate(6,000) |
| | 3 | Polymer 1-2 (90) | Polymer 2-2 (10) | Sulfonium salt 1 (2.0) | PGMEA(6,000) |

Preparation of Resist Composition

A resist composition in solution form was prepared by dissolving a polymer (Resist Polymer 1), acid generator, quencher, and water-repellent polymer in a solvent in accordance with the formulation of Table 3, and filtering through a filter with a pore size of 0.2 µm. The solvent contained 100 ppm of surfactant FC-4430 (3M-Sumitomo Co., Ltd.).

TABLE 3

| Resist | Polymer (pbw) | Acid generator (pbw) | Quencher (pbw) | Water repellent (pbw) | Organic solvent (pbw) |
|---|---|---|---|---|---|
| Resist 1 | Resist Polymer 1 (100) | PAG1 (10.0) | Amine quencher 1 (2.0) | Water-repellent polymer 1 (3.0) | PGMEA (2,500) γ-butyrolactone (200) |

ArF Lithoqraphy Patterning Test

On a silicon wafer, a spin-on carbon film ODL-102 (Shin-Etsu Chemical Co., Ltd.) was deposited to a thickness of 200 nm and a silicon-containing spin-on hard mask SHB-A940 was deposited thereon to a thickness of 35 nm. On this substrate for trilayer process, the resist composition in Table 3 was spin coated, then baked on a hot plate at 100° C. for 60 seconds to form a resist film of 100 nm thick. Using an ArF excimer laser immersion lithography scanner NSR-610C (Nikon Corp., NA 1.30, σ 0.98/0.78, crosspole illumination opening 35 degrees, azimuthally polarized illumination), the resist film was exposed through a 6% halftone phase shift mask while varying the exposure dose. After the exposure, the resist film was baked (PEB) at 90° C. for 60 seconds and puddle developed in n-butyl acetate for 30 seconds to form a hole pattern having a pitch of 110 nm and a hole size of 50 nm. The shrink agent shown in Tables 1 and 2 was applied onto the resist pattern after development to cover the pattern. The shrink agent coating was baked at the temperature shown in Tables 4 and 5 for 60 seconds. This was followed by puddle development in n-butyl acetate for 20 seconds to remove the excessive shrink agent. Both after development and after shrink treatment, the hole pattern was observed under a CD-SEM (CG-4000 by Hitachi, Ltd.). The size of 50 holes with a pitch of 110 nm was measured, from which the average hole size and hole size variation (indicative of CD uniformity of holes) were calculated. The results are shown in Tables 4 and 5.

TABLE 4

|  |  | Resist | Pattern size after development (nm) | Variation of hole size after development (3σ, nm) | Shrink agent | Bake temp. (° C.) | Pattern size after removal of shrink agent (nm) | Variation of hole size after removal of shrink agent (3σ, nm) |
|---|---|---|---|---|---|---|---|---|
| Example | 1 | Resist 1 (100) | 50 | 2.7 | Shrink agent 1 | 125 | 38 | 2.7 |
|  | 2 | Resist 1 (100) | 50 | 2.6 | Shrink agent 2 | 135 | 38 | 2.1 |
|  | 3 | Resist 1 (100) | 50 | 2.7 | Shrink agent 3 | 133 | 35 | 2.2 |
|  | 4 | Resist 1 (100) | 50 | 2.7 | Shrink agent 4 | 130 | 37 | 2.3 |
|  | 5 | Resist 1 (100) | 52 | 2.7 | Shrink agent 5 | 135 | 38 | 2.2 |
|  | 6 | Resist 1 (100) | 49 | 2.7 | Shrink agent 6 | 130 | 33 | 2.2 |
|  | 7 | Resist 1 (100) | 52 | 2.7 | Shrink agent 7 | 140 | 38 | 2.3 |
|  | 8 | Resist 1 (100) | 50 | 2.7 | Shrink agent 8 | 130 | 34 | 2.2 |
|  | 9 | Resist 1 (100) | 51 | 2.7 | Shrink agent 9 | 135 | 37 | 2.3 |
|  | 10 | Resist 1 (100) | 52 | 2.5 | Shrink agent 10 | 135 | 38 | 2.2 |
|  | 11 | Resist 1 (100) | 53 | 2.7 | Shrink agent 11 | 130 | 37 | 2.4 |
|  | 12 | Resist 1 (100) | 54 | 2.7 | Shrink agent 12 | 135 | 32 | 2.3 |
|  | 13 | Resist 1 (100) | 52 | 2.7 | Shrink agent 13 | 130 | 33 | 2.6 |
|  | 14 | Resist 1 (100) | 51 | 2.7 | Shrink agent 14 | 130 | 37 | 2.2 |
|  | 15 | Resist 1 (100) | 52 | 2.5 | Shrink agent 15 | 136 | 37 | 2.6 |
|  | 16 | Resist 1 (100) | 50 | 2.5 | Shrink agent 16 | 130 | 36 | 2.8 |
|  | 17 | Resist 1 (100) | 55 | 2.8 | Shrink agent 17 | 136 | 32 | 2.7 |
|  | 18 | Resist 1 (100) | 50 | 2.9 | Shrink agent 18 | 130 | 31 | 2.5 |
|  | 19 | Resist 1 (100) | 53 | 2.8 | Shrink agent 19 | 130 | 32 | 2.4 |
|  | 20 | Resist 1 (100) | 52 | 2.7 | Shrink agent 20 | 130 | 39 | 2.6 |
|  | 21 | Resist 1 (100) | 50 | 2.9 | Shrink agent 21 | 130 | 38 | 2.8 |

TABLE 5

|  | Resist | Pattern size after development (nm) | Variation of hole size after development (3σ, nm) | Shrink agent | Bake temp. (° C.) | Pattern size after removal of shrink agent (nm) | Variation of hole size after removal of shrink agent (3σ, nm) |
|---|---|---|---|---|---|---|---|
| Example | 22 Resist 1 (100) | 51 | 2.7 | Shrink agent 22 | 130 | 23 | 2.7 |
|  | 23 Resist 1 (100) | 52 | 2.6 | Shrink agent 23 | 130 | 28 | 2.5 |
|  | 24 Resist 1 (100) | 49 | 2.7 | Shrink agent 24 | 130 | 25 | 2.5 |
|  | 25 Resist 1 (100) | 48 | 2.8 | Shrink agent 25 | 130 | 27 | 2.7 |
|  | 26 Resist 1 (100) | 52 | 2.7 | Shrink agent 26 | 130 | 28 | 2.5 |
|  | 27 Resist 1 (100) | 53 | 2.5 | Shrink agent 27 | 130 | 33 | 2.4 |
|  | 28 Resist 1 (100) | 52 | 2.6 | Shrink agent 28 | 130 | 28 | 2.6 |
| Comparative Example | 1 Resist 1 (100) | 48 | 2.9 | Comparative shrink agent 1 | 130 | 26 | 4.1 |
|  | 2 Resist 1 (100) | 52 | 2.8 | Comparative shrink agent 2 | 130 | 47 | 3.2 |
|  | 3 Resist 1 (100) | 51 | 2.7 | Comparative shrink agent 3 | 130 | pattern vanished | — |

While the invention has been illustrated and described in typical embodiments, it is not intended to be limited to the details shown, since various modifications and substitutions can be made without departing in any way from the spirit of the present invention. As such, further modifications and equivalents of the invention herein disclosed may occur to persons skilled in the art using no more than routine experimentation, and all such modifications and equivalents are believed to be within the spirit and scope of the invention as defined by the following claims.

Japanese Patent Application No. 2015-003082 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A pattern forming process comprising the steps of:
applying a resist composition comprising a polymer comprising recurring units having an acid labile group-substituted carboxyl group, an acid generator and an organic solvent onto a substrate,
prebaking to form a resist film,
exposing the resist film to high-energy radiation,
baking the film,
developing the exposed resist film in an organic solvent-based developer to form a negative pattern,
applying a shrink agent onto the negative pattern, the shrink agent being a solution of a first polymer comprising recurring units of at least one type selected from units (a1) to (a4) in general formula (1) and a second polymer comprising recurring units having an amino group protected with an acid labile group, represented by the general formula (2) in an ester solvent of 7 to 16 carbon atoms and/or ketone solvent of 8 to 16 carbon atoms,
baking, and
removing the excessive shrink agent with the organic solvent-based developer for thereby shrinking the size of spaces in the pattern,

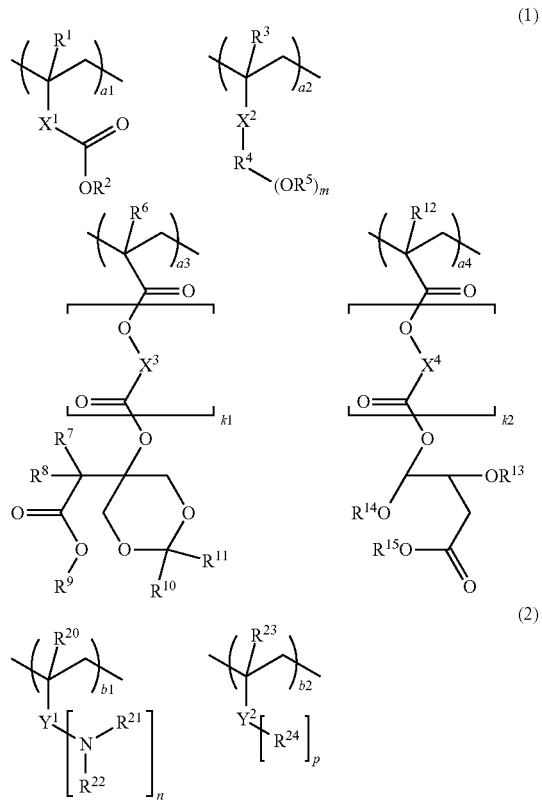

wherein $R^1$, $R^3$, $R^6$, $R^{12}$, $R^{20}$ and $R^{23}$ each are hydrogen or methyl, $R^2$, $R^5$, $R^{14}$ and $R^{22}$ each are an acid labile group, $X^1$ is a single bond, a phenylene or naphthylene group, or —C(=O)—O—$R^{16}$—, $R^{16}$ is a straight, branched or cyclic $C_1$-$C_{10}$ alkylene group which may contain ether, ester, lactone ring or hydroxyl, or a phenylene or naphthylene group, $X^2$ is a single bond, a phenylene or naphthylene group which may contain nitro, cyano or halogen, or —C(=O)—O—$R^{17}$—, —C(=O)—NH—$R^{17}$—, —O—$R^{17}$—, or —S—$R^{17}$—, $R^{17}$ is a straight, branched or cyclic $C_1$-$C_{10}$ alkylene group which may contain ether, ester, lactone ring or hydroxyl, or a phenylene or naphthylene group which may contain a straight, branched or cyclic $C_1$-$C_6$ alkyl, alkoxy, acyl, acyloxy, $C_2$-$C_6$ alkenyl, alkoxycarbonyl, $C_6$-$C_{10}$ aryl, nitro, cyano, or halogen, $R^4$ is a single bond, a di to penta-valent, straight, branched or cyclic $C_1$-$C_{16}$ aliphatic hydrocarbon group, or phenylene group, which may contain ether or ester, m is 1 to 4, $R^7$ and $R^8$ are each independently hydrogen, fluorine, or a straight, branched or cyclic $C_1$-$C_8$ monovalent hydrocarbon group, $R^9$, $R^{13}$ and $R^{15}$ each are hydrogen, or a straight, branched or cyclic $C_1$-$C_{20}$ monovalent hydrocarbon group in which any constituent —$CH_2$— moiety may be replaced by —O— or —C(=O)—, or whose hydrogen may be replaced by halogen, $R^{10}$ and $R^{11}$ are each independently hydrogen, or a straight, branched or cyclic $C_1$-$C_8$ monovalent hydrocarbon group, or $R^{10}$ and $R^{11}$ may bond together to form a $C_3$-$C_{17}$ non-aromatic ring with the carbon atom to which they are attached, $X^3$ and $X^4$ each are a straight, branched or cyclic $C_1$-$C_{20}$ divalent hydrocarbon group in which any constituent —$CH_2$— moiety may be replaced by —O— or —C(=O)—, $k^1$ and $k^2$ each are 0 or 1, $Y^1$ is a single bond, phenylene group or —C(=O)—O—$R^{25}$—, $R^{25}$ is a single bond, a straight, branched or cyclic $C_1$-$C_{10}$ alkylene group which may contain ether, ester, —N= or —S—, or a phenylene or naphthylene group, $R^{21}$ is hydrogen, or a straight or branched $C_1$-$C_4$ alkyl group, $Y^2$ is a phenylene, —C(=O)—O—$R^{26}$— or ether group, $R^{26}$ is a single bond or a straight, branched or cyclic $C_1$-$C_{10}$ alkylene group which may contain ether, ester or —S—, $R^{24}$ is fluorine or a straight, branched or cyclic $C_1$-$C_{14}$ alkyl group containing at least one fluorine atom which may contain hydroxy, ether or ester, n is 1 or 2, p is an integer of 1 to 6, $0 \leq a1 \leq 1.0$, $0 \leq a2 \leq 1.0$, $0 \leq a3 \leq 1.0$, $0 \leq a4 \leq 1.0$, $0 < a1+a2+a3+a4 \leq 1.0$, $0 < b1 < 1.0$, $0 < b2 < 1.0$, and $0 < b1+b2 \leq 1.0$.

2. The pattern forming process of claim 1 wherein the first polymer comprising recurring units (a1) to (a4) further comprises recurring units (c) having a hydroxyl, carboxyl, lactone ring, lactam ring, sultone ring, sulfone, sulfonic acid ester, sulfonamide, carboxylic acid amide, nitro, cyano, thienyl, furyl, pyrrole, acid anhydride, imide, —NH—(C=O)—O—, —S—(C=O)—O—, or —ON(=$O_2$)—.

3. The pattern forming process of claim 1 wherein the shrink agent further comprises a salt compound having the general formula (4):

$$R^{27}—CO_2^-M^+ \qquad (4)$$

wherein $R^{27}$ is a straight, branched or cyclic $C_1$-$C_{20}$ alkyl group, $C_2$-$C_{20}$ alkenyl group or $C_6$-$C_{20}$ aryl group which may contain fluorine, ether, ester, lactone ring, lactam ring, carbonyl or hydroxyl, and M is sulfonium, iodonium or ammonium.

4. The pattern forming process of claim 1 wherein the solvent for the shrink agent is at least one solvent selected from the group consisting of:

ester solvents of 7 to 16 carbon atoms including pentyl acetate, isopentyl acetate, 2-methylbutyl acetate, hexyl acetate, 2-ethylhexyl acetate, cyclohexyl acetate, methylcyclohexyl acetate, hexyl formate, ethyl valerate, propyl valerate, isopropyl valerate, butyl valerate, isobutyl valerate, tert-butyl valerate, pentyl valerate, isopentyl valerate, ethyl isovalerate, propyl isovalerate, isopropyl isovalerate, butyl isovalerate, isobutyl isovalerate, tert-butyl isovalerate, isopentyl isovalerate, ethyl 2-methylvalerate, butyl 2-methylvalerate, ethyl pivalate, propyl pivalate, isopropyl pivalate, butyl pivalate, tert-butyl pivalate, ethyl pentenoate, propyl pentenoate, isopropyl pentenoate, butyl pentenoate, tert-butyl pentenoate, propyl crotonate, isopropyl crotonate, butyl crotonate, tert-butyl crotonate, butyl propionate, isobutyl propionate, tert-butyl propionate, benzyl propionate, ethyl hexanoate, allyl hexanoate, propyl butyrate, butyl butyrate, isobutyl butyrate, 3-methylbutyl butyrate, tert-butyl butyrate, ethyl 2-methylbutyrate, isopropyl 2-methylbutyrate, methyl benzoate, ethyl benzoate, propyl benzoate, butyl benzoate, phenyl acetate, benzyl acetate, methyl phenylacetate, benzyl formate, phenylethyl formate, methyl 3-phenylpropionate, ethyl phenylacetate, and 2-phenylethyl acetate, ketone solvents of 8 to 16 carbon atoms including 2-octanone, 3-octanone, 4-octanone, 2-nonanone, 3-nonanone, 4-nonanone, 5-nonanone, diisobutyl ketone, ethylcyclohexanone, ethylacetophenone, ethyl n-butyl ketone, di-n-butyl ketone, and diisobutyl ketone.

5. The pattern forming process of claim 1 wherein the polymer in the resist composition further comprises recurring units (a5) having the general formula (3):

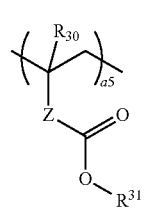

(3)

wherein $R^{30}$ is hydrogen or methyl, $R^{31}$ is an acid labile group, Z is a single bond or —C(=O)—O—$R^{32}$—, $R^{32}$ is a straight, branched or cyclic $C_1$-$C_{10}$ alkylene group which may contain ether or ester, or naphthylene group, and $0 < a5 < 1.0$.

6. The pattern forming process of claim 1 wherein the developer for forming a negative pattern comprises at least one solvent selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, isopentyl acetate, butenyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

7. The pattern forming process of claim 1 wherein the high-energy radiation is i-line of wavelength 364 nm, KrF excimer laser of wavelength 248 nm, ArF excimer laser of wavelength 193 nm, EUV of wavelength 13.5 nm, or EB.

8. A pattern forming process comprising the steps of:
applying a resist composition comprising a polymer comprising recurring units having an acid labile group-substituted carboxyl group, an acid generator and an organic solvent onto a substrate,
prebaking to form a resist film,
exposing the resist film to high-energy radiation,
baking the film,
developing the exposed resist film in an organic solvent-based developer to form a negative pattern,
applying a shrink agent onto the negative pattern, the shrink agent being a solution of a first polymer comprising recurring units of at least one type selected from units (a1) to (a4) in the general formula (1) and a second polymer comprising recurring units (b1) and (b2), recurring unit (b2) being a recurring unit as shown in the general formula (2), in an ester solvent of 7 to 16 carbon atoms and/or ketone solvent of 8 to 16 carbon atoms,
baking, and
removing the excessive shrink agent with the organic solvent-based developer for thereby shrinking the size of spaces in the pattern,

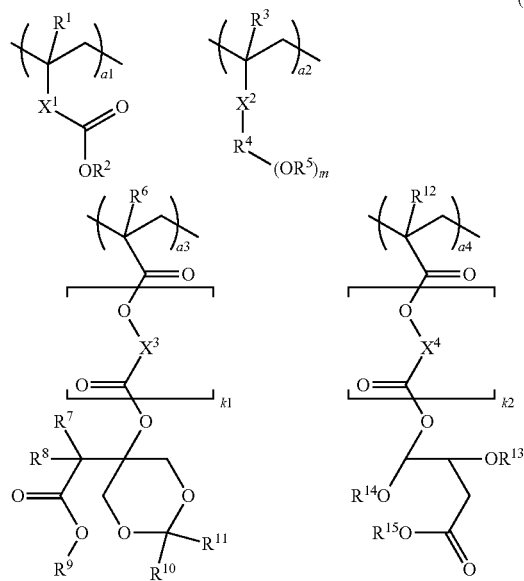

(1)

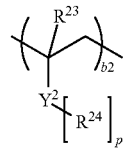

(2)

wherein $R^1$, $R^3$, $R^6$, $R^{12}$ and $R^{23}$ each are hydrogen or methyl, $R^2$, $R^5$ and $R^{14}$ each are an acid labile group, $X^1$ is a single bond, a phenylene or naphthylene group, or —C(═O)—O—$R^{16}$—, $R^{16}$ is a straight, branched or cyclic $C_1$-$C_{10}$ alkylene group which may contain ether, ester, lactone ring or hydroxyl, or a phenylene or naphthylene group, $X^2$ is a single bond, a phenylene or naphthylene group which may contain nitro, cyano or halogen, or —C(═O)—O—$R^{17}$—, —C(═O)—NH—$R^{17}$—, —O—$R^{17}$—, or —S—$R^{17}$—, $R^{17}$ is a straight, branched or cyclic $C_1$-$C_{10}$ alkylene group which may contain ether, ester, lactone ring or hydroxyl, or a phenylene or naphthylene group which may contain a straight, branched or cyclic $C_1$-$C_6$ alkyl, alkoxy, acyl, acyloxy, $C_2$-$C_6$ alkenyl, alkoxycarbonyl, $C_6$-$C_{10}$ aryl, nitro, cyano, or halogen, $R^4$ is a single bond, a di to penta-valent, straight, branched or cyclic $C_1$-$C_{16}$ aliphatic hydrocarbon group, or phenylene group, which may contain ether or ester, m is 1 to 4, $R^7$ and $R^8$ are each independently hydrogen, fluorine, or a straight, branched or cyclic $C_1$-$C_8$ monovalent hydrocarbon group, $R^9$, $R^{13}$ and $R^{15}$ each are hydrogen, or a straight, branched or cyclic $C_1$-$C_{20}$ monovalent hydrocarbon group in which any constituent —$CH_2$— moiety may be replaced by —O— or —C(═O)—, or whose hydrogen may be replaced by halogen, $R^{10}$ and $R^{11}$ are each independently hydrogen, or a straight, branched or cyclic $C_1$-$C_8$ monovalent hydrocarbon group, or $R^{10}$ and $R^{11}$ may bond together to form a $C_3$-$C_{17}$ non-aromatic ring with the carbon atom to which they are attached, $X^3$ and $X^4$ each are a straight, branched or cyclic $C_1$-$C_{20}$ divalent hydrocarbon group in which any constituent —$CH_2$— moiety may be replaced by —O— or —C(═O)—, $k^1$ and $k^2$ each are 0 or 1, $Y^2$ is a phenylene, —C(═O)—O—$R^{26}$— or ether group, $R^{26}$ is a single bond or a straight, branched or cyclic $C_1$-$C_{10}$ alkylene group which may contain ether, ester or —S—, $R^{24}$ is fluorine or a straight, branched or cyclic $C_1$-$C_{14}$ alkyl group containing at least one fluorine atom which may contain hydroxy, ether or ester, p is an integer of 1 to 6, 0≤a1≤1.0, 0≤a2≤1.0, 0≤a3≤1.0, 0≤a4≤1.0, 0<a1+a2+a3+a4≤1.0, 0b1<1.0, 0<b2<1.0, and 0<b1+b2≤1.0, wherein the recurring unit (b 1) is derived from a monomer selected from the group consisting of the following formulae:

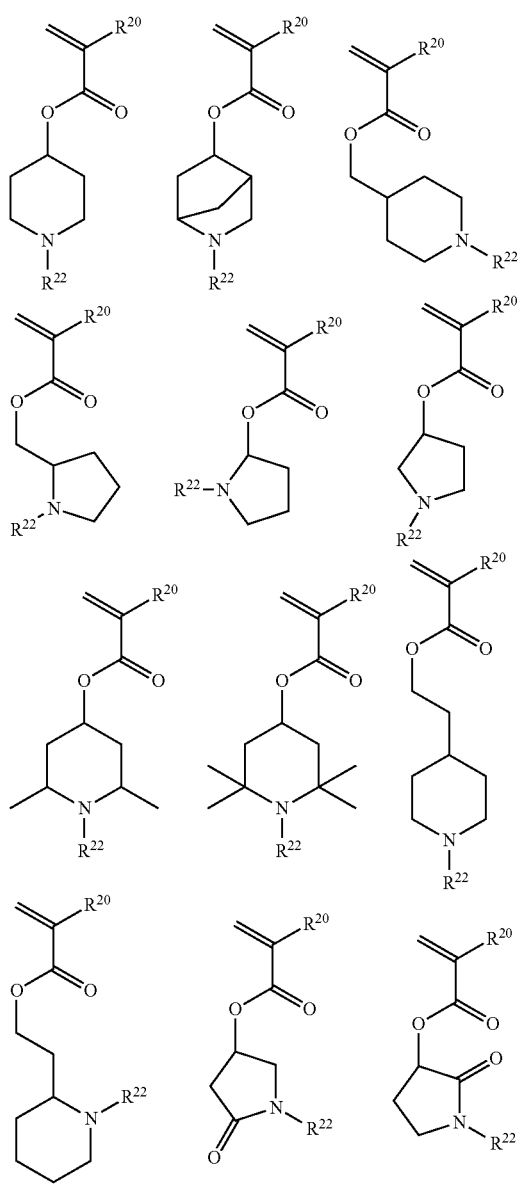
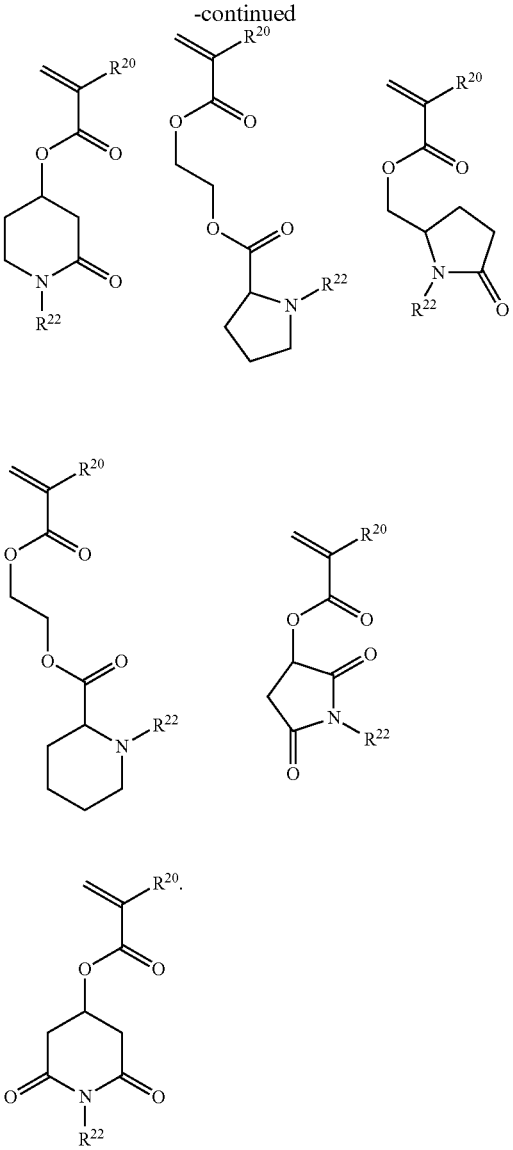
-continued
* * * * *